(12) United States Patent
Oh et al.

(10) Patent No.: US 12,514,168 B2
(45) Date of Patent: Jan. 6, 2026

(54) LIGHT SOURCE FOR PLANT CULTIVATION

(71) Applicants: INDUSTRY-UNIVERSITY COOPERATION FOUNDATION OF CHUNGBUK NATIONAL UNIVERSITY, Cheongju-si (KR); SEOUL VIOSYS CO., LTD., Ansan-si (KR)

(72) Inventors: Myung-Min Oh, Seoul (KR); Yoon-Seon Choi, Incheon (KR)

(73) Assignees: INDUSTRY-UNIVERSITY COOPERATION FOUNDATION OF CHUNGBUK NATIONAL UNIVERSITY, Cheongju-si (KR); SEOUL VIOSYS, CO., LTD., Ansan-si (KR)

( * ) Notice: Subject to any disclaimer, the term of this patent is extended or adjusted under 35 U.S.C. 154(b) by 0 days.

(21) Appl. No.: 18/411,166

(22) Filed: Jan. 12, 2024

(65) Prior Publication Data

US 2024/0147915 A1 May 9, 2024

Related U.S. Application Data

(63) Continuation of application No. 17/137,898, filed on Dec. 30, 2020, now Pat. No. 11,910,762.
(Continued)

(51) Int. Cl.
*A01G 7/04* (2006.01)
*A01G 22/15* (2018.01)
*H01L 25/075* (2006.01)

(52) U.S. Cl.
CPC ............ *A01G 7/045* (2013.01); *A01G 22/15* (2018.02); *H01L 25/0753* (2013.01)

(58) Field of Classification Search
CPC .... A01G 7/045; A01G 22/15; A23V 2002/00; A23V 2250/2104; H01L 25/0753; F21V 33/0064; F21Y 2115/10; H10H 20/825
See application file for complete search history.

(56) References Cited

U.S. PATENT DOCUMENTS

| 5,300,788 A | 4/1994 | Fan |
| 11,547,062 B2 | 1/2023 | Oh et al. |

(Continued)

FOREIGN PATENT DOCUMENTS

| CN | ON 102182965 A | 9/2011 |
| CN | 103476243 A | 12/2013 |

(Continued)

OTHER PUBLICATIONS

Combined Chinese Office Action and Search Report issued Jul. 18, 2024 in Chinese Patent Application No. 202180008184.4 (with English translation of Category of Cited Documents), 18 pages.
(Continued)

*Primary Examiner* — Kevin Quarterman
(74) *Attorney, Agent, or Firm* — Oblon, McClelland, Maier & Neustadt, L.L.P.

(57) ABSTRACT

A light source for plant cultivation includes at least two light emitting devices supplying light to a plant. Each of the light emitting devices includes a first semiconductor layer doped with a first conductivity type dopant, a second semiconductor layer disposed on the first semiconductor layer and doped with a second conductivity type dopant different from the first conductivity type dopant, and an active layer interposed between the first semiconductor layer and the second semiconductor layer. The light emitting devices emit light towards the plant under a different condition in terms of at
(Continued)

least one of wavelength, radiation intensity, and emission timing to control the type and content of phytochemicals in the plant.

20 Claims, 62 Drawing Sheets

Related U.S. Application Data

(60) Provisional application No. 62/956,959, filed on Jan. 3, 2020.

(56) References Cited

U.S. PATENT DOCUMENTS

| | | | | |
|---|---|---|---|---|
| 2012/0018764 | A1* | 1/2012 | Choi | H10H 20/8512 257/E33.066 |
| 2012/0320581 | A1* | 12/2012 | Rogers | H01L 24/82 257/E33.059 |
| 2013/0023080 | A1* | 1/2013 | Kim | C23C 16/303 257/E21.101 |
| 2013/0102076 | A1 | 4/2013 | Licamele et al. | |
| 2013/0294065 | A1 | 11/2013 | Wells | |
| 2015/0171270 | A1 | 6/2015 | Lin | |
| 2015/0292682 | A1 | 10/2015 | Yang et al. | |
| 2016/0345512 | A1 | 12/2016 | Wargent | |
| 2016/0369994 | A1 | 12/2016 | Liu | |
| 2018/0054974 | A1 | 3/2018 | Vasilenko | |
| 2018/0092308 | A1 | 4/2018 | Barber | |
| 2019/0098842 | A1 | 4/2019 | Barber, III et al. | |
| 2020/0053845 | A1 | 2/2020 | Zhang | |
| 2020/0178474 | A1 | 6/2020 | Oh et al. | |
| 2021/0043797 | A1* | 2/2021 | Ahn | H01L 25/0753 |
| 2021/0112726 | A1 | 4/2021 | Okazawa et al. | |
| 2021/0375194 | A1* | 12/2021 | Kwag | G09G 3/32 |

FOREIGN PATENT DOCUMENTS

| | | |
|---|---|---|
| CN | 106413378 A | 2/2017 |
| CN | 107356569 A | 11/2017 |
| CN | 107535212 A | 1/2018 |
| EP | 3485722 A2 | 5/2019 |
| JP | 8-205677 A | 8/1996 |
| JP | 2010-4869 A | 1/2010 |
| JP | 2012205520 A | 10/2012 |
| JP | 2014-155492 A | 8/2014 |
| JP | 2015-128448 A | 7/2015 |
| JP | 2015-521046 A | 7/2015 |
| JP | 2018186802 A | 11/2018 |
| KR | 10-1027205 A | 4/2011 |
| KR | 10-2013-0114880 A | 10/2013 |
| KR | 1020140045111 A | 4/2014 |
| KR | 1020150117911 A | 10/2015 |
| KR | 10-2017-0141974 A | 12/2017 |
| KR | 1020180006325 A | 1/2018 |
| KR | 1020180009115 A | 1/2018 |
| WO | WO 2012133130 A1 | 10/2012 |
| WO | WO 2019203597 A1 | 10/2019 |

OTHER PUBLICATIONS

Japanese Office Action issued Dec. 2, 2024 in Japanese Patent Application No. 2022-539659, 6 pages.
Yan, "Plant Development Biology", Wuhan University Press, Feb. 2015, 6 pages (with partial English Translation).
Extended European Search Report issued Jan. 4, 2024 in European Patent Application No. 21736184.9, 11 pages.
International Search Report issued in corresponding International Application No. PCT/KR2021/000027, mailed Apr. 26, 2021, English Translation, 3 pages.
Zhang, et al., Structural Characterization and Detection of Kale Flavonoids by Electrospray Ionization Mass Spectrometry, Analytical Chemistry, Dec. 1, 2003, pp. 6401-6407, vol. 75(23), American Chemical Society, Published on Web Oct. 16, 2003.
Chen et al., UVA Radiation Is Beneficial for Yield and Quality of Indoor Cultivated Lettuce, Dec. 6, 2019, pp. 1-10, vol. 10, Art. 1563, Frontiers in Plant Science.
Kang et al., Ultraviolet-A Radiation Stimulates Growth of Indoor Cultivated Tomato (*Solanum lycopersicum*) Seedlings, HortScience, Oct. 2018, pp. 1429-1433, vol. 53(10).
Lee et al., Short-term UV-A LED Irradiation Improves Growth and Phytochemicals of Kale Plants, Korean Journal of Horticultural Science & Technology, May 2016, p. 96, vol. 34, No. 1, Document No. 102.
Maxwell et al., Chlorophyll Fluorescence—A Practical Guide, Journal of Experimental Botany, Apr. 2000, pp. 559-668, vol. 51, No. 345, Oxford University Press.
Ritchie, Chlorophyll Fluorescence: What Is It and What Do the Numbers Mean? USDA Forest Service Proceedings RMRS P-43, 2006, pp. 34-43.
Office Action issued in U.S. Appl. No. 17/073,763, mailed May 11, 2021.
Supplementary European Search Report issued in corresponding EP Application 19788361.4, issued Jan. 5, 2022, 8 pages.
Office Action issued for CN Application 201980002969.3, issued Jan. 12, 2022, 8 pages.
Kim. Thesis, Determination of Optimal UV Stress Period before Harvest for Maximizing Phytochemical Production of Kale Cultivated in Plant Factories, Seoul National University, 2017, 1-31. (Year: 2017).
Lee et al. Growth and Phenolic Content of Sowthistle Grown in a Closed-type Plant Production System with a UV-A or UV-B Lamp Hort. Environ. Biotechnol. 54(6): 492-500, 2013. (Year: 2013).
Lichtenthaler et al. Detection of photosynthetic activity and water stress by imaging the red chlorophyll fluorescence. Plant Physiol. Biochem. 38 (2000) 889-895. (Year: 2000).
International Search Report for International Application PCT/KR2019/004711, mailed Aug. 2, 2019.
Final office action for U.S. Appl. No. 17/073,763, Jun. 10, 2022, 13 pages.
Notice of allowance for U.S. Appl. No. 17/073,763, Sep. 8, 2022, 7 pages.
Xiao et al., Plant Physiology, China Agricultural Industry Press, No. 263-264, Jan. 31, 2004, pp. 269-270 with English translation.
Office Action issued for CN Application 202180008184.4, issued Aug. 31, 2023, 8 pages.
Search Report for European Application No. 21736184.9, dated Jan. 4, 2024, 11 pages.

\* cited by examiner

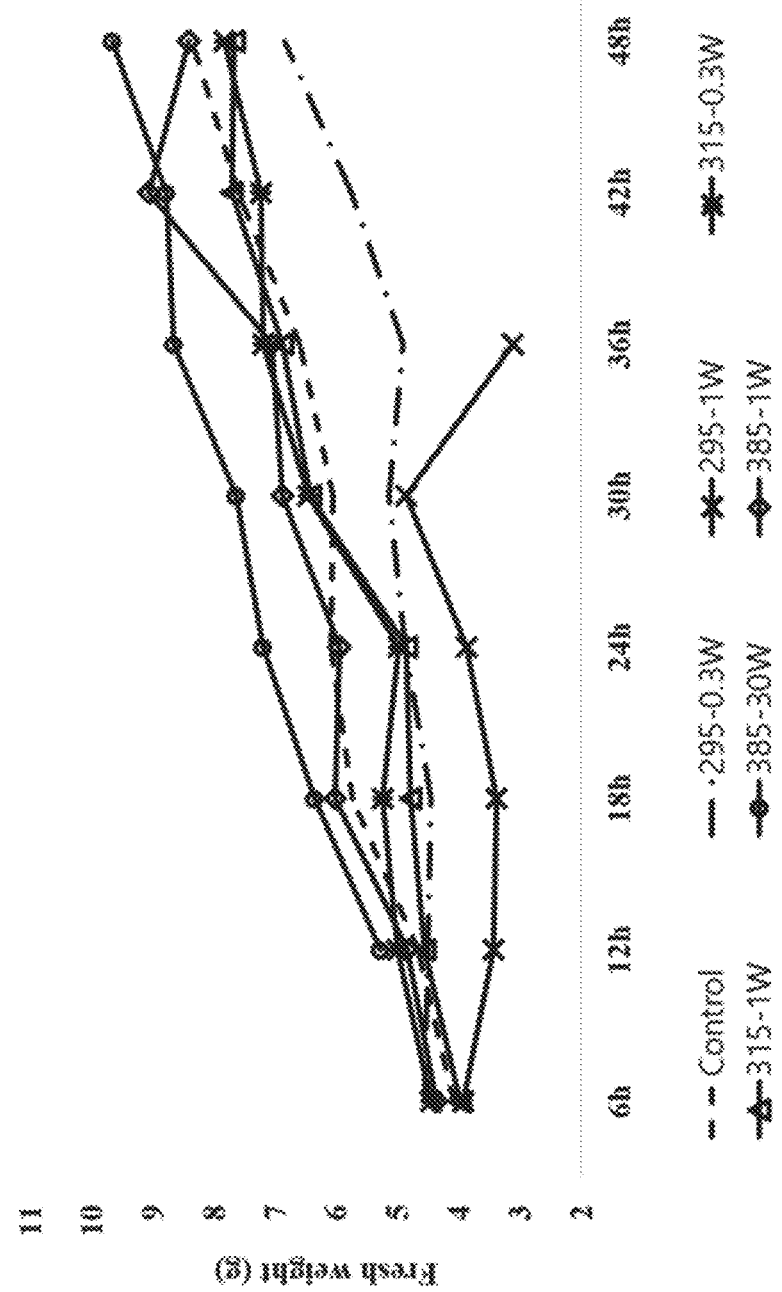

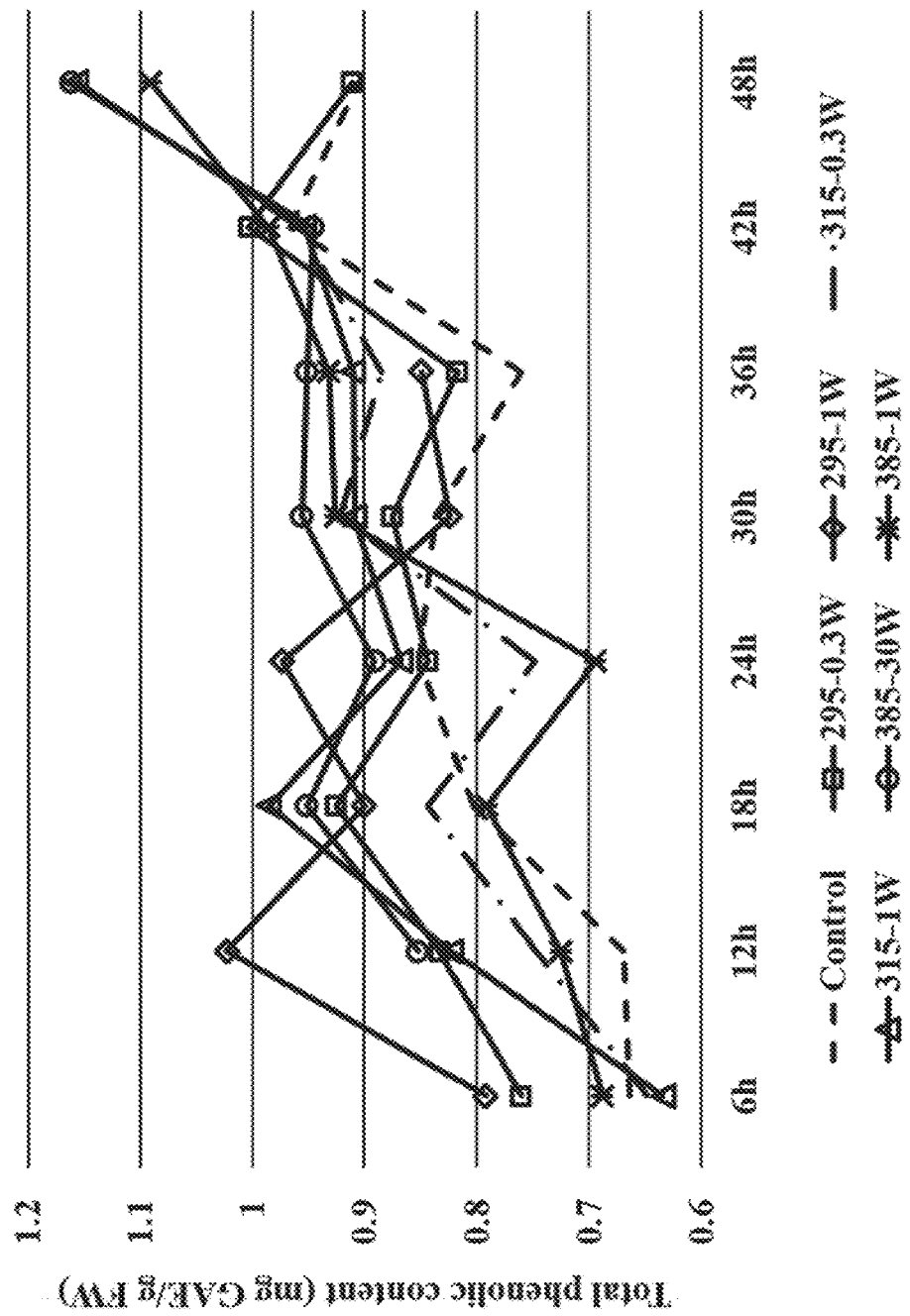

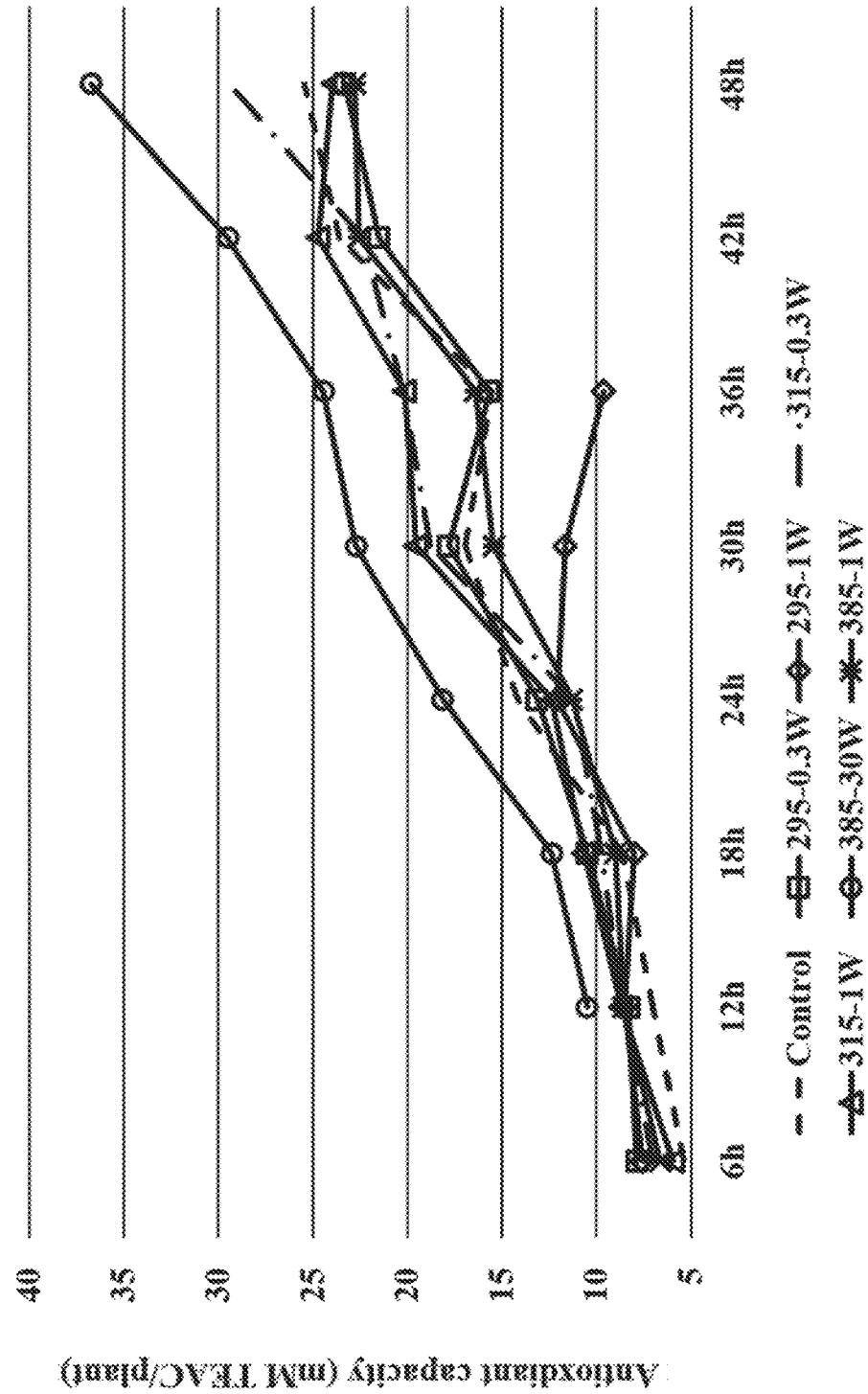

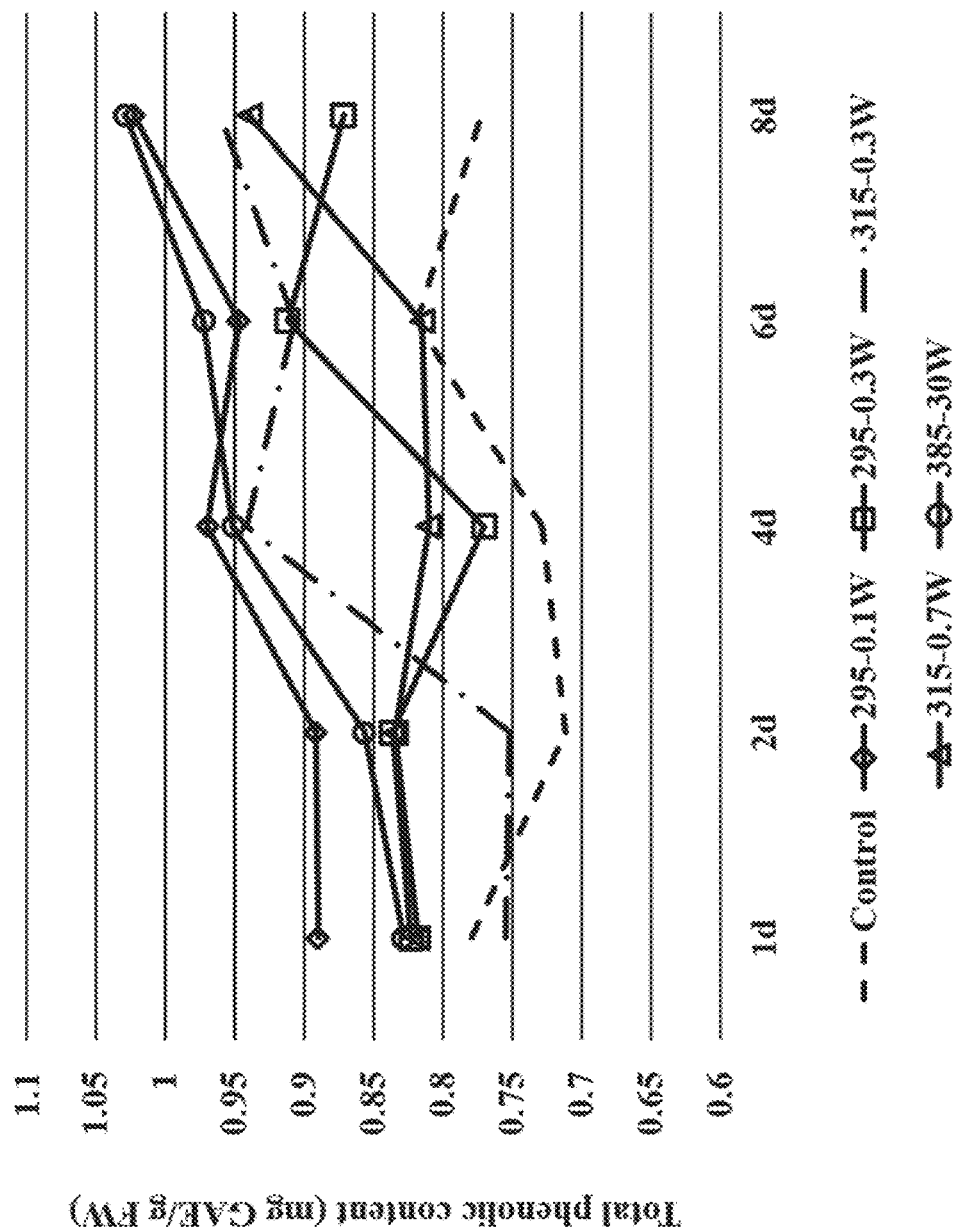

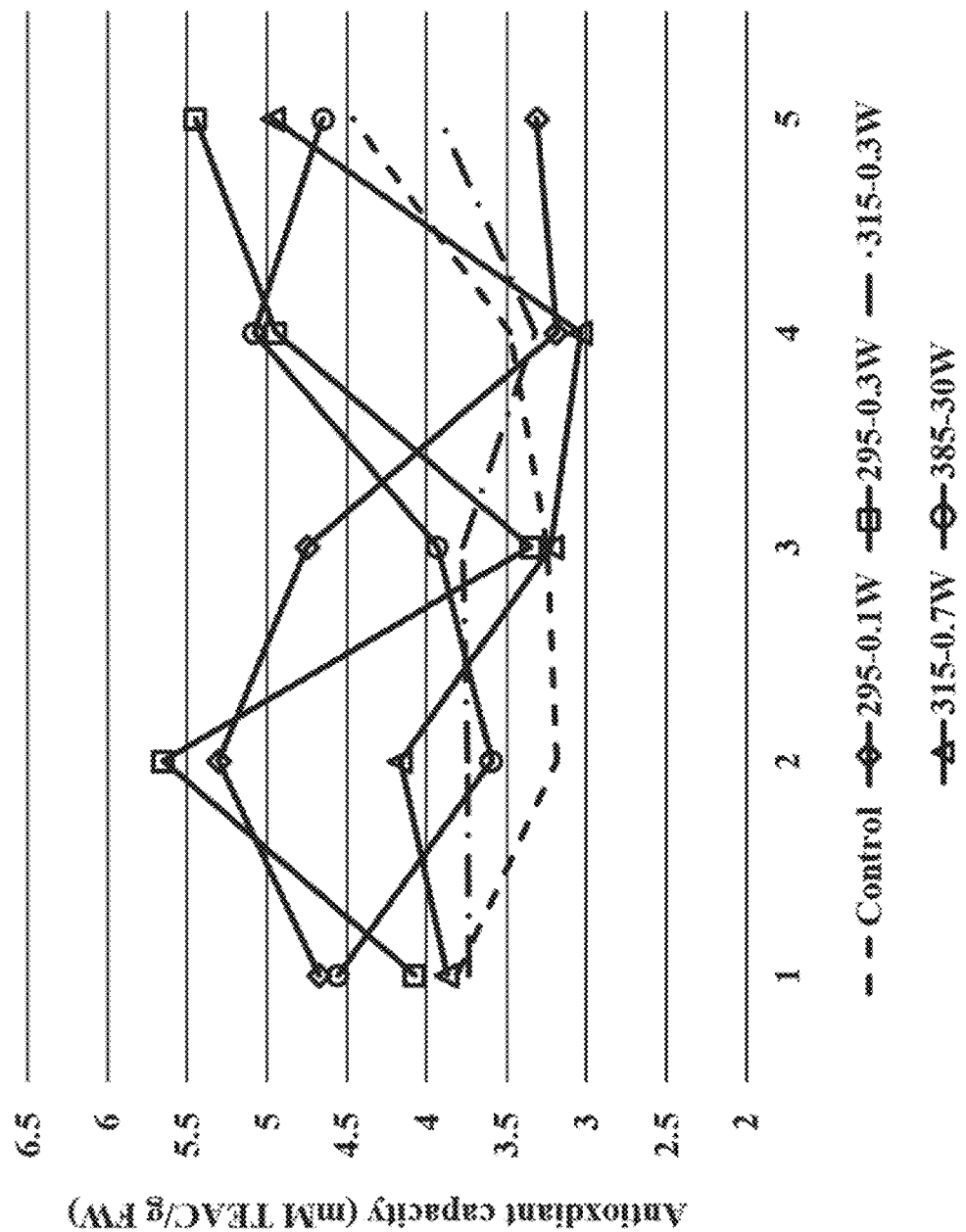

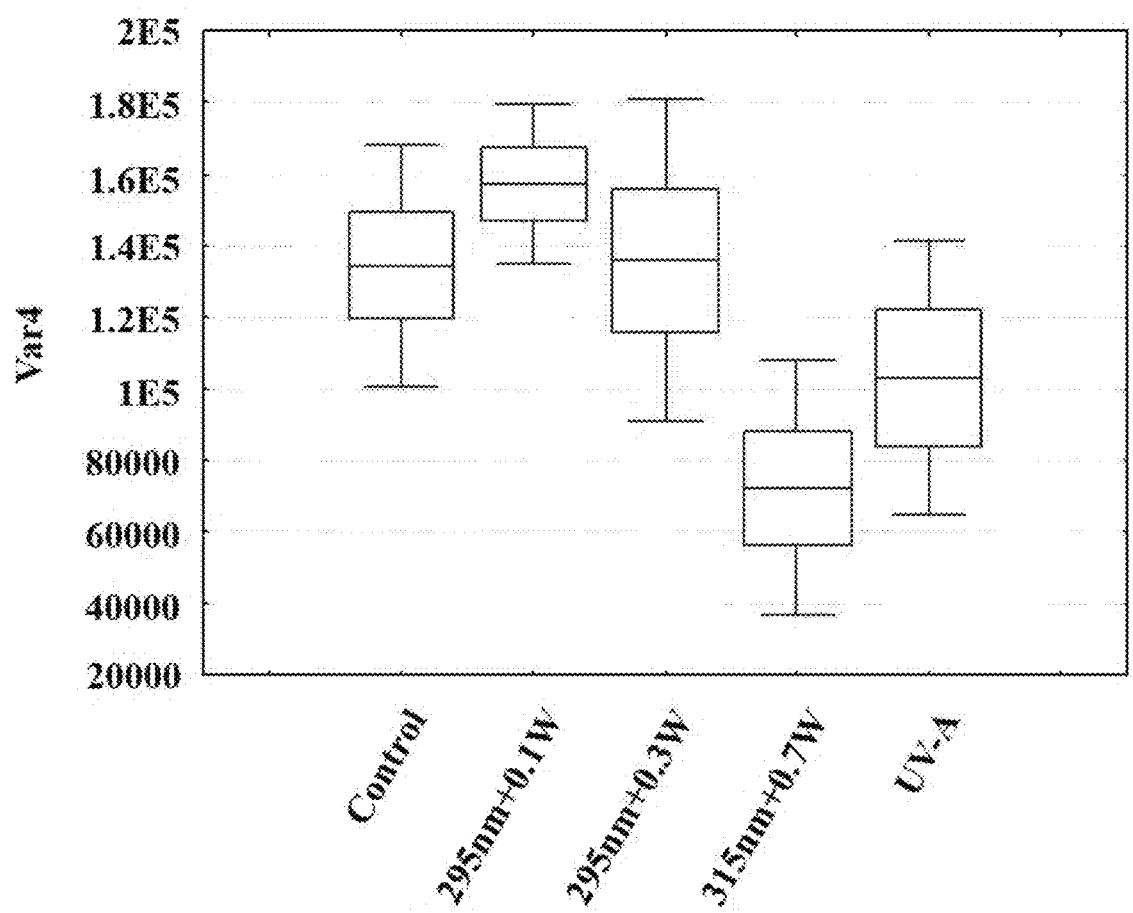

kaempferol-3-O-sophorotrioside-7-O-sophoroside-ferulic/sinapic acid

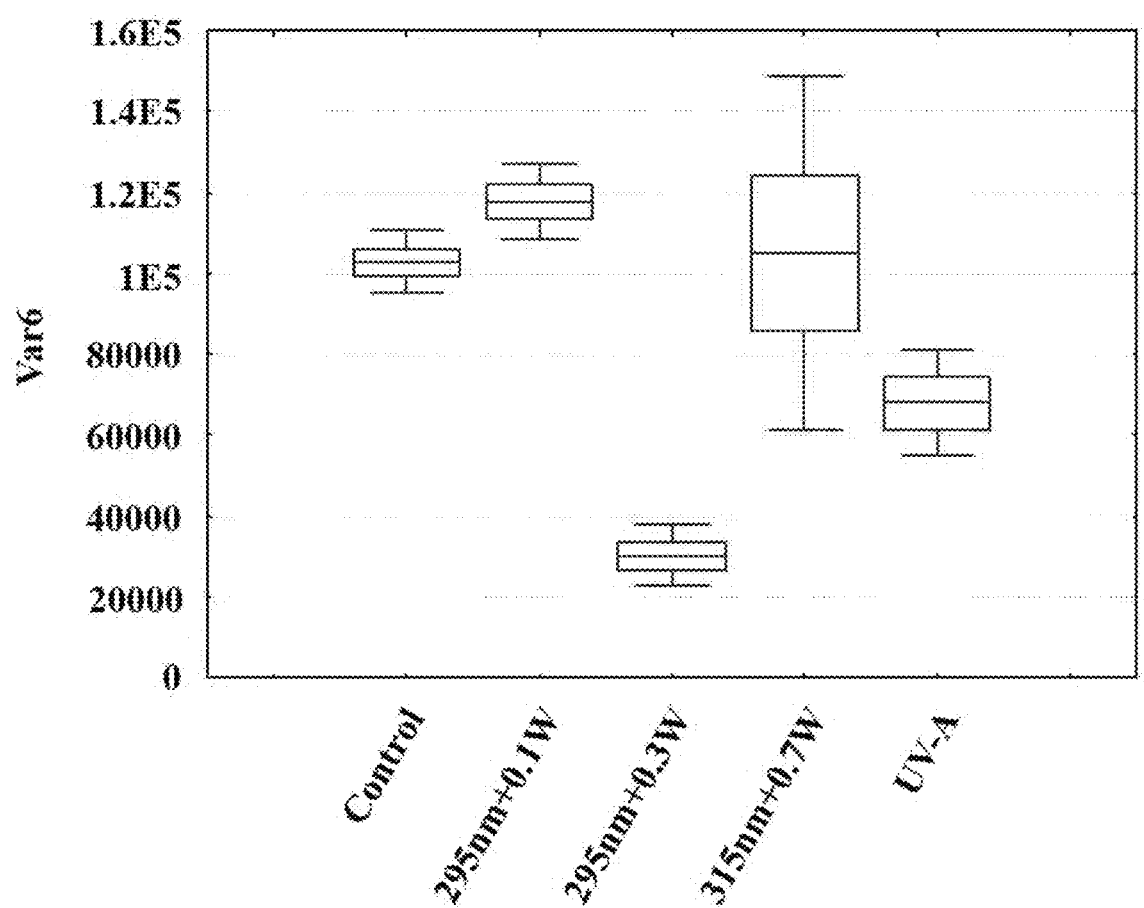

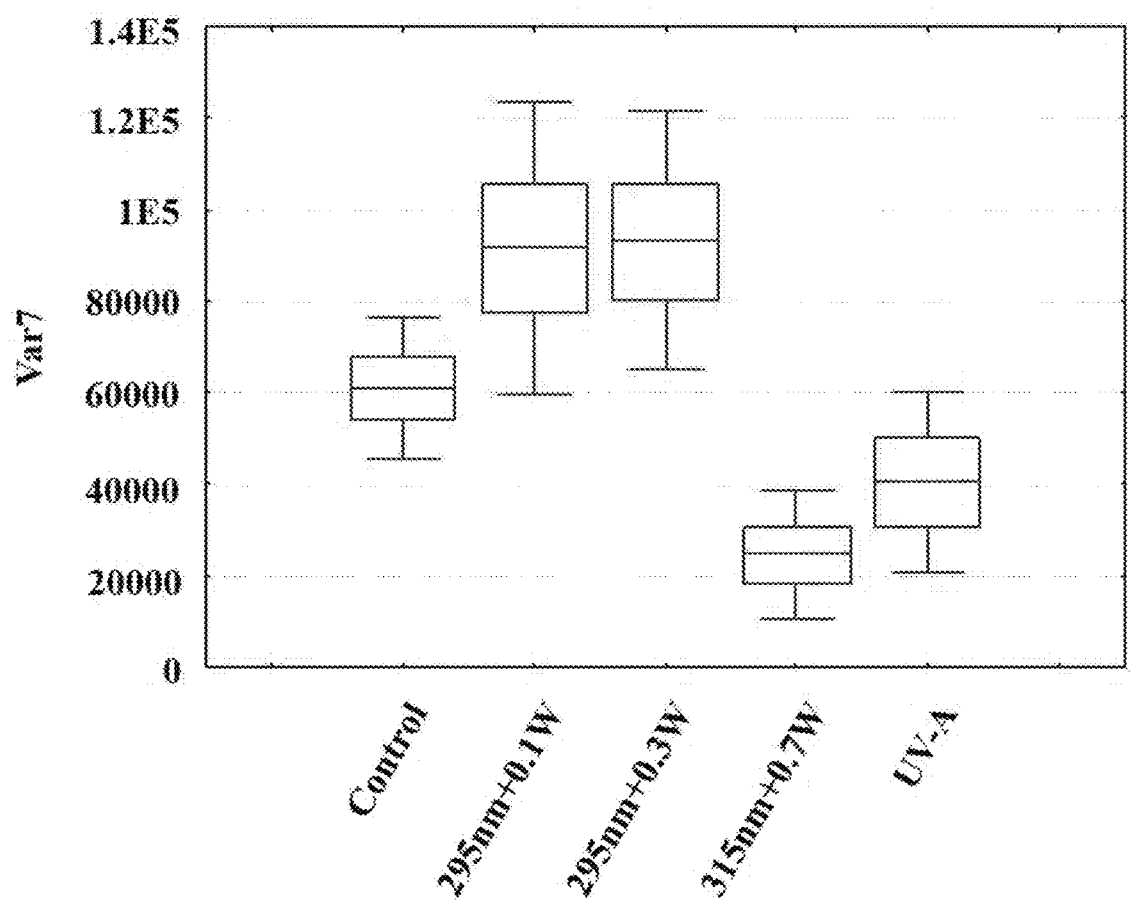

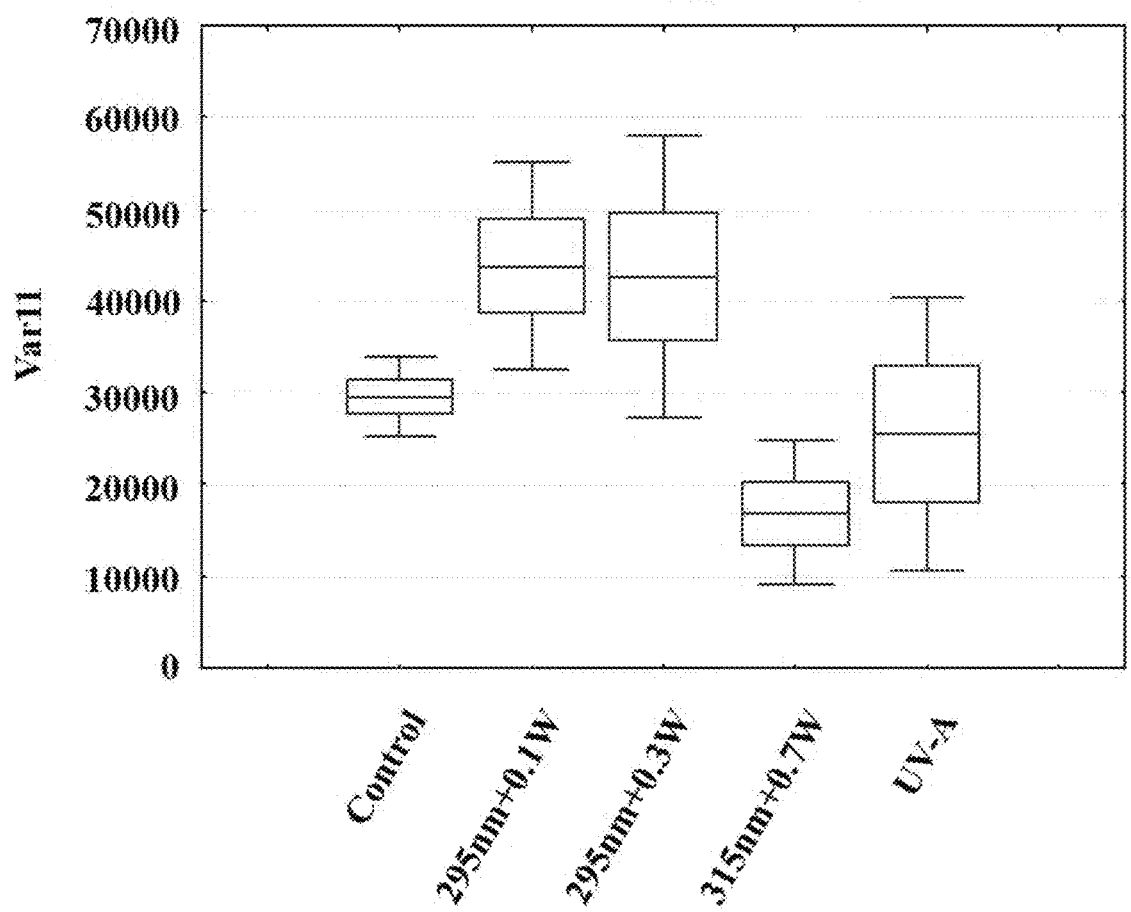

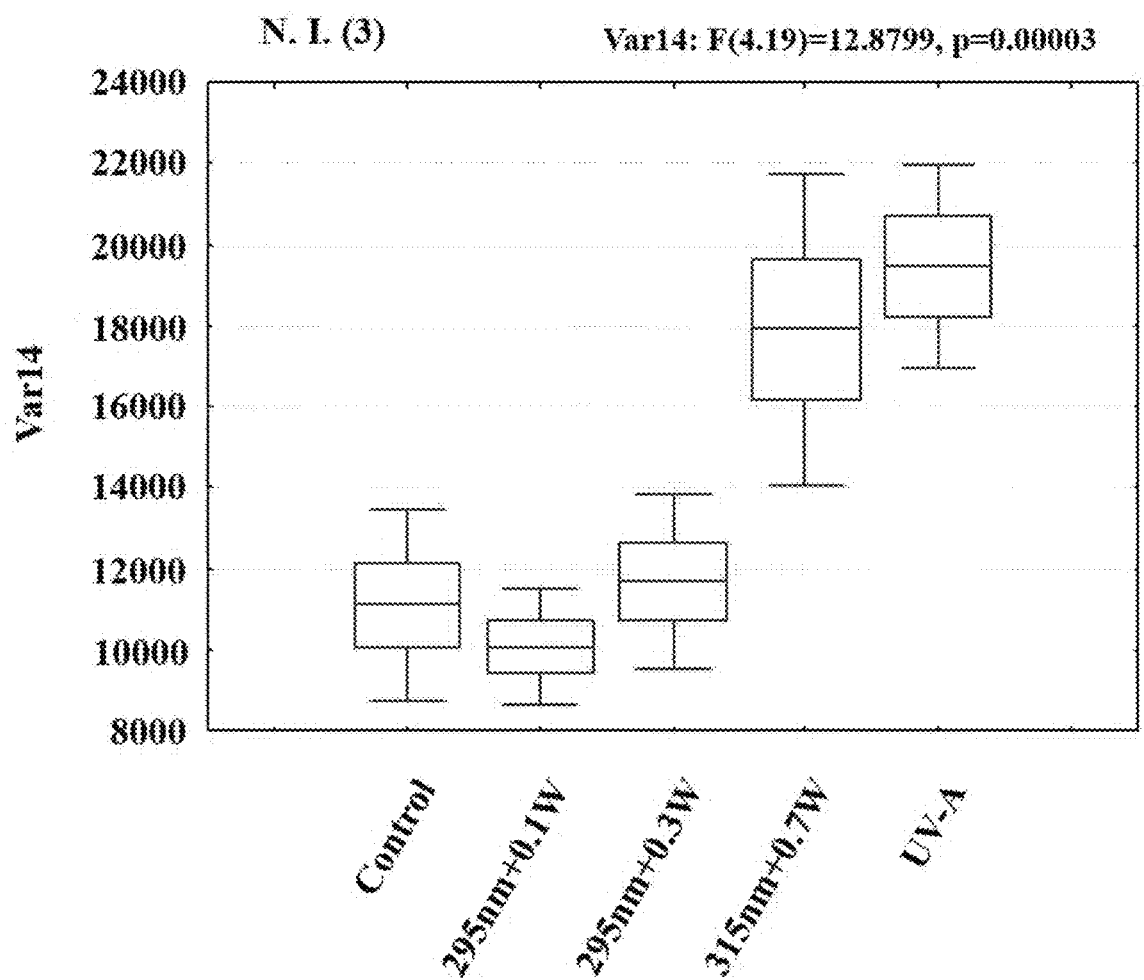

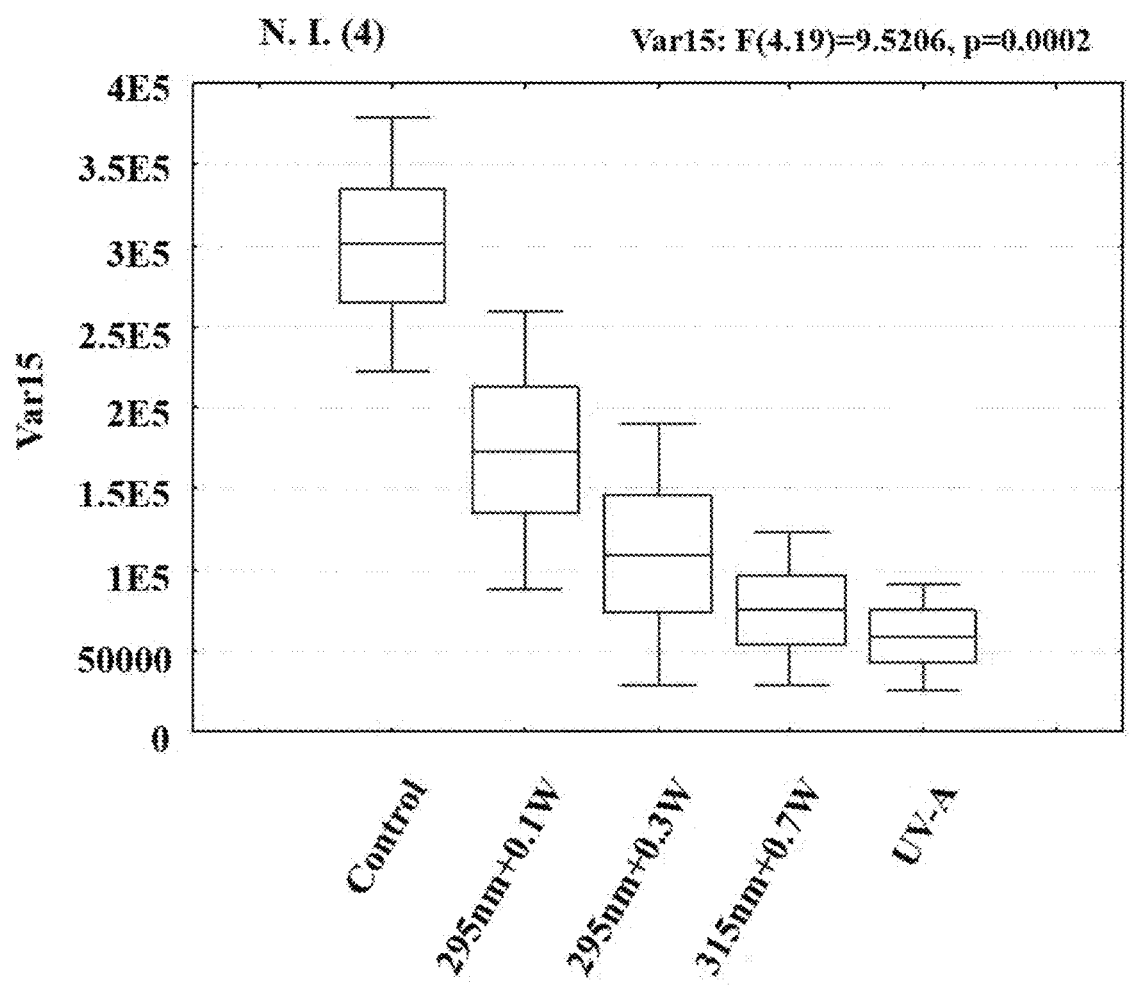

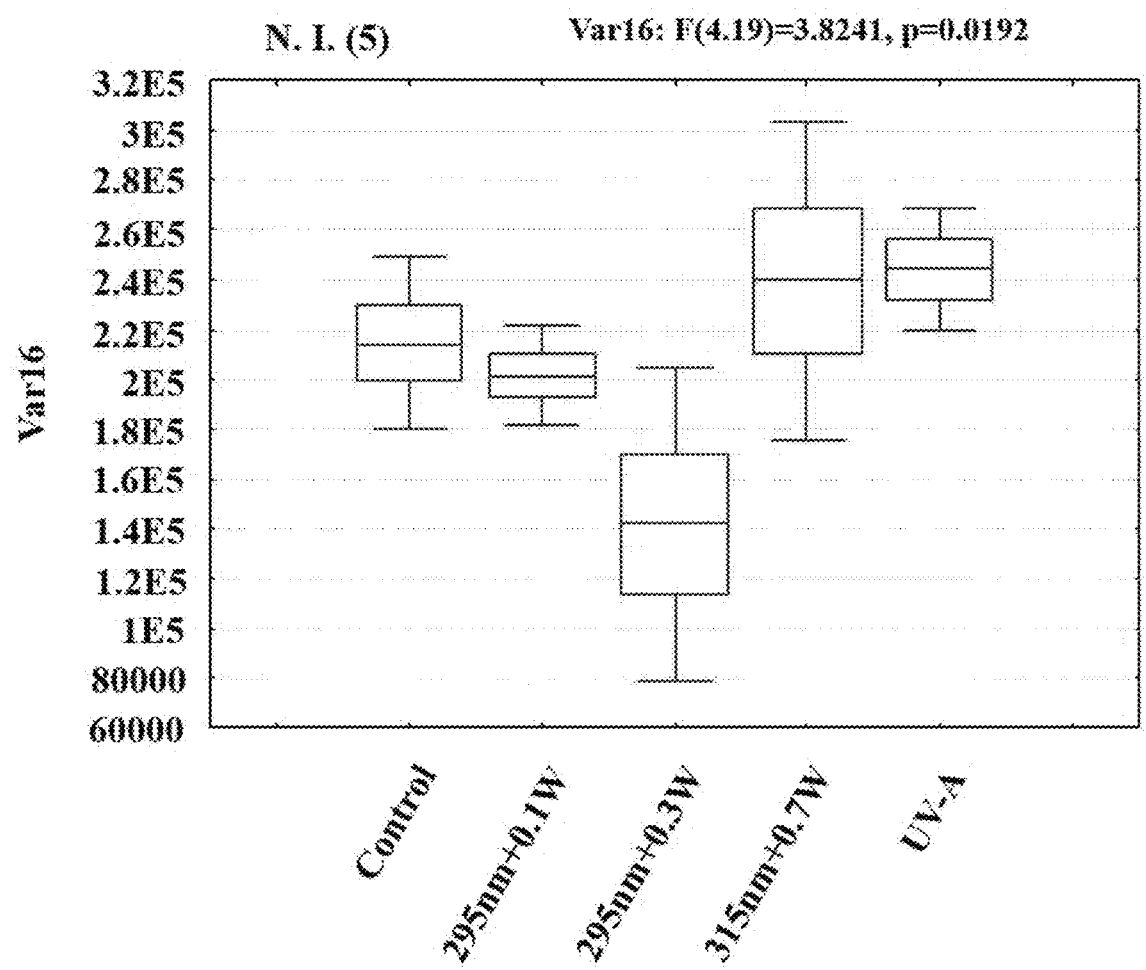

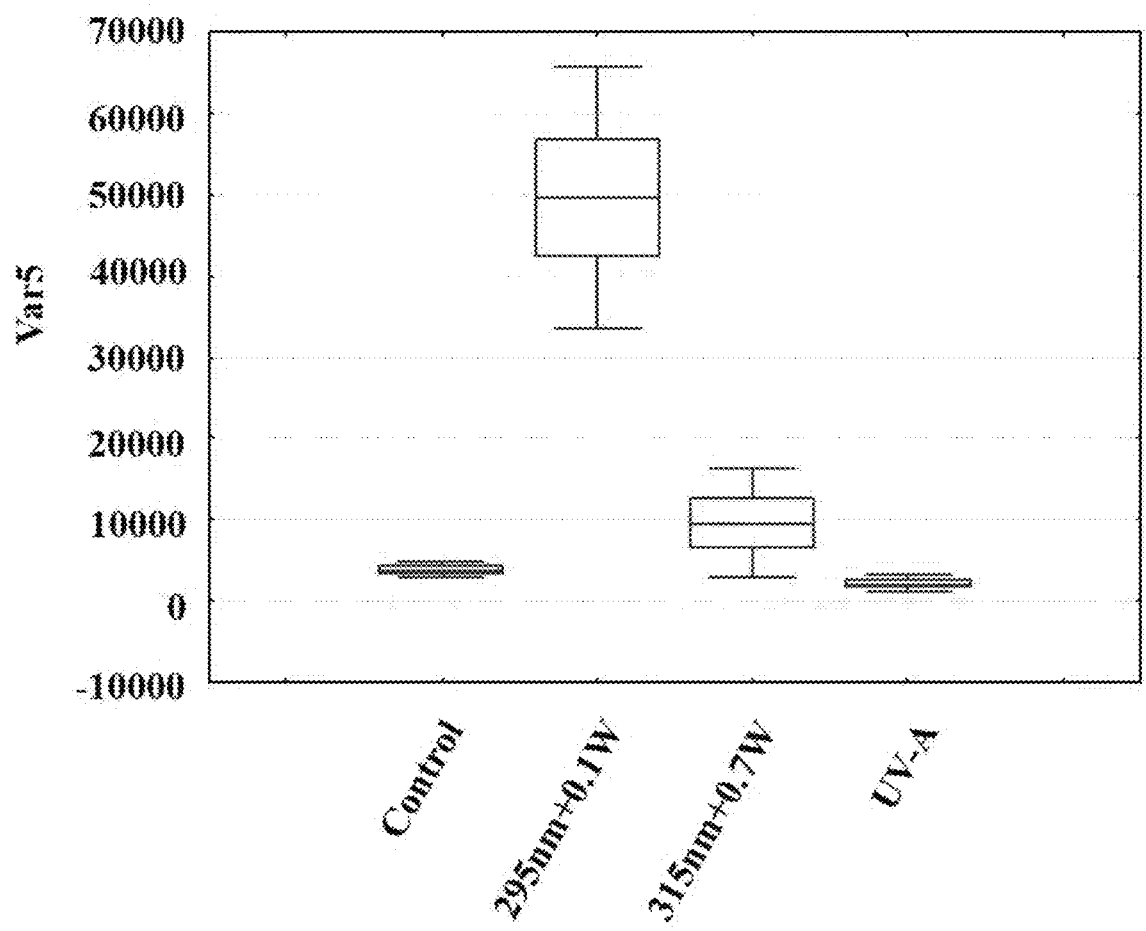

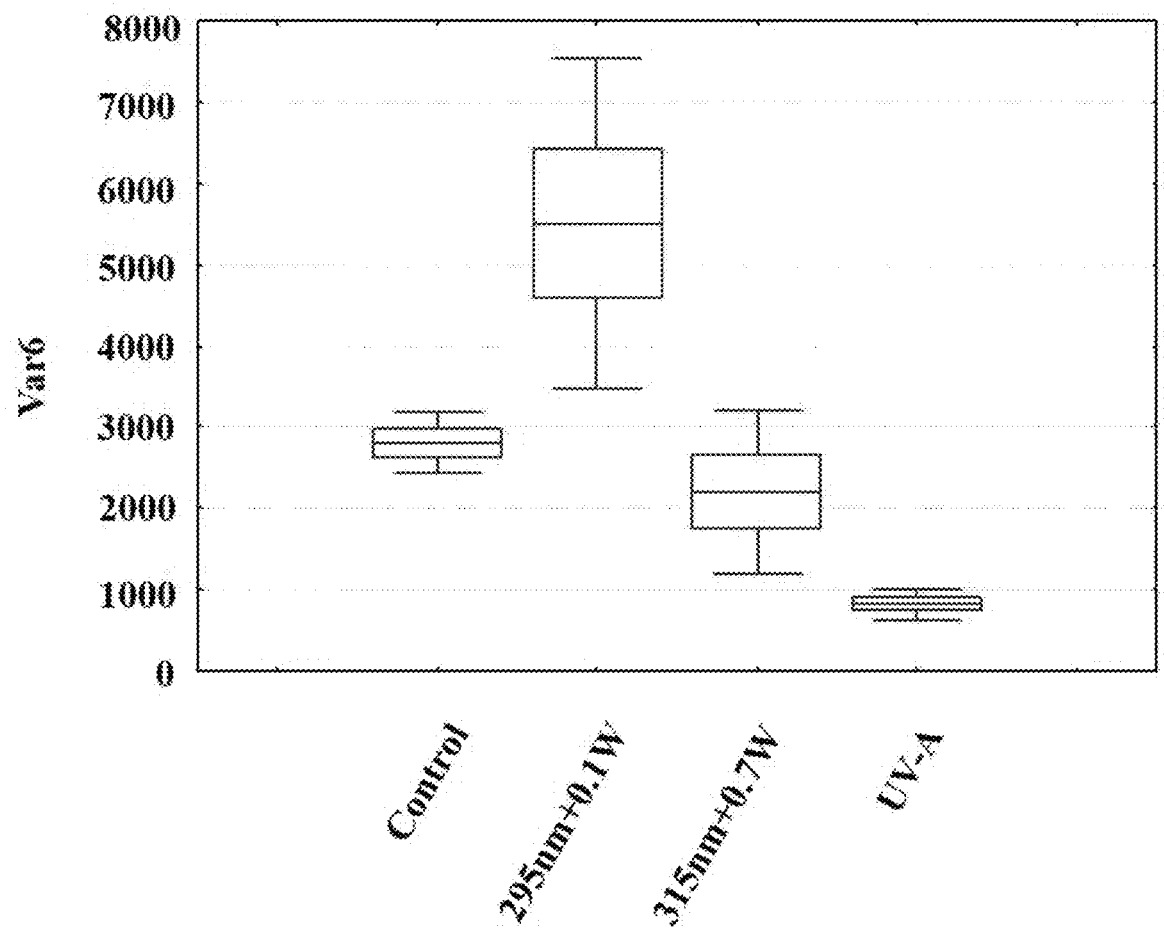

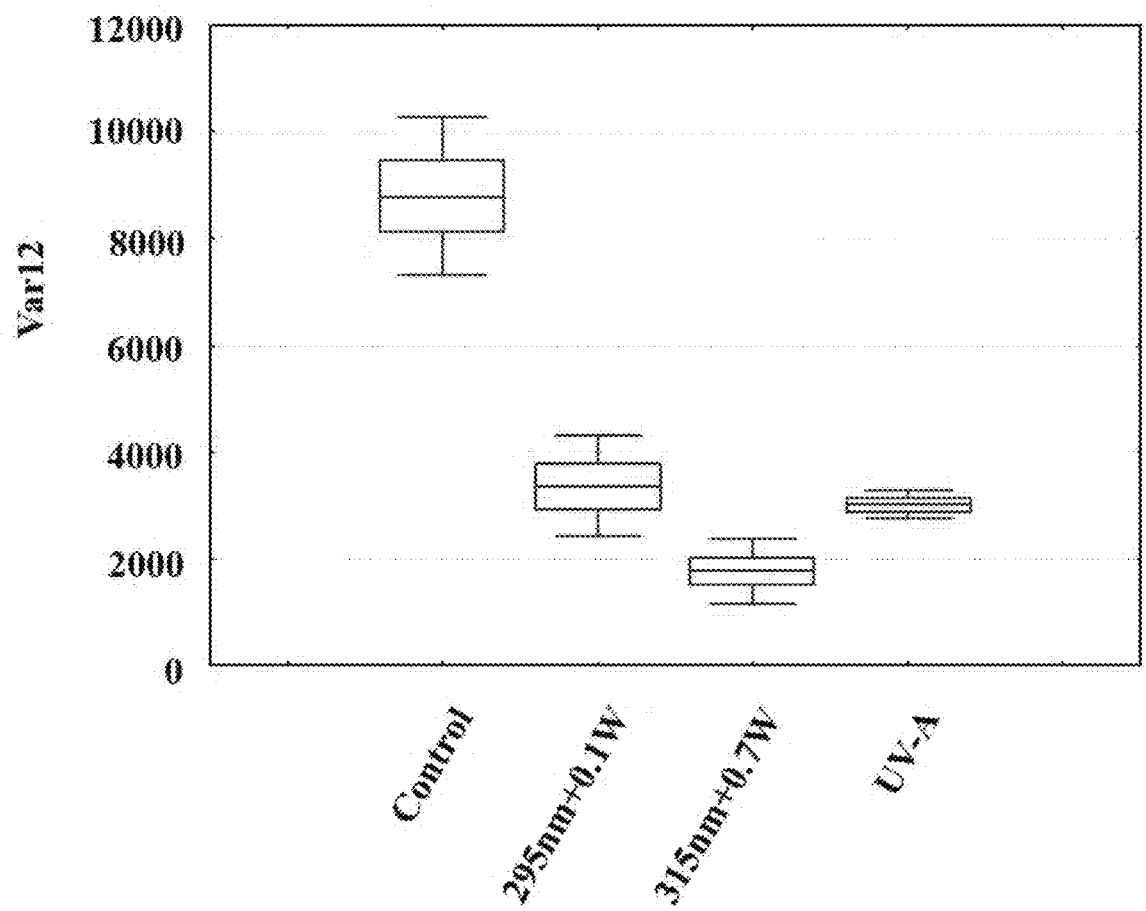

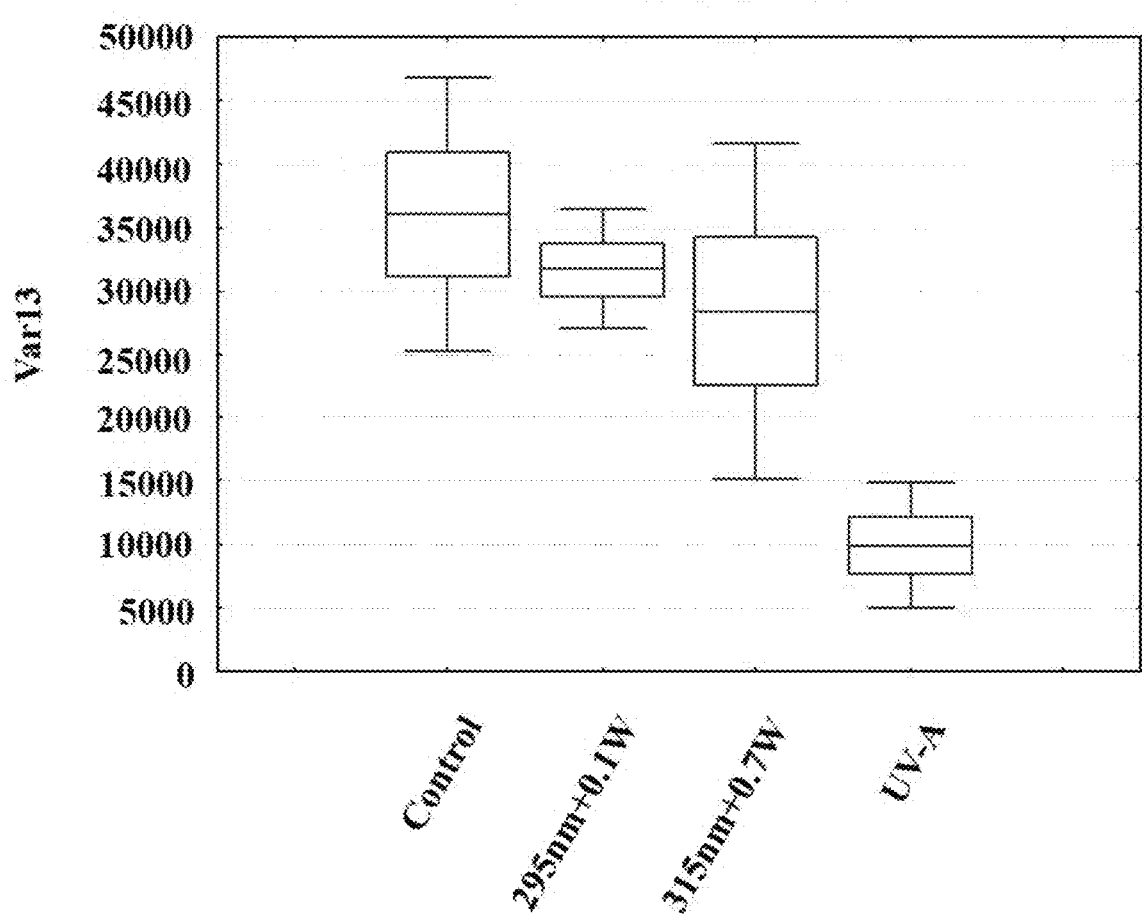

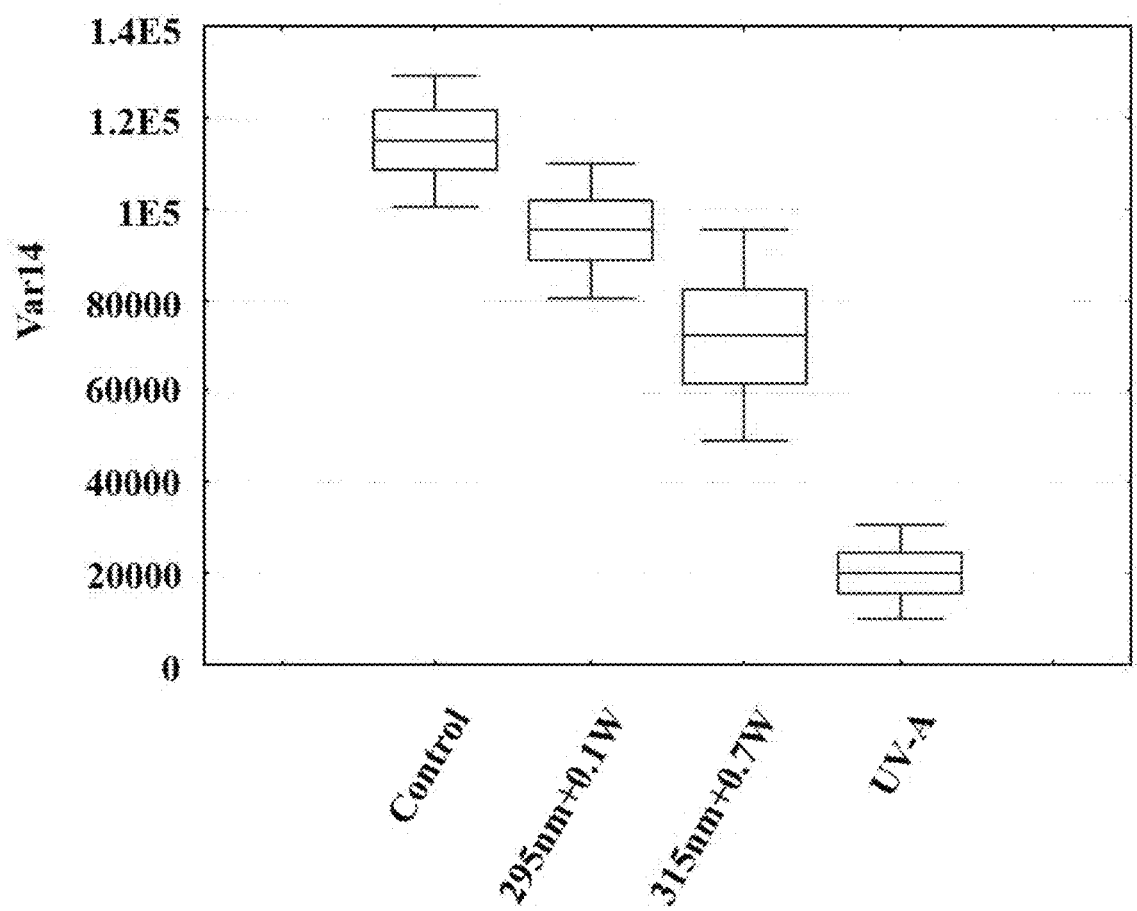

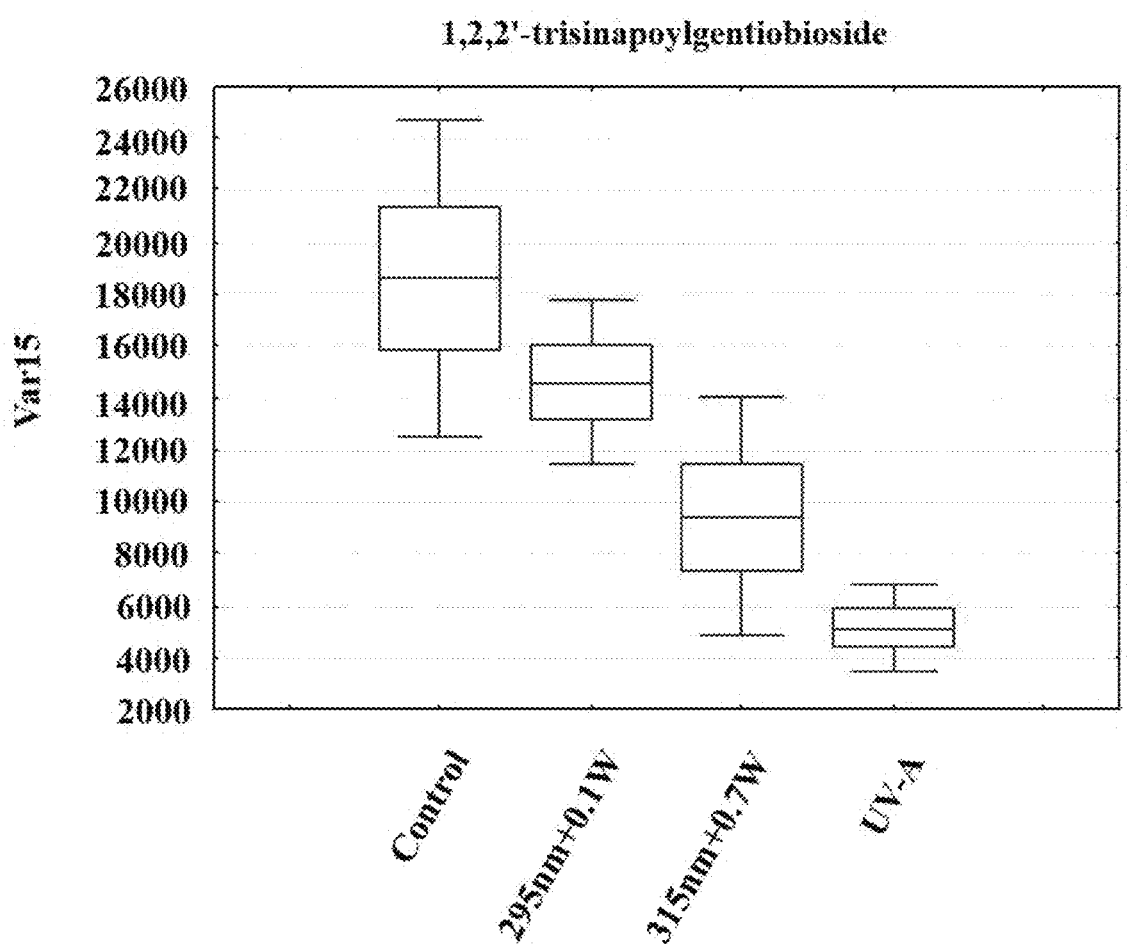

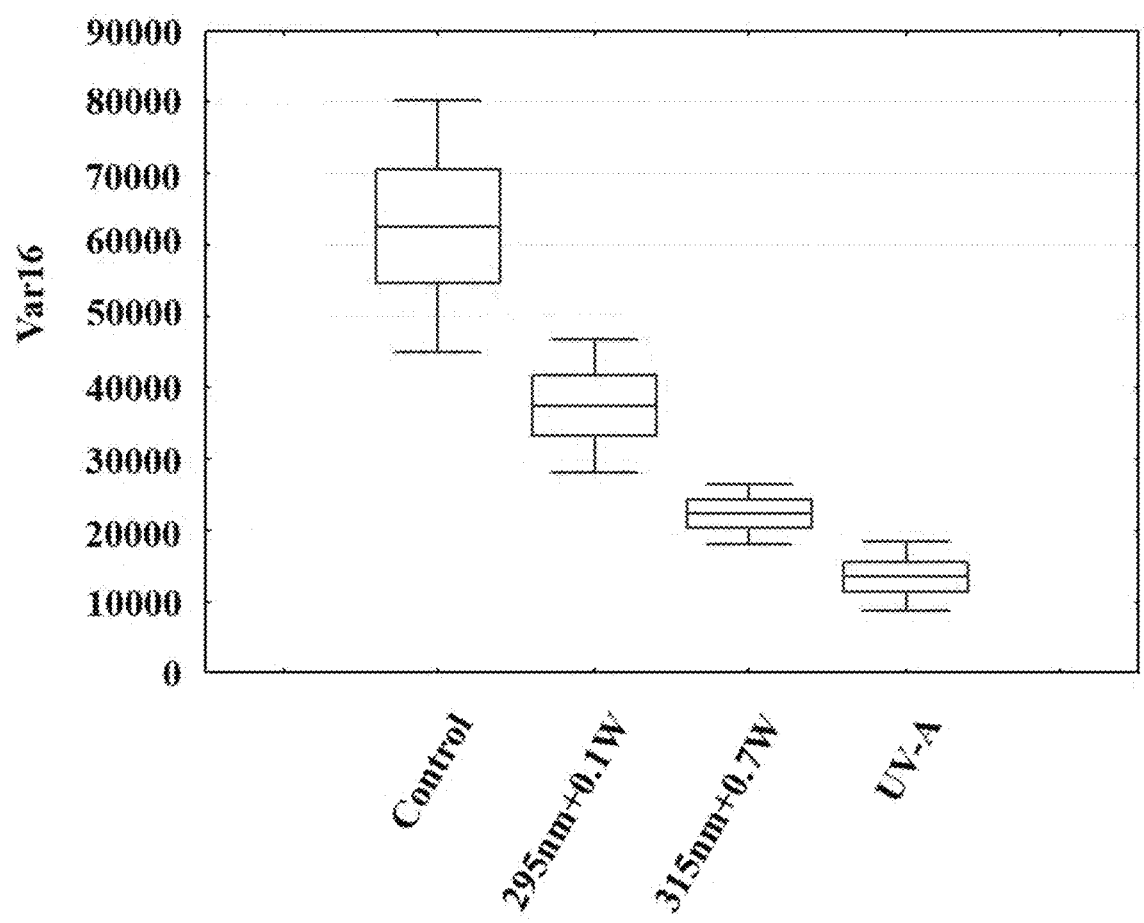

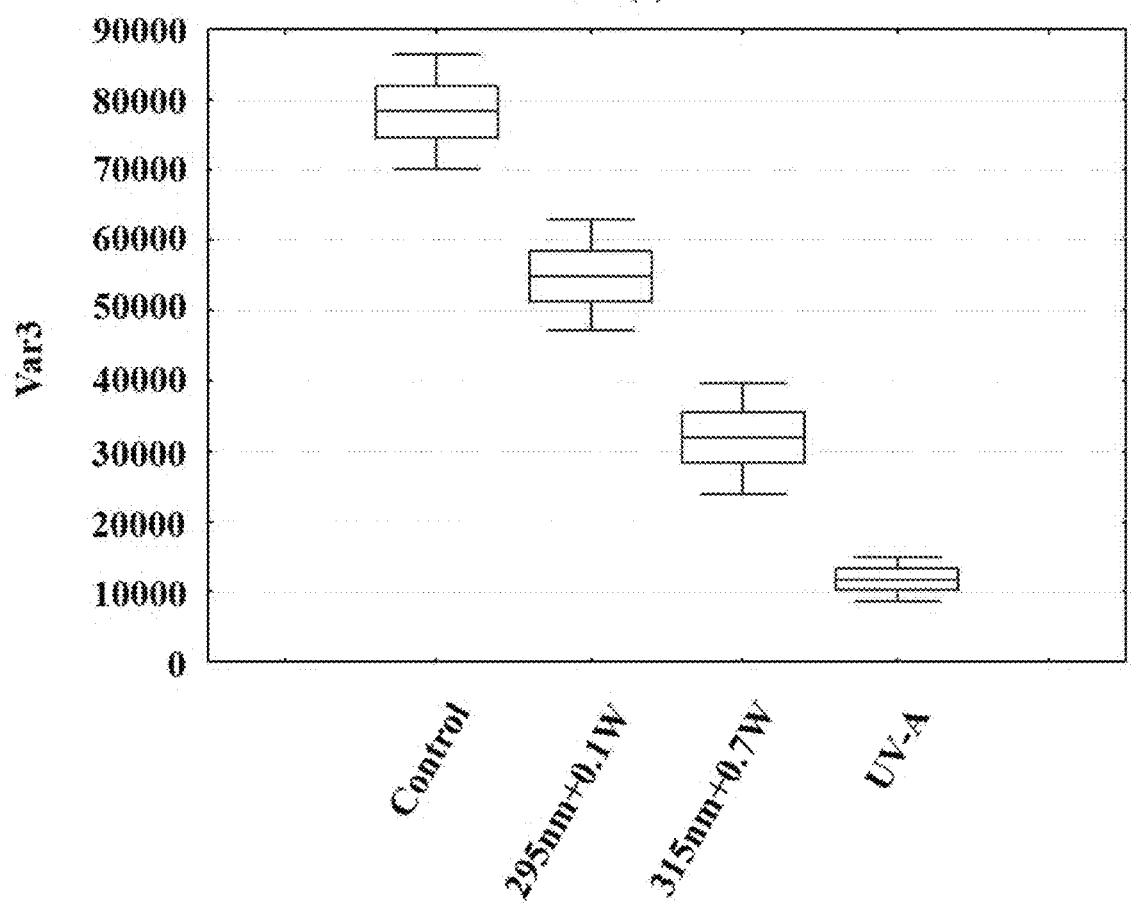

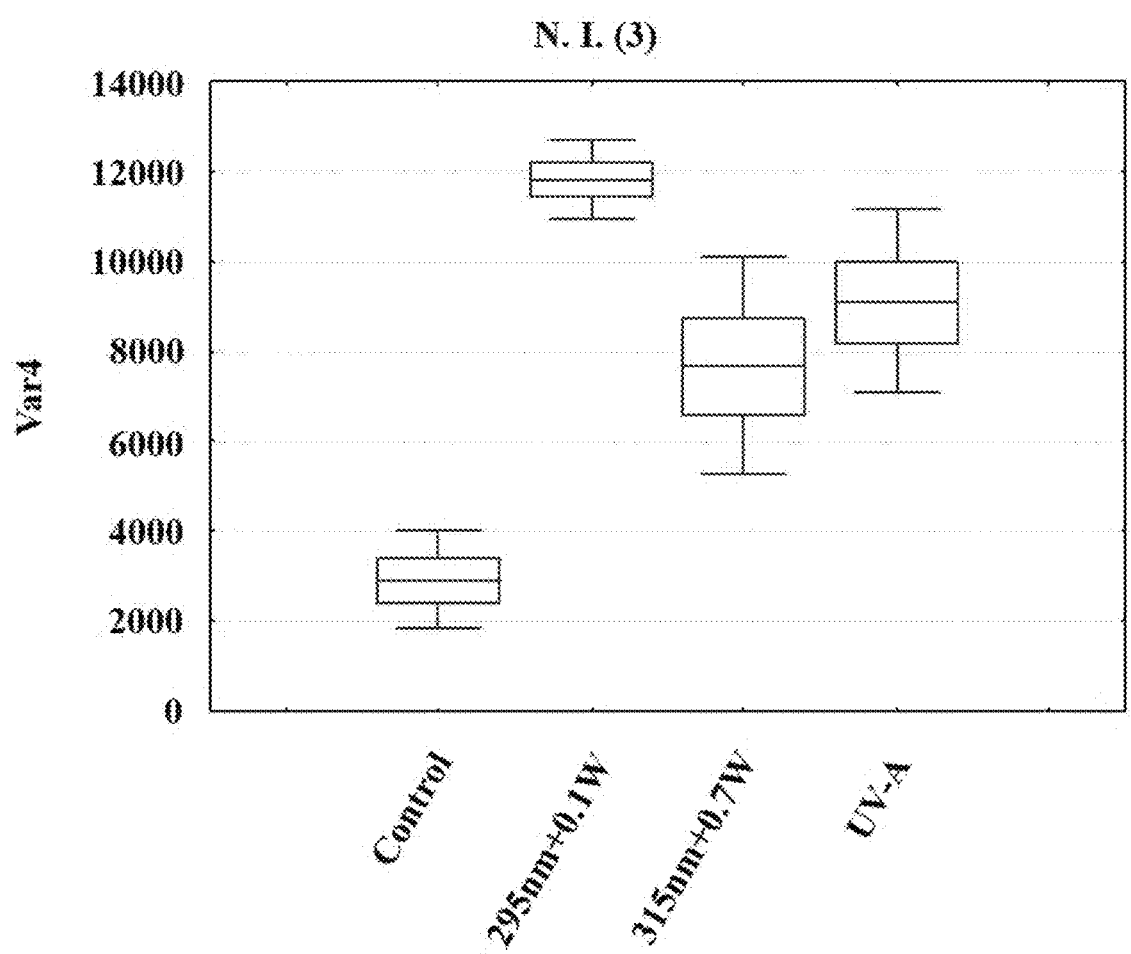

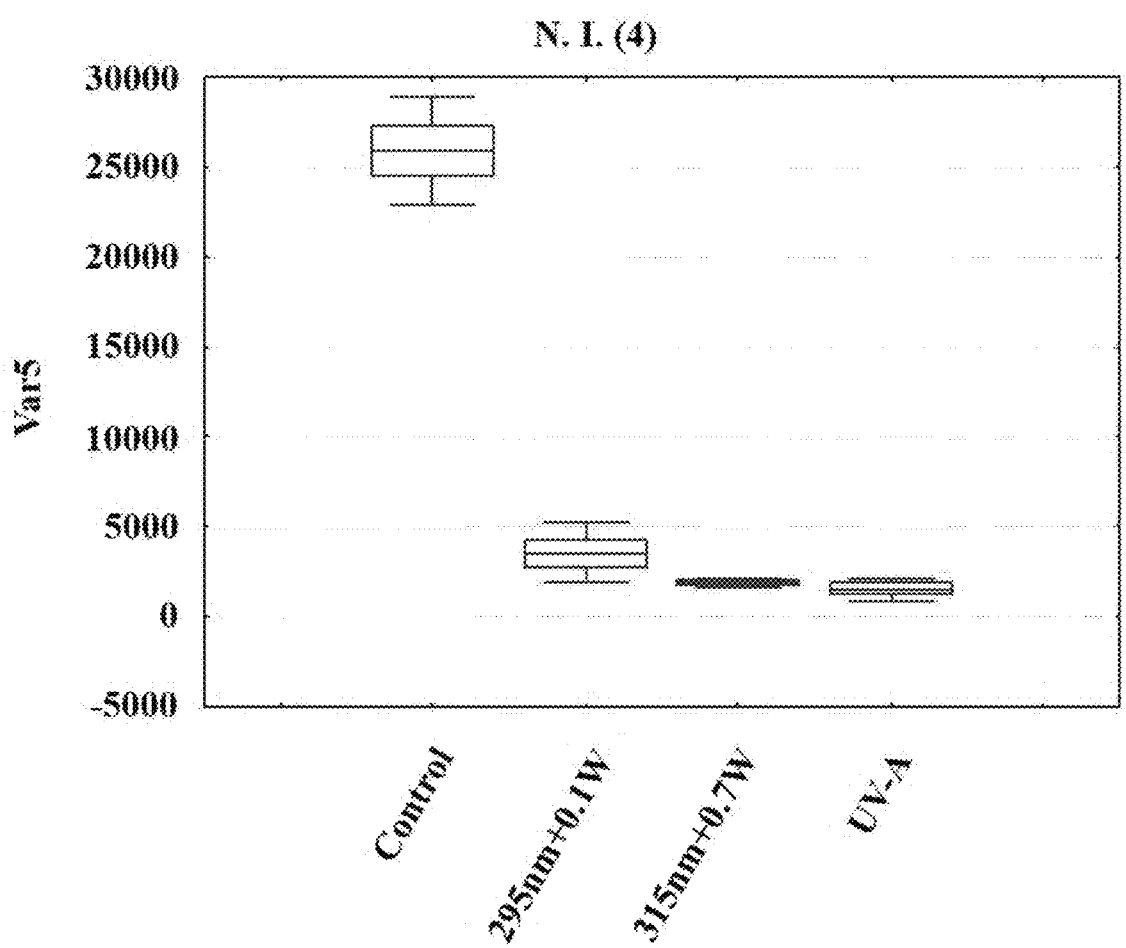

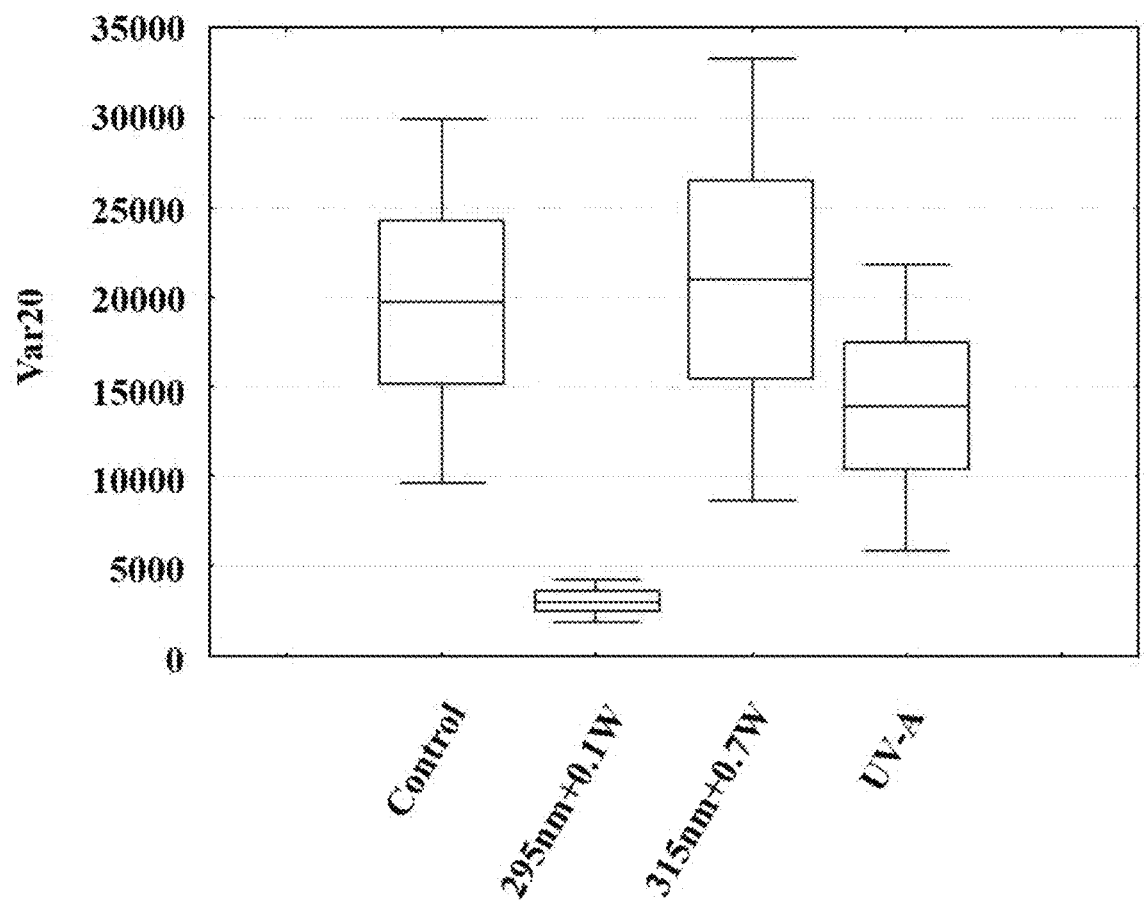

and emission timing of each of the first type of light and the second type of light may be adjusted such that the content of the first phytochemical in the plant is different from the content of the second phytochemical in the plant.

LIGHT SOURCE FOR PLANT CULTIVATION

CROSS-REFERENCE OF RELATED APPLICATION AND PRIORITY

The present application a Continuation of U.S. patent application Ser. No. 17/137,898 filed on Dec. 30, 2020, which is a Non-provisional application which claims priority to and the benefit of U.S. Provisional Application No. 62/956,959, filed on Jan. 3, 2020, the disclosure of which is incorporated herein by reference in its entirety.

FIELD

Embodiments of the present disclosure relate to a light source for plant cultivation and, more particularly, to a light source which emits light optimal for synthesis of phytochemicals in a plant.

RELATED ART

As a luminaire for plant cultivation, various light sources may be used to replace sunlight. Conventionally, incandescent lamps and fluorescent lamps were mainly used as a luminaire for plant cultivation. However, conventional luminaires for plant cultivation only provide light having a specific wavelength suitable for photosynthesis of plants and do not have any additional functions.

Plants can synthesize substances useful to humans through resistance to various stresses. Therefore, there is a need for a light source for plant cultivation, which can promote production of substances useful to humans in a plant, a cultivation apparatus including the same, and a cultivation method using the same.

SUMMARY

Embodiments of the present disclosure provide a light source for plant cultivation which can promote production of substances useful to humans in a plant.

Embodiments of the present disclosure provide a plant cultivation method which allows easy cultivation of a plant using the light source for plant cultivation.

In accordance with one or more embodiments of the present disclosure, a light source for plant cultivation includes at least two light emitting devices supplying light to a plant. The light emitting devices each includes a first semiconductor layer doped with a first conductivity type dopant, a second semiconductor layer disposed on the first semiconductor layer and doped with a second conductivity type dopant different from the first conductivity type dopant, and an active layer interposed between the first semiconductor layer and the second semiconductor layer. The light emitting devices emit light towards the plant under a different condition. In some embodiments, the different condition includes at least one of wavelength, radiation intensity, and emission timing to control a type and a content of phytochemicals in the plant.

In at least one variant, the light emitting devices may include a first light emitting device emitting a first type of light and a second light emitting device emitting a second type of light. The first type of light and the second type of light may have different peak wavelengths.

In another variant, the phytochemical may include a first phytochemical and a second phytochemical different from the first phytochemical, and at least one of wavelength, radiation intensity, and emission timing of each of the first In yet another variant, when the first type of light is emitted for a first period of time and the second type of light is emitted for a second period of time, the second period of time may precede the first period of time such that the content of the first phytochemical in the plant is higher than the content of the second phytochemical in the plant.

In yet another variant, when the first type of light is emitted for a first period of time and the second type of light is emitted for a second period of time, the first period of time may precede the second period of time such that the content of the second phytochemical in the plant is higher than the content of the first phytochemical in the plant.

In some embodiments, the phytochemical may include kaempferols, hydrocinnamic acids, flavonols, and anthocyanins, particularly at least one selected from among kaempferols and hydrocinnamic acids.

In some embodiments, each of the first light emitting device and the second light emitting device may be a light emitting diode. Here, the first type of light may have a wavelength in the UVB spectrum and may have a peak in the wavelength range of about 280 nm to about 300 nm.

In at least one variant, the second type of light may have a different wavelength than the first type of light. The second type of light may have a peak in the wavelength range of about 310 nm to about 390 nm.

In other embodiments, the plant may be cruciferous plants Cruciferous plants may include at least one selected from among cabbage, Chinese cabbage, kale, broccoli, radish, shepherd's purse, oilseed rape, mustard, and bok choy.

In accordance with one or more embodiments of the present disclosure, a plant cultivation method using the light source set forth above is provided. Here, the light emitting devices of the light source emit light towards the plant under a different condition in terms of at least one of wavelength, radiation intensity, and emission timing to control a type and a content of phytochemicals in the plant.

The light source according to the embodiments of the present disclosure allows efficient cultivation of a plant and can easily increase the content of phytochemicals beneficial to humans in the plant.

BRIEF DESCRIPTION OF THE DRAWINGS

FIG. 6 is a graph showing fresh weights of samples cultivated under different treatment conditions, that is, treatment groups 1 to 6 and a control group.

FIG. 7A and FIG. 7B show fresh weights of the aerial part and the root part, respectively, and FIG. 7C and FIG. 7D show dry weights of the aerial part and the root part, respectively.

FIG. 8A is a graph showing phenolic content per gram.

FIG. 8D is a graph showing antioxidant capacity per plant.

FIG. 11A is a graph showing phenolic content per gram, phenolic content per plant, antioxidant capacity per gram, and antioxidant capacity per plant.

FIG. 11A is a graph showing phenolic content per gram.

FIG. 11C is a graph showing antioxidant capacity per gram.

FIG. 14C shows results of metabolite analysis (LTQ-IT-MS) on a different kaempferol compound from FIG. 14B.

FIG. 14E shows results of metabolite analysis (LTQ-IT-MS) on a different kaempferol compound from FIG. 14D.

FIG. 15A shows results of metabolite analysis (LTQ-IT-MS) on hydrocinnamic acid compound.

FIG. 15D shows results of metabolite analysis (LTQ-IT-MS) on hydrocinnamic acid compound different from FIG. 15C.

FIG. 16C shows results of metabolite analysis (LTQ-IT-MS) on unidentified compounds. N. I. (3) as described in Table 4.

FIG. 16D shows results of metabolite analysis (LTQ-IT-MS) on unidentified compounds. N. I. (4) as described in Table 4.

FIG. 16E shows results of metabolite analysis (LTQ-IT-MS) on unidentified compounds. N. I. (5) as described in Table 4.

FIG. 18B shows results of metabolite analysis on kaempferol compound different from FIG. 18A.

FIG. 18C shows results of metabolite analysis on kaempferol compound different from FIG. 18B.

FIG. 19A shows results of metabolite analysis on hydrocinnamic acids.

FIG. 19A shows results of metabolite analysis on hydrocinnamic acid compound.

FIG. 19B shows results of metabolite analysis on hydrocinnamic acid compound different from FIG. 19A.

FIG. 19C shows results of metabolite analysis on hydrocinnamic acid compound different from FIG. 19B.

FIG. 19D shows results of metabolite analysis on hydrocinnamic acid compound different from FIG. 19C.

FIG. 19E shows results of metabolite analysis on hydrocinnamic acid compound different from FIG. 19D.

FIG. 20B shows results of metabolite analysis on unidentified compounds, N. I. (2) as described in Table 5.

FIG. 20C shows results of metabolite analysis on unidentified compounds. N. I. (3) as described in Table 5.

FIG. 20D shows results of metabolite analysis on unidentified compounds, N. I. (4) as described in Table 5.

FIG. 20E shows results of metabolite analysis on unidentified compounds, N. I. (5) as described in Table 5.

DETAILED DESCRIPTION

Figure 1:
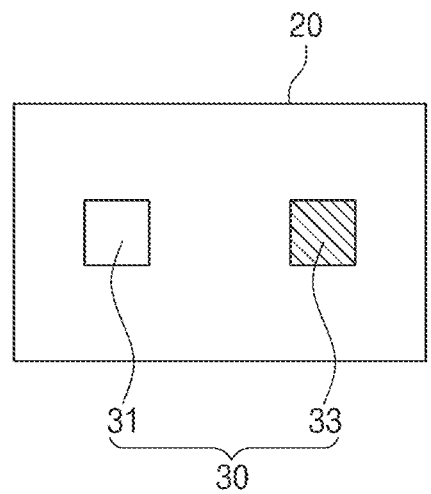
FIG. 1 is a plan view of a light source for plant cultivation according to one or more embodiments of the present disclosure.

The present disclosure may be realized by various embodiments, and some exemplary embodiments of the present disclosure will be described in detail with reference to the accompanying drawings. However, it should be understood that the present disclosure is not limited to the following embodiments, and that various modifications, substitutions, and equivalent embodiments can be made by those skilled in the art without departing from the spirit and scope of the present disclosure.

Like components will be denoted by like reference numerals throughout the specification. It should be noted that the drawings may be exaggerated in thickness of lines or size of components for descriptive convenience and clarity only. It will be understood that, although the terms "first", "second", "A", "B", and the like may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a "first" element or component discussed below could also be termed a "second" element or component, or vice versa, without departing from the scope of the present disclosure. As used herein, the singular forms "a" and "an" are intended to include the plural forms as well, unless the context clearly indicates otherwise.

It will be understood that the terms "includes", "comprises", "including" and/or "comprising," when used in this specification, specify the presence of stated features, steps, operations, elements, and/or components, but do not preclude the presence or addition of one or more other features, steps, operations, elements, components, and/or groups.

The present disclosure relates to a light source used in plant cultivation. A light source according to one or more embodiments of the present disclosure may be used in a plant factory to supply light to plants in the plant factory. Herein, the term "plant factory" refers to a system that can automatically produce a crop all year regardless of season and location by artificially controlling aerial environmental factors (light, temperature, humidity, carbon dioxide concentration, and the like) and root-zone environmental factors (culture medium acidity, concentration, and nutrient composition, and the like) of the crop in a facility and by automating related tasks. One of the greatest advantages of the plant factory is the ability thereof to provide complete control over aerial and root-zone environments in which the crop grows.

Plants convert light in the visible spectrum into chemical energy through photosynthesis. Irradiation of a plant with light other than visible light can increase the content of substances that have health benefits in humans (when ingested) or the plant itself (hereinafter referred to as "phytochemicals"). In accordance with one aspect of the present disclosure, a light source provides non-visible light capable of increasing the content of phytochemicals in a plant. Here, the phytochemicals are substances considered to have beneficial effects on human health, and include, for example, antioxidant substances such as kaempferol compounds and hydrocinnamic acids.

The light source according to the present disclosure may be used in cultivation of various plants. However, photosynthetic efficiency of light emitted from the light source or the degree of increase in phytochemical content may vary from plant to plant. In one or more embodiments, the light source according to the present disclosure may be used in cultivation of cruciferous plants. Examples of the cruciferous plants include cabbage, Chinese cabbage, kale, broccoli, radish, shepherd's purse, oilseed rape, mustard, and bok choy. In one or more embodiments, the light source according to the present disclosure may be used in cultivation of kale, which is a cruciferous plant. However, it will be understood that the present disclosure is not limited thereto and the light source may be used in cultivation of various other plants. Hereinafter, the present disclosure will be described by way of an example in which the light source is used in cultivation of cruciferous plants, particularly kale, for convenience of description.

Figure 2:
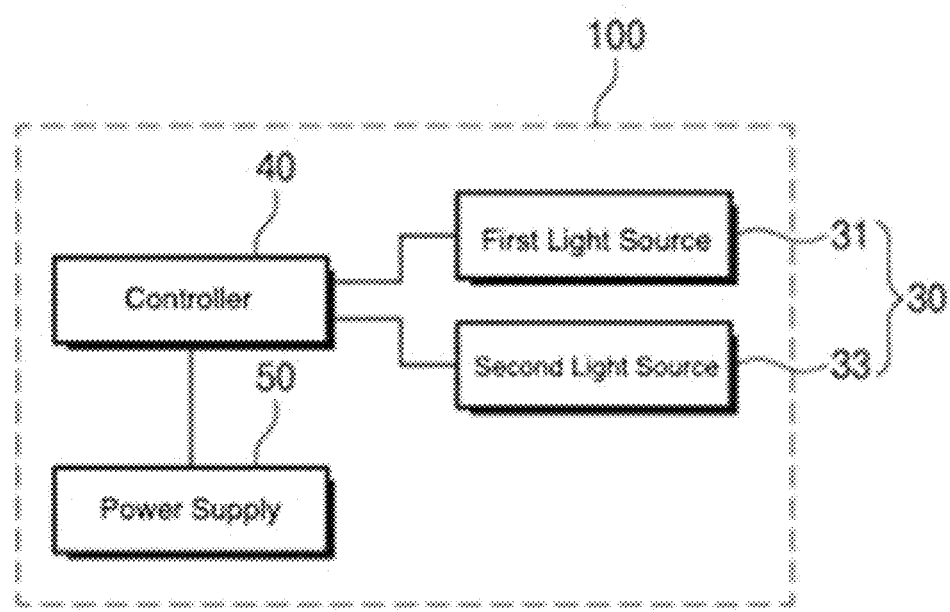
FIG. 2 is a block diagram of a light source module for plant cultivation according to one or more embodiments of the present disclosure.

FIG. 1 is a plan view of a light source for plant cultivation according to one or more embodiments of the present disclosure, and FIG. 2 is a block diagram of a light source module for plant cultivation according to one or more embodiments of the present disclosure.

The present disclosure relates to a light source for plant cultivation. The light source for plant cultivation includes multiple light emitting devices supplying light to a plant. Although the light source may include two or more light emitting devices in one or more embodiments, the present disclosure will be described by way of an example in which the light source for plant cultivation includes two light emitting devices. However, it will be understood that the present disclosure is not limited thereto and the light source for plant cultivation may include three or more light emitting devices.

Referring to FIG. 1 and FIG. 2, the light source module 100 for plant cultivation includes a light source 30 emitting light needed for a plant, a controller 40 controlling the light source 30, and a power supply 50 supplying electric power to the light source 30 and/or the controller 40.

The light source 30 may include first and second light sources 31, 33 having spectral peaks at different wavelengths. For synthesis of phytochemicals in the plant, at least one of the first and second light sources 31, 33 may have a spectral peak in the UV region. Hereinafter, the present disclosure will be described by way of an example in which the first light source 31 has a spectral peak in the UV region.

The first light source 31 may emit a first type of light, that is, light in the UV spectrum. The first type of light may have a peak in the wavelength range of about 280 nm to about 300 nm. In one or more embodiments, the first type of light may have a sharp peak with a full width at half maximum (FWHM) of about 30 nm or less.

The first light source 31 may emit light in a different wavelength band than the second light source 33. In one or more embodiments, the first light source 31 may emit light in the UV spectrum, particularly in the UVB spectrum. The first light source 31 is provided to increase the content of phytochemicals in the plant. The first light source 31 may include a single or multiple light emitting diodes, as needed.

The second light source 33 may emit a light having a different wavelength than the light emitted from the first light source 31. The second type of light may have a peak in the wavelength range of about 310 nm to about 390 nm. For example, the second type of light may have a peak at a wavelength of about 315 nm or about 385 nm. In one or more embodiments, the second type of light may have a sharp peak with a FWHM of about 30 nm or less.

In one or more embodiments, the second light source 33 may emit light in the UV spectrum, specifically in the UVA spectrum or in the wavelength range near the boundary UVA and UVB. The second light source 33 is also provided to increase the content of phytochemicals in the plant, and may include a single or multiple light emitting diodes, as needed.

The first light source 31 and the second light source 33 may be operated independently of each other. Accordingly, the first light source 31 and the second light source 33 may be turned on/off alone or simultaneously. In one or more embodiments, the first light source 31 and the second light source 33 may be turned on/off independently of each other to supply light in a predetermined spectrum to the plant Irradiation of the plant with light from the light source, that is, the first light source 31 and the second light source 33, may be performed in various forms depending on the growth stage, harvest time, or photoperiod of the plant. Light emitted from the light source including the first and second light sources 31, 33 may be variously adjusted depending on the type of target phytochemical or the desired content of the phytochemical.

Specifically, the wavelength, intensity, and emission timing of light applied to the plant may be varied depending on the type of target phytochemical or the desired content of the phytochemical. For example, assuming that the target phytochemical includes a first phytochemical and a second phytochemical different from the first phytochemical, at least one of the wavelength, intensity, and emission timing of the first type of light and the second type of light may be adjusted such that the content of the first phytochemical in the plant is different from the content of the second phytochemical in the plant.

Here, assuming that the first type of light is applied for a first period of time and the second type of light is applied for a second period of time, the second period of time may precede the first period of time such that the amount of the first phytochemical in the plant is larger than the amount of the second phytochemical in the plant, or the first period of time may precede the second period of time such that the amount of the second phytochemical in the plant is larger than the amount of the first phytochemical in the plant. In other words, a specific phytochemical (for example, the second phytochemical) can be synthesized in the plant in a larger amount than another phytochemical by applying light having a specific wavelength (for example, the first type of light) to the plant for a specific period of time, followed by application of light having a different wavelength (for example, the second type of light), and vice versa.

In one or more embodiments, the target phytochemical may include kaempferols, hydrocinnamic acids, flavonols, and anthocyanins. In one or more embodiments, the target phytochemical may be one selected from among kaempferols and hydrocinnamic acids.

The first light source 31 and the second light source 33 may be disposed on a substrate 20. The substrate 20 may be a printed circuit board formed with an interconnect or a circuit to allow the first light source 31 and the second light source 33 to be directly mounted thereon, without being limited thereto. The shape and structure of the substrate are not particularly restricted so long as the first light source 31 and the second light source 33 can be disposed thereon. In other embodiments, the substrate may be omitted.

In one or more embodiments, the controller 40 is connected to the first light source 31 and/or the second light source 33 to control operations of the first light source 31 and the second light source 33. The controller 40 may be connected to the first light source 31 and the second light source 33 in a wired or wireless manner. The power supply 50 is connected to the controller 40 to supply electric power to the controller 40. The power supply unit 50 may be connected to the light source directly or through the controller 40 to supply electric power to the light source.

The controller 40 may control On/Off of the first light source 31 and/or the second light source 33 such that each of the first light source 31 and the second light source 33 emits light at a predetermined intensity for a predetermined period of time. The first light source 31 and the second light source 33 may be individually operated such that the plant can perform photosynthesis with maximum efficiency. Emission intensity or emission timing of the first light source 31 and the second light source 33 may be individually controlled by the controller 40. In addition, when the first light source 31 and/or the second light source 33 include multiple light emitting diodes, the light emitting diodes may be individually controlled by the controller.

The controller 40 may control operations of the first light source 31 and the second light source 33 according to a preset process or user input. Operations of the first light source 31 and the second light source 33 may vary depending on the type of target plant, the growth stage of the plant, and the like.

Although not shown, the light source for plant cultivation according to the embodiments of the present disclosure may further include a visible-light source emitting light in a wavelength range used by the plant for photosynthesis. If the light source according to the embodiment of the present disclosure is disposed in a greenhouse or the like, to which external light (for example, sunlight) is supplied, there may be no need for a separate visible-light source. On the contrary, if the light source is disposed in a dark room or the like, to which no external light is supplied, a separate visible-light source is needed. In the latter case, the visible-light source of the light source can supply light suitable for photosynthesis of the plant. The visible-light source may emit light in a wavelength range typically used by plants for photosynthesis, specifically light in the photosynthetically active radiation (PAR) range. Here, PAR is a portion of the solar spectrum ranging from 400 nm to about 700 nm.

In some embodiments, the visible-light source may be implemented with any number of light emitting diodes so long as the visible-light source can emit light in the visible spectrum which can be used by the plant for photosynthesis. Alternatively, the visible-light source may be implemented with any number of light emitting diodes so long as the visible-light source can emit light in a specific spectrum described below. For example, the visible-light source may include a light emitting diode emitting blue light and red light at the same time, or multiple light emitting diodes which emit light in the blue region and light in the red region, respectively.

Figure 3:
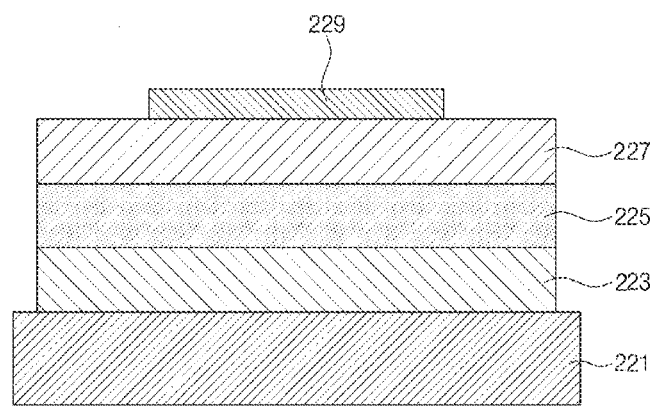
FIG. 3 is a view of a light emitting diode as a light emitting device according to one or more embodiments of the present disclosure.

FIG. 3 is a sectional view of a light emitting diode as a light emitting device according to one or more embodiments of the present disclosure.

Referring to FIG. 3, the light emitting diode may include a light emitting structure having a first semiconductor layer 223, an active layer 225, and a second semiconductor layer 227, and a first electrode 221 and a second electrode 229 connected to the light emitting structure.

The first semiconductor layer 223 is a semiconductor layer doped with a first conductivity type dopant. The first conductivity type dopant may be a p-type dopant. The first conductivity type dopant may be Mg, Zn, Ca, Sr, Ba, or the like. In one or more embodiments, the first semiconductor layer 223 may be formed of a nitride-based semiconductor.

In one or more embodiments, the first semiconductor layer 223 may be formed of a material including GaN, AlN, AlGaN, InGaN, InN, InAlGaN, AlInN, and the like.

The active layer 225 is disposed on the first semiconductor layer 223 and corresponds to a light-emitting layer. The active layer 225 includes a layer in which electrons (or holes) injected through the first semiconductor layer 223 and holes (or electrons) injected through the second semiconductor layer 227 recombine with one another to emit light due to a bandgap difference between energy bands of a material forming the active layer 225.

The active layer 225 may be implemented by a compound semiconductor. For example, the active layer 225 may be implemented by at least one selected from among group III-V compound semiconductors and group II-VI compound semiconductors.

The second semiconductor layer 227 is disposed on the active layer 225. The second semiconductor layer 227 is a semiconductor layer doped with a second conductivity type dopant having an opposite polarity to the first conductive dopant. The second conductivity type dopant may be an n-type dopant. For example, the second conductivity type dopant may include Si, Ge, Se, Te, O, C. and the like.

In one or more embodiments, the second semiconductor layer 227 may be formed of a nitride-based semiconductor. For example, the second semiconductor layer 227 may be formed of a material including GaN, AlN, AlGaN, InGaN, InN, InAlGaN, AlInN, and the like.

The first electrode 221 and the second electrode 229 may be provided in various forms to be connected to the first semiconductor layer 223 and the second semiconductor layer 227, respectively. Although the first electrode 221 and the second electrode 229 are shown as disposed on a lower surface of the first semiconductor layer 223 and an upper surface of the second semiconductor layer 227, respectively, in this embodiment, the present disclosure is not limited thereto. In one or more embodiments, the first electrode 221 and the second electrode 229 may be formed of, for example, various metals, such as Al, Ti, Cr, Ni, Au, Ag, Ti, Sn, Ni, Cr, W, and, Cu, or alloys thereof. The first electrode 221 and the second electrode 229 may have a monolayer structure or a multilayer structure.

Although the light emitting diode is described as being a vertical light emitting diode, it will be understood that the light emitting diode does not necessarily have to be a vertical light emitting diode and may include various other types of light emitting diodes without departing from the spirit of the present disclosure.

As in the embodiment of the present disclosure, use of the light emitting diode as the light source applying light to the plant, instead of typical lamps, provides the following effects.

Unlike typical lamps (for example, UV lamps), the light emitting diode can supply the plant with light having a specific wavelength when used as the light source according to the embodiment of the present disclosure. Light emitted from typical lamps has a broader spectrum than light emitted from the light emitting diode. Thus, it is difficult to separate a light component in a specific wavelength band from light emitted from typical lamps. In contrast, light emitted from the light emitting diode has a spectrum with a sharp peak at a specific wavelength, and thus the light emitting diode can provide a specific wavelength of light with a much narrower full width at half maximum than light emitted from typical lamps. Accordingly, the light emitting diode can be advantageously used to selectively provide only light having a specific wavelength needed for to the plant. As a result, a user can freely choose either light in a broad spectrum or light having a specific wavelength, as needed.

In addition, typical lamps have difficulty in irradiating the plant at a clearly defined irradiance, whereas the light emitting diode can irradiate the plant at a clearly defined irradiance. Further, since typical lamps have difficulty in irradiating the plant at a clearly defined irradiance, it is necessary to set a broad irradiation time range. In contrast, the light emitting diode can provide light required for the plant within a relatively short and clearly defined timeframe.

As described above, typical lamps have difficulty in delivering an accurate dose of radiation to the plant due to a relatively broad wavelength band, a relatively broad irradiance range, and a relatively broad irradiation time range thereof. In contrast, the light emitting diode can deliver an accurate dose of radiation due to a relatively narrow wavelength band, a relatively narrow irradiance range, and a relatively narrow irradiation time range thereof.

In addition, typical lamps take a considerable amount of time to reach a maximum irradiance thereof after being powered on. In contrast, the light emitting diode requires little or no warm-up time and can reach a maximum irradiance thereof immediately after being powered on. Thus, the light emitting diode allows precise control over irradiation time upon supplying the plant with light having a specific wavelength.

Further, the light emitting diode is more economically beneficial than typical fluorescent lamps due to lower heat generation, lower energy consumption, and longer lifespan thereof.

The light source for plant cultivation as set forth above can promote production of secondary metabolites, which are represented by phytochemicals. Herein, the term "secondary metabolites" refers to substances that have various bioactivities and can provide various benefits, such as antioxidant, anticancer, anti-inflammatory, and antibacterial effects, when ingested by humans. The light source according to this embodiment can allow production of a plant containing large amounts of such phytochemicals, which, in turn, may be processed into foods or pharmaceuticals for easy ingestion, or may be ingested raw by humans.

Experimental Example 1: UV Treatment Condition 1

An experiment was conducted to determine UV treatment conditions leading to promotion of secondary metabolite production in kale.

This experiment was carried out in a plant factory under conditions of temperature: 20° C., humidity: 60%, light source: a visible-light emitting diode (red:white=9:1), and PPFD: 130 μmol/m$^2$/s. Seeds of kale ('Manchoo Collard') were sown in a seed growing pack and then grown into seedlings for 2 weeks. Then, the kale seedlings were transplanted in a deep-flow technique (DFT) hydroponics system under the environment described above, followed by cultivation for 3 weeks.

Treatment with UV-LEDs started 3 weeks after transplantation.

A diel photoperiod was set in the following order: 12 hours of dark period and 12 hours of light period. UV treatment was performed during the light period.

Figure 4:
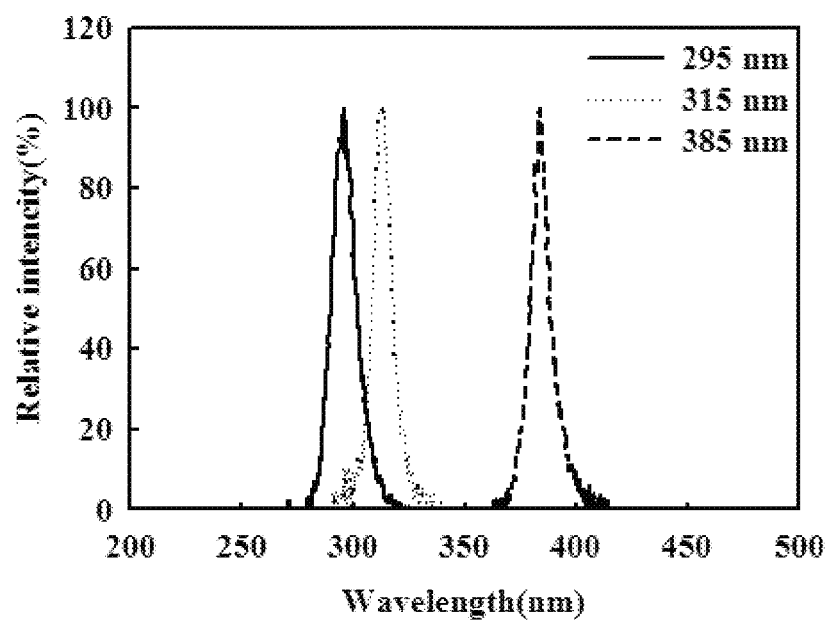
FIG. 4 shows spectra of light emitting diodes used in experimental examples.
Figure 5A:
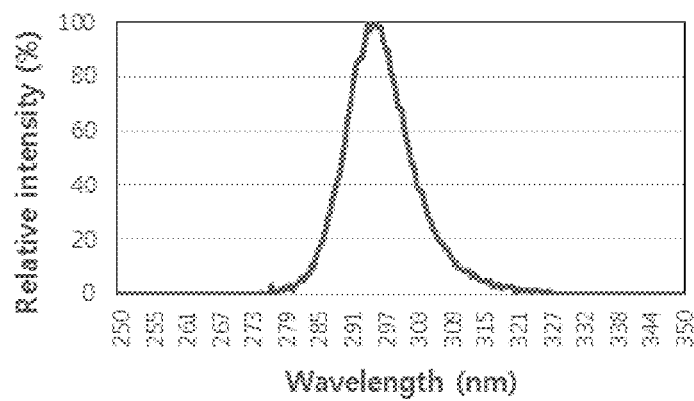
FIG. 5A shows one spectrum of the light emitting diodes of FIG. 4.
Figure 5B:
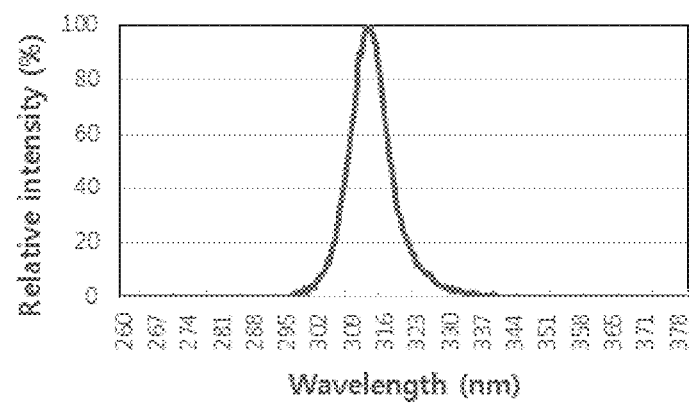
FIG. 5B shows another spectrum of the light emitting diodes of FIG. 4.
Figure 5C:
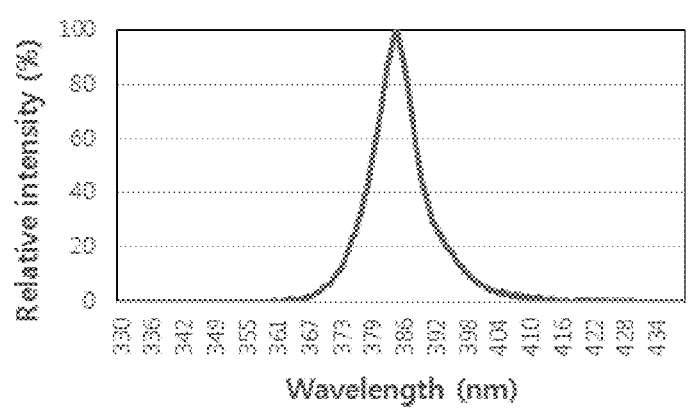
FIG. 5C shows another spectra of the light emitting diodes of FIG. 4.

A UVA-LED having a peak wavelength of 385 nm was used. FIG. 4 shows spectra of light emitting diodes used in experimental examples. FIG. 5A shows one spectrum of the light emitting diodes having a peak wavelength of 295 nm among the spectra shown in FIG. 4. FIG. 5B shows another spectrum of the light emitting diodes having a peak wavelength of 315 nm as shown in FIG. 4. FIG. 5C shows another spectrum of the light emitting diodes having a peak wavelength of 385 nm as shown in FIG. 4.

Treatment with the UVA-LED was performed at intensities of 1 W/m$^2$ and 30 W/m$^2$ for 2 consecutive days. UVB-LEDs having peak wavelengths of 315 nm and 295 nm were used. Treatment with the 315 nm UVB-LED was performed at intensities of 0.3 W/m$^2$ and 1 W/m$^2$ and treatment with the 295 nm UVB-LED was performed at intensities of 0.3 W/m$^2$ and 1 W/m$^2$, as shown in Table 1. Treatment with the UVB-LEDs was performed for 6 hours per day for 2 days.

TABLE 1

| Treatment conditions | Treatment group 1 | Treatment group 2 | Treatment group 3 | Treatment group 4 | Treatment group 5 | Treatment group 6 | Control |
|---|---|---|---|---|---|---|---|
| Peak wavelength (nm) | 295 | 295 | 315 | 315 | 385 | 385 | — |
| Intensity of radiation (W/m$^2$) | 0.3 | 1 | 0.3 | 1 | 30 | 1 | — |

Experimental Example 2: Fresh Weight and Dry Weight after UV Treatment

The fresh weight of the plant was measured to ascertain a difference between results under the respective treatment conditions in Experimental Example 1.

FIG. 6 is a graph showing fresh weights of kale samples cultivated under the respective treatment conditions, that is, the fresh weights of treatment groups 1 to 6 and a control group. In the graph, the x-axis indicates elapsed time (day) and the y-axis indicates fresh weight (g). In addition, the control group and treatment groups 1 to 6 are designated by control, 295-0.3 W, 295-1 W, 315-0.3 W, 315-1 W, 385-30 W, and 385-1 W, respectively.

Figure 7A:
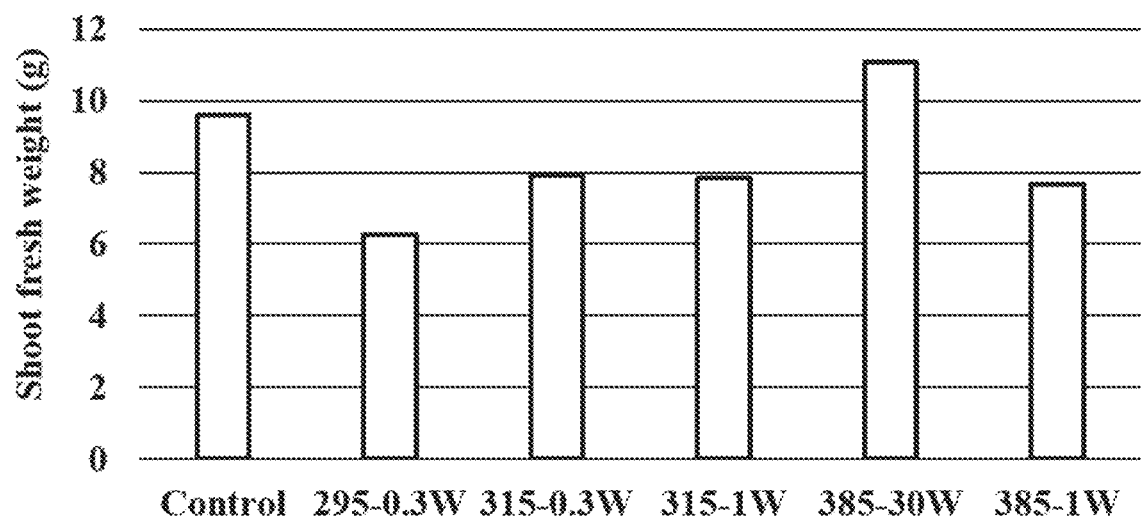
FIG. 7A to FIG. 7D are graphs showing fresh weights and dry weights of an aerial part and a root part where.
Figure 7B:
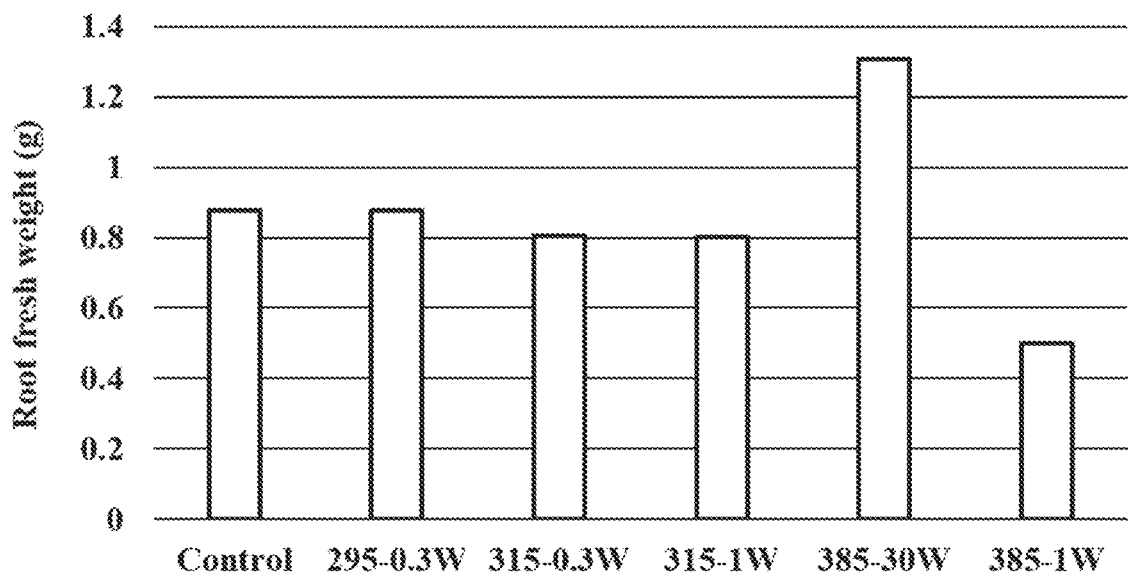
Figure 7C:
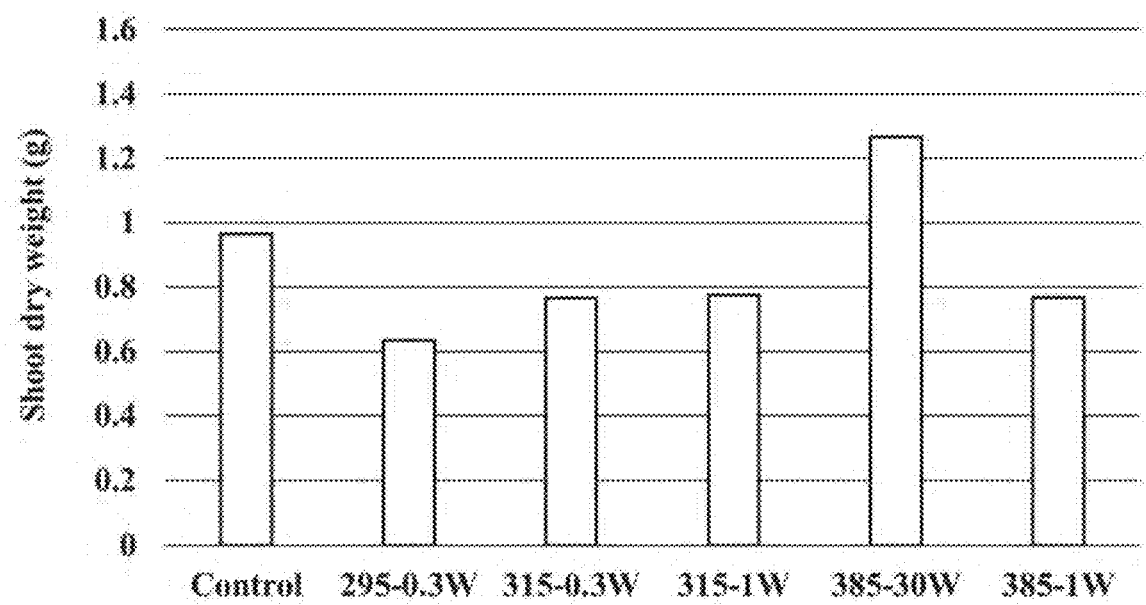
Figure 7D:
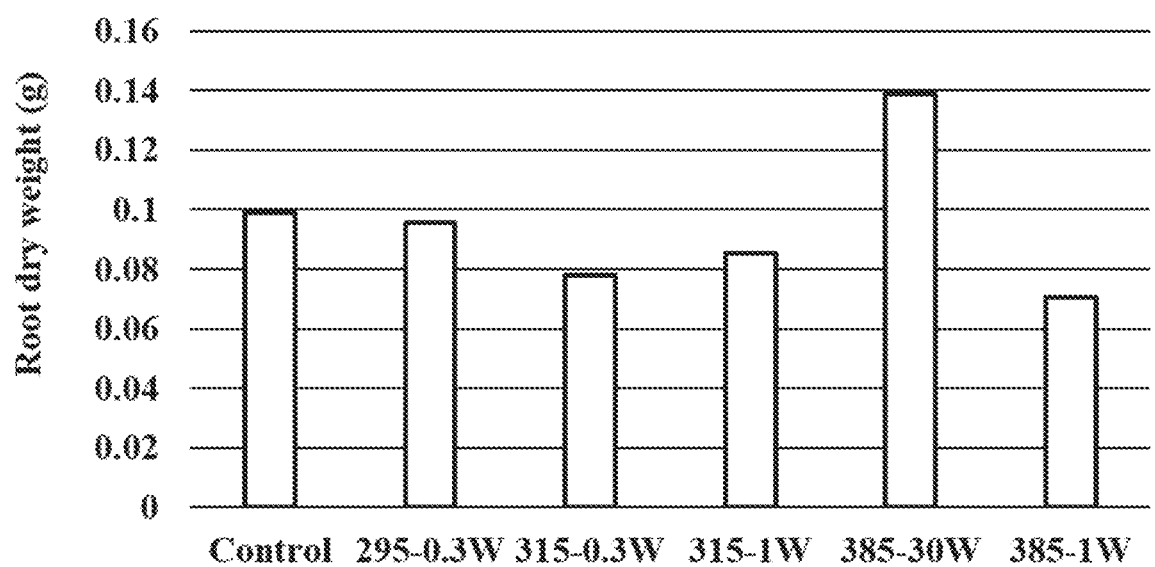

FIG. 7A to FIG. 7D are graphs showing fresh weights and dry weights of the aerial part and root part of the control group and treatment groups 1 and 3 to 6. As shown in Table 1, groups 1, 3-6 correspond to 295-0.3 W, 315-0.3 W, 315-1 W, 385-30 W, and 385-1 W. Specifically. FIG. 7A and FIG. 7B are graphs showing shoot and root fresh weights (g: gram), respectively, and FIG. 7C and FIG. 7D are graphs showing shoot and root dry weights (g), respectively.

Referring to FIG. 6, there was no significant difference in fresh weight between the control group and treatment groups 1 to 6. In case of treatment group 2 (295-1 W), related kale samples died after lapse of 36 hours and thus additional data could not be obtained. In contrast, in the case of treatment group 1 (295-0.3 W), which was treated at a lower intensity than treatment group 2 despite being treated with the same wavelength as treatment group 2, related kale samples did not die.

Referring to FIG. 7A to FIG. 7D, the fresh weight and dry weight of the aerial part were significantly greater in treatment group 5 (385-30 W) than in the control group and was significantly smaller in the UVB-treated group (treatment group 1) than in the control group. In addition, the fresh weight and dry weight of the root part were significantly greater in treatment group 5 (385-30 W) than in the control group and showed no significant difference between the control group and treatment group 3 or 4.

Experimental Example 3: Measurement of Phytochemical Content after UV Treatment Phenolic content per gram, phenolic content per plant, antioxidant capacity per gram of plant, and antioxidant capacity per plant were measured in order to ascertain a difference in phytochemical production between the treatment conditions in Experimental Example 1.

FIG. 8A to FIG. 8D are graphs showing phenolic content per gram (mg GAE/g FW), phenolic content per plant (mg GAE/plant), antioxidant capacity per gram (mM TEAC/g FW), and antioxidant capacity per plant (mM TEAC/plant) over time (d: day), respectively.

Referring to FIG. 8A, although there was no significant difference in total phenolic content between the control group and most treatment groups, treatment groups 4 to 6 (315-1 W, 385-30 W, 385-W) showed increase in phenolic content per gram upon lapse of 36 hours. In the case of treatment group 2 (295-1 W), related kale samples died after lapse of 36 hours and thus the phenolic content thereof could not be measured.

Figure 8B:
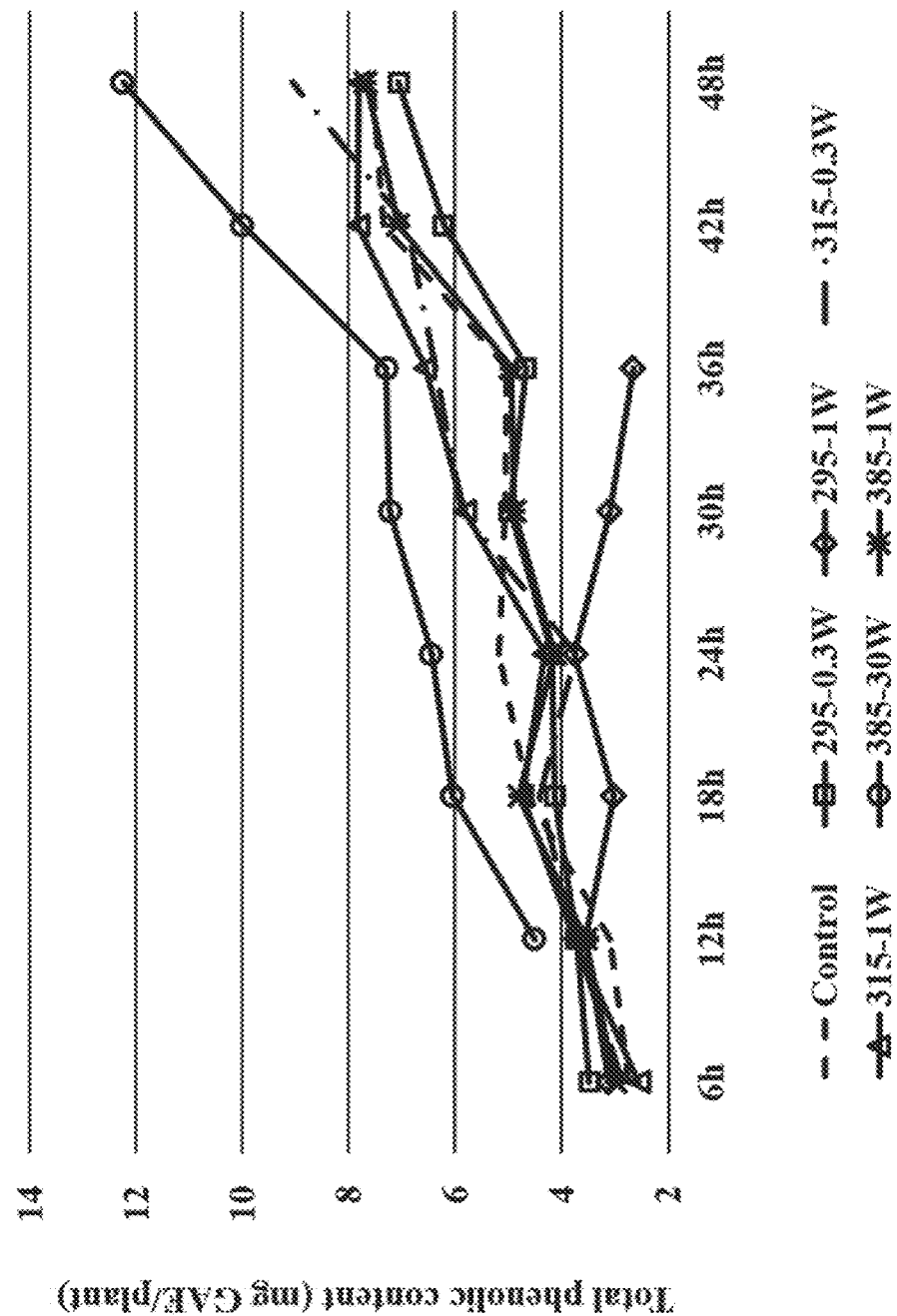
FIG. 8B is a graph showing phenolic content per plant.

Referring to FIG. 8B, the total phenolic content per plant increased over time in all treatment groups except for treatment group 2. Regarding treatment groups 3 and 4, which were treated with 315 nm UVB, the total phenolic content of treatment group 3 increased slowly, whereas the total phenol content of treatment group 4 increased rapidly.

Figure 8C:
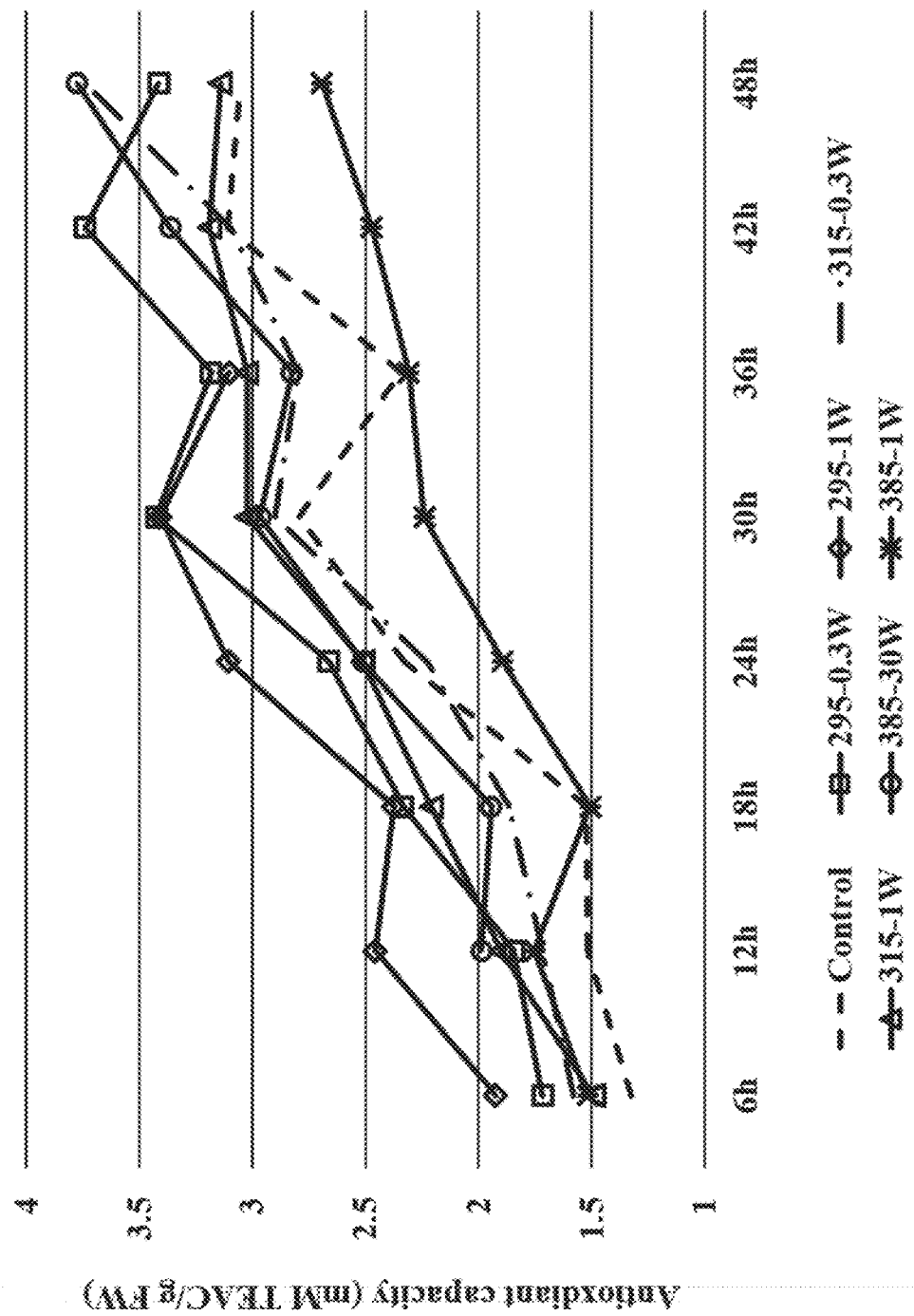
FIG. 8C is a graph showing antioxidant capacity per gram.

Referring to FIG. 8C, the antioxidant capacity per gram showed a tendency to increase over time. Here, treatment group 6, which was treated with UVA, had a lower antioxidant capacity per gram than the other treatment groups.

Referring to FIG. 8D, it can be seen that the antioxidant capacity per plant generally increased with increasing intensity of radiation. In particular, treatment group 5 (315-1 W) had a significantly higher antioxidant capacity per plant than the other treatment groups upon lapse of 36 hours.

Experimental Example 4: Measurement of Chlorophyll Fluorescence after UV Treatment Chlorophyll fluorescence (Fv/Fm, maximum quantum yield) was measured in order to indirectly determine whether treatment with UV-LEDs causes stress to the plant.

Figure 9:
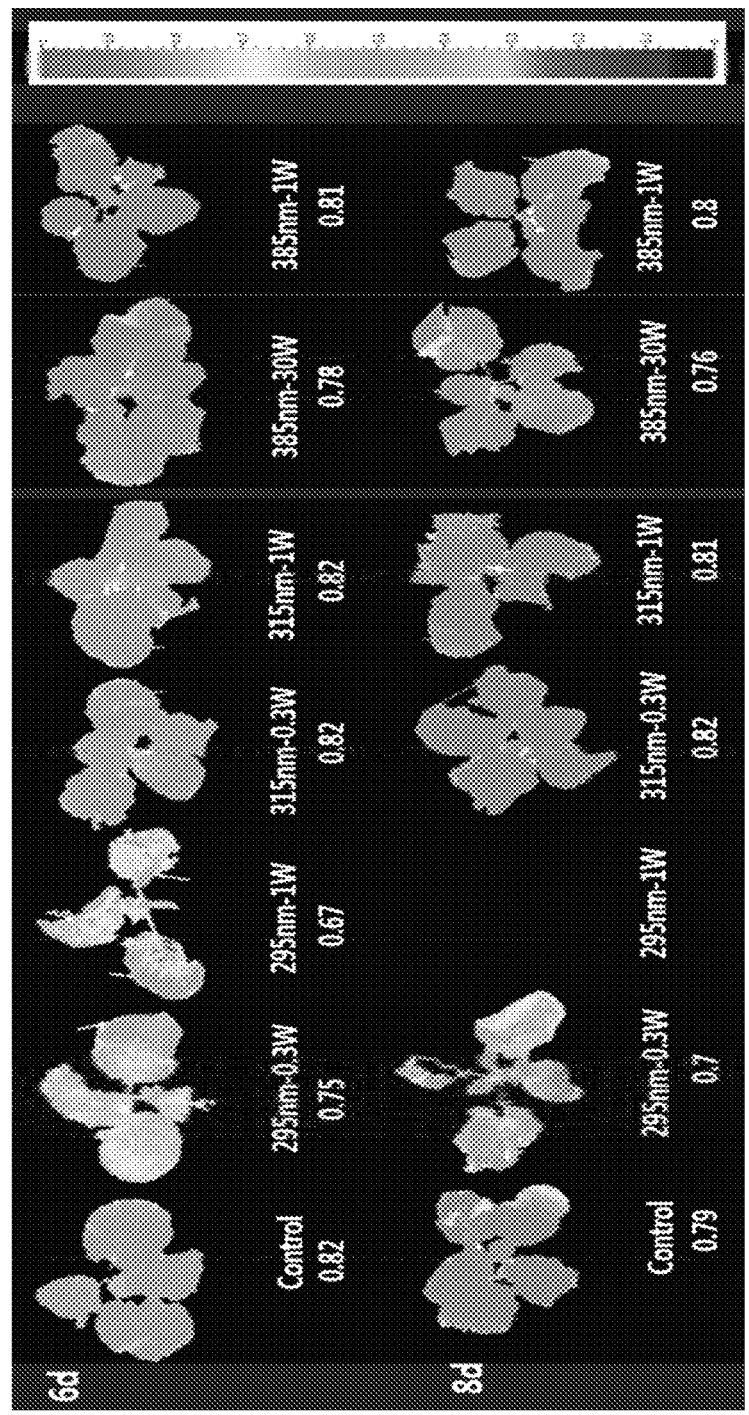
FIG. 9 shows chlorophyll fluorescence images captured on days 6 and 8 of UV treatment.

FIG. 9 shows chlorophyll fluorescence images obtained on days 6 and 8.

A chlorophyll fluorescence of 0.8 or more indicates that the plant has not been stressed. Referring to FIG. 9, on day 6, the control group and treatment groups except for treatment groups 2 and 3 had a chlorophyll fluorescence of 0.8 or more, which indicates that the corresponding groups had not experienced stress sufficient to cause harm thereto. In contrast, treatment groups 2 and 3 had a chlorophyll fluorescence of less than 0.8, which indicates that the corresponding groups had been treated at an intensity causing harm thereto. In particular, treatment group 2, which was treated at an intensity of 1 W, died before day 8 and thus the chlorophyll fluorescence thereof could not be measured.

Experimental Example 5: UV Treatment Condition 2

An experiment was conducted to determine UV treatment conditions leading to promotion of secondary metabolite production in kale.

This experiment was carried out in a plant factory under conditions of temperature: 20° C., humidity: 60%, light source: a visible-light emitting diode (red:white: 9:1), and PPFD: 130 µmol/m$^2$/s. Seeds of kale ('Manchoo Collard') were sown in a seed growing pack and then grown to seedlings for 2 weeks. Then, the kale seedlings were transplanted into a deep-flow technique (DFT) hydroponics system under the environment described above, followed by cultivation for 3 weeks.

Treatment with UV-LEDs was started 3 weeks after transplantation.

A UVA-LED having a peak wavelength of 385 nm was used. Treatment with the UVA-LED was performed at an intensity of 30 W/m$^2$ for 8 consecutive days. UVB-LEDs having peak wavelengths of 315 nm and 295 nm were used. Treatment with the 315 nm UVB-LED was performed at intensities of 0.7 W/m$^2$ and 0.3 W/m$^2$ and treatment with the 295 nm UVB-LED was performed at intensities of 0.3 W/m$^2$ and 0.1 W/m$^2$, as shown in Table 2. Treatment with the UVB-LEDs was performed for 6 hours per day for 8 days.

TABLE 2

| Treatment conditions | Treatment group 1 | Treatment group 2 | Treatment group 3 | Treatment group 4 | Treatment group 5 | Control group |
|---|---|---|---|---|---|---|
| Peak wavelength (nm) | 295 | 295 | 315 | 315 | 385 | — |
| Intensity of radiation (W/m$^2$) | 0.1 | 0.3 | 0.3 | 0.7 | 30 | — |

Experimental Example 6: Fresh Weight after UV Treatment

The fresh weight of the plant was measured to ascertain a difference between results between the respective treatment conditions in Experimental Example 5.

Figure 10:
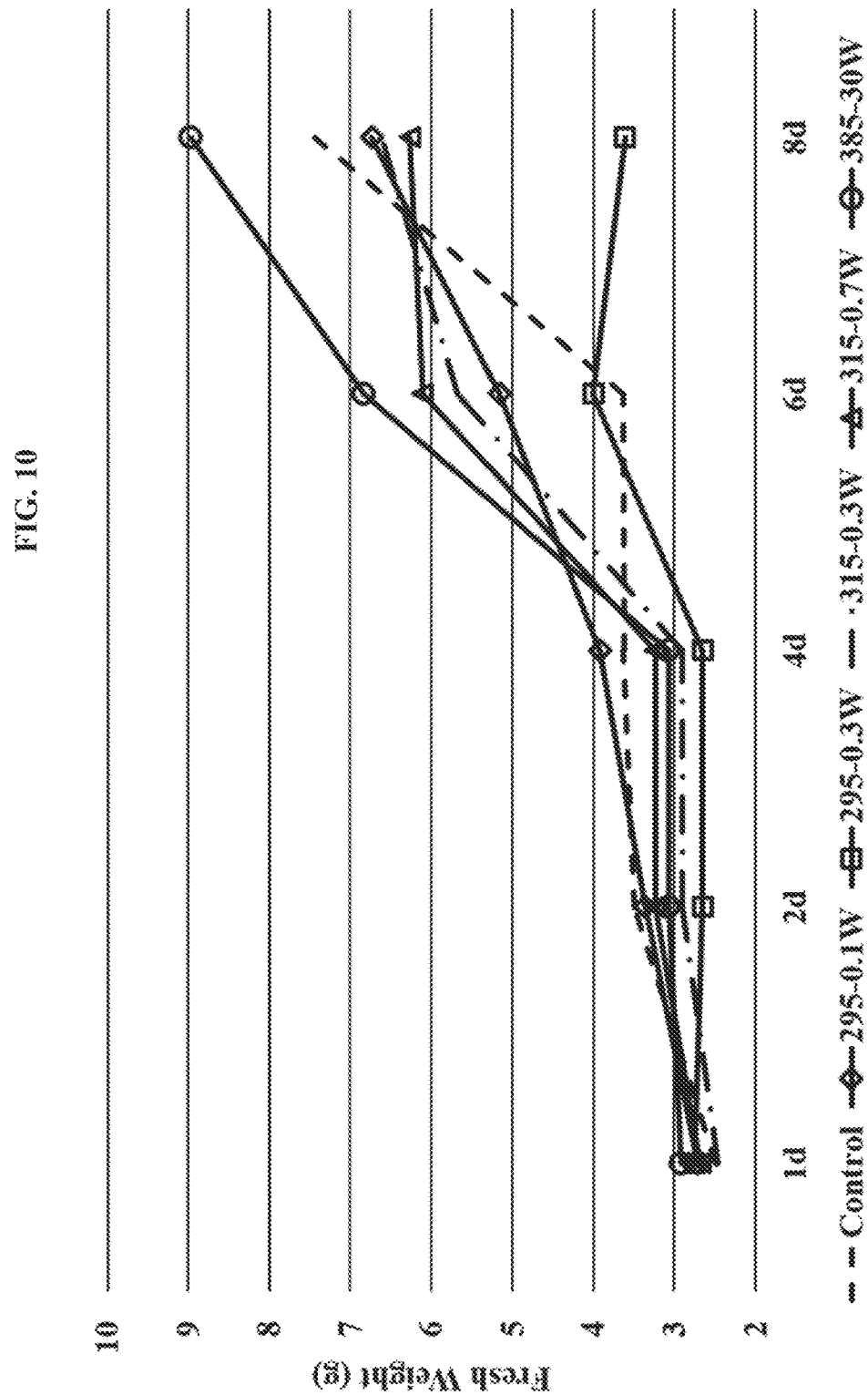
FIG. 10 is a graph showing fresh weights of samples cultivated under different treatment conditions, that is, treatment groups 1 to 5 and a control group.

FIG. 10 is a graph showing the fresh weights of kale samples cultivated under the respective treatment conditions, that is, fresh weights of treatment groups 1 to 5 and a control group. In the graph, the x-axis indicates elapsed time (day) and the y-axis indicates fresh weight (g). In FIG. 10, the control group and treatment groups 1 to 5 are designated by control, 295-0.1 W, 295-0.3 W, 315-0.3 W, 315-0.7 W, and 385-30 W, respectively.

Referring to FIG. 10, no significant difference in fresh weight between the control group and all treatment groups 1 to 5 was observed until day 6 of UV treatment. However, on day 8 of UV treatment, treatment group 2 had a lower fresh weight than treatment groups 1 and 3 to 5 and the control group. There was no significant difference in fresh weight between treatment groups 1 and 3 to 5 and the control group.

Consequently, treatment with 295 nm UVB at an intensity of 0.1 W/m$^2$ and treatment with 315 nm UVB were considered not to stunt growth of kale in that all treatment groups except for treatment group 2, which was treated with 295 nm UVB at high intensity (0.3 W/m$^2$), did not show decrease in fresh weight on day 8 of UV treatment, as compared with the control group.

Experimental Example 7: Measurement of Phytochemical Content after UV Treatment

Phenolic content per gram, phenolic content per plant, antioxidant capacity per gram, and antioxidant capacity per plant were measured in order to ascertain a difference in phytochemical production between the treatment conditions in Experimental Example 1.

FIG. 11A to FIG. 11D are graphs showing the phenolic content per gram (mg GAE/g FW), phenolic content per plant (mg GAE/plant), antioxidant capacity per gram (mM TEAC/g FW), and antioxidant capacity per plant (mM TEAC/plant) over time (d), respectively.

Referring to FIG. 11A, most treatment groups had a higher total phenolic content than the control group. In particular, treatment group 1, which was treated with UVB, had a considerably high total phenolic content. In other words, regarding the total phenolic content, it was confirmed that treatment groups treated with UVB had a higher phenolic content per fresh weight gram than the control group on days 2, 4 and 8 of UV treatment. On days 6 and 8 of UV treatment, all treatment groups except for treatment group 2, which was subjected to intense stress, showed increase in total phenolic content per plant.

Figure 11B:
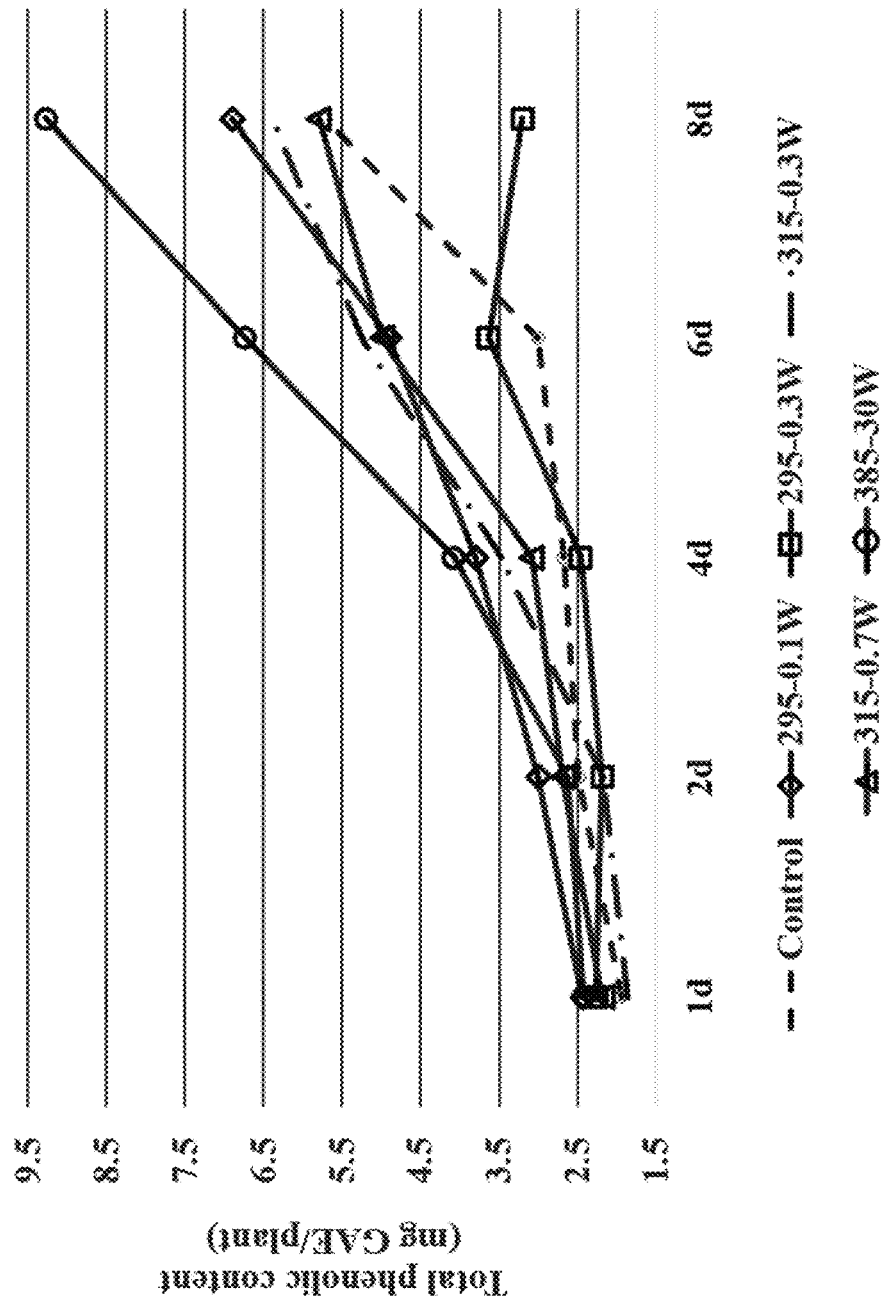
FIG. 11B is a graph showing phenolic content per plant.

Referring to FIG. 11B, on day 6 of UV treatment, all treatment groups had a higher phenolic content per plant than the control group. However, on day 8 (at 48 hours) of UV treatment, treatment group 2 had a significantly low phenolic content per plant due to decrease in fresh weight.

Referring to FIG. 11C, it can be seen that different wavelengths and different intensities of radiation caused different changes in antioxidant capacity per gram over time. It was confirmed that the antioxidant capacity per gram increased more rapidly in treatment groups 1 and 2 (kale samples treated with UVB) than in treatment groups 3 to 5 (kale samples treated with UVA) and the control group. More specifically, the antioxidant capacity per gram of treatment group 2 was the highest on day 2 of UV treatment and decreased on days 4 and 6, as compared with day 2. The antioxidant capacity per gram of treatment group 1 was relatively high on days 2 and 4 of UV treatment and was relatively low on days 6 and 8 of UV treatment. Conversely, the antioxidant capacity per gram of treatment group 5 was relatively low on days 2 and 4 of UV treatment and was relatively high on days 6 and 8 of UV treatment.

Figure 11D:
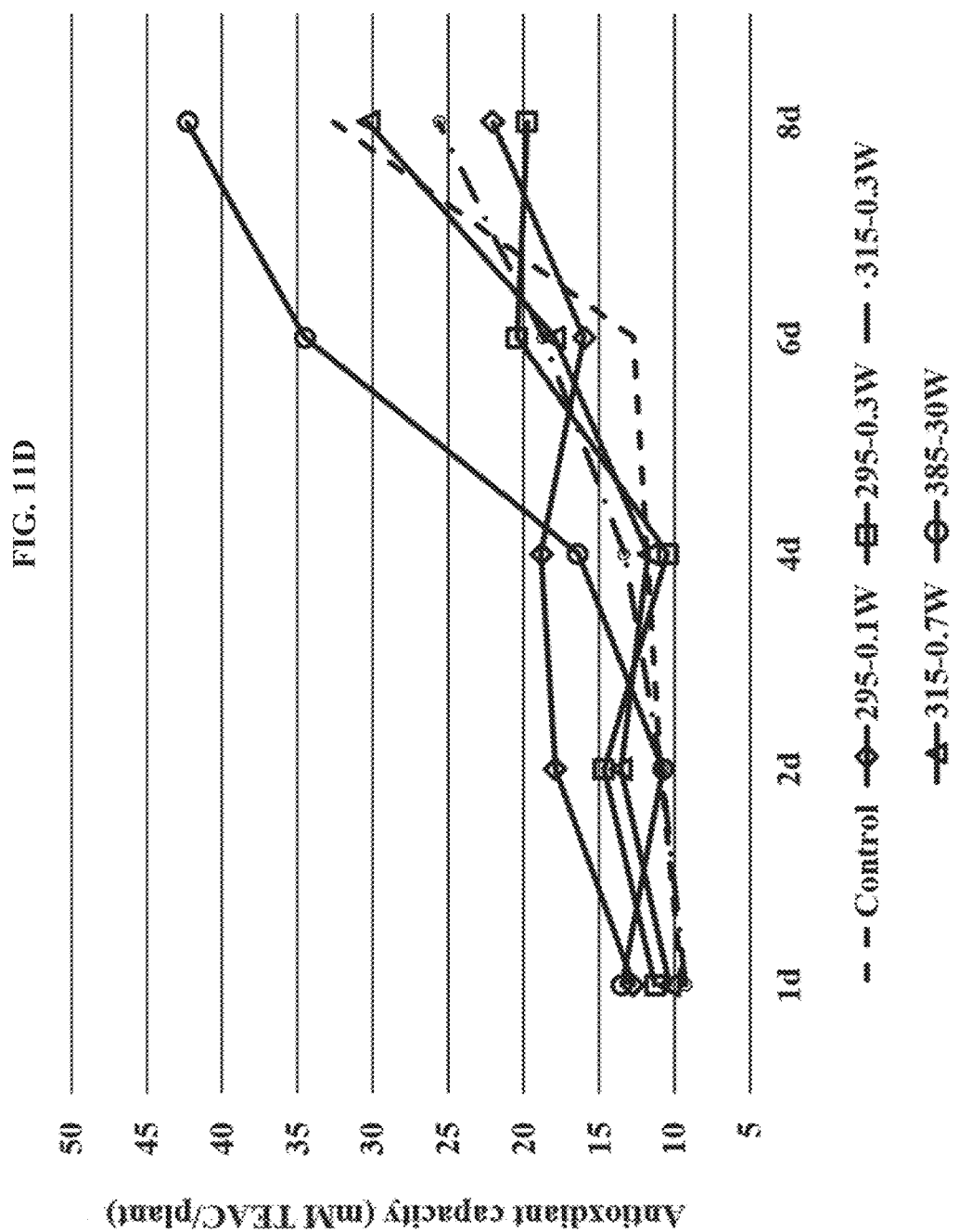
FIG. 11D is a graph showing antioxidant capacity per plant.

Referring to FIG. 11D, it can be seen that the antioxidant capacity per plant generally increased with increasing intensity of radiation. In particular, on day 2 of UV treatment, the antioxidant capacity per plant was the highest in treatment group 1.

Referring FIG. 11A to FIG. 11D, the phenol content and antioxidant capacity per plant were not consistent with the phenol content and antioxidant capacity per plant depending on the days of UV treatment. For example, comparing treatment groups 1 and 2, the antioxidant capacity per gram on day 2 of UV treatment was the highest in treatment group 2 and treatment group 1 was lower than in treatment group 2. Conversely, the antioxidant capacity per plant on day 2 of UV treatment was the highest in treatment group 1 and treatment group 2 was lower than in treatment group 1. In contrast, the antioxidant capacity per gram on day 8 of UV treatment was the highest in treatment 1 and treatment group 2 was much lower in treatment group 1. Conversely, the antioxidant capacity per plant on day 8 of UV treatment was higher in treatment group 1 than in treatment group 2. As such, it was confirmed that the phytochemical content per gram might be inconsistent with the phytochemical content per plant depending on UV treatment time and intensity. Considering the fact that the phytochemical content per gram may be inconsistent with the phytochemical content per plant as in this experimental example, the yield of phytochemicals per gram of a smaller plant can be higher than that of a larger plant. The harvest per area increases with decreasing plant size. Accordingly, in such a circumstance where that a smaller plant has a higher phytochemical content per gram than a larger plant, smaller plant size may be more advantageous in achieving a higher yield of phytochemicals than larger plant size.

Experimental Example 8: Measurement of Chlorophyll Fluorescence after UV Treatment Chlorophyll fluorescence (Fv/Fm, maximum quantum yield) was measured in order to indirectly determine whether treatment with UV-LEDs causes stress to the plant.

Figure 12:
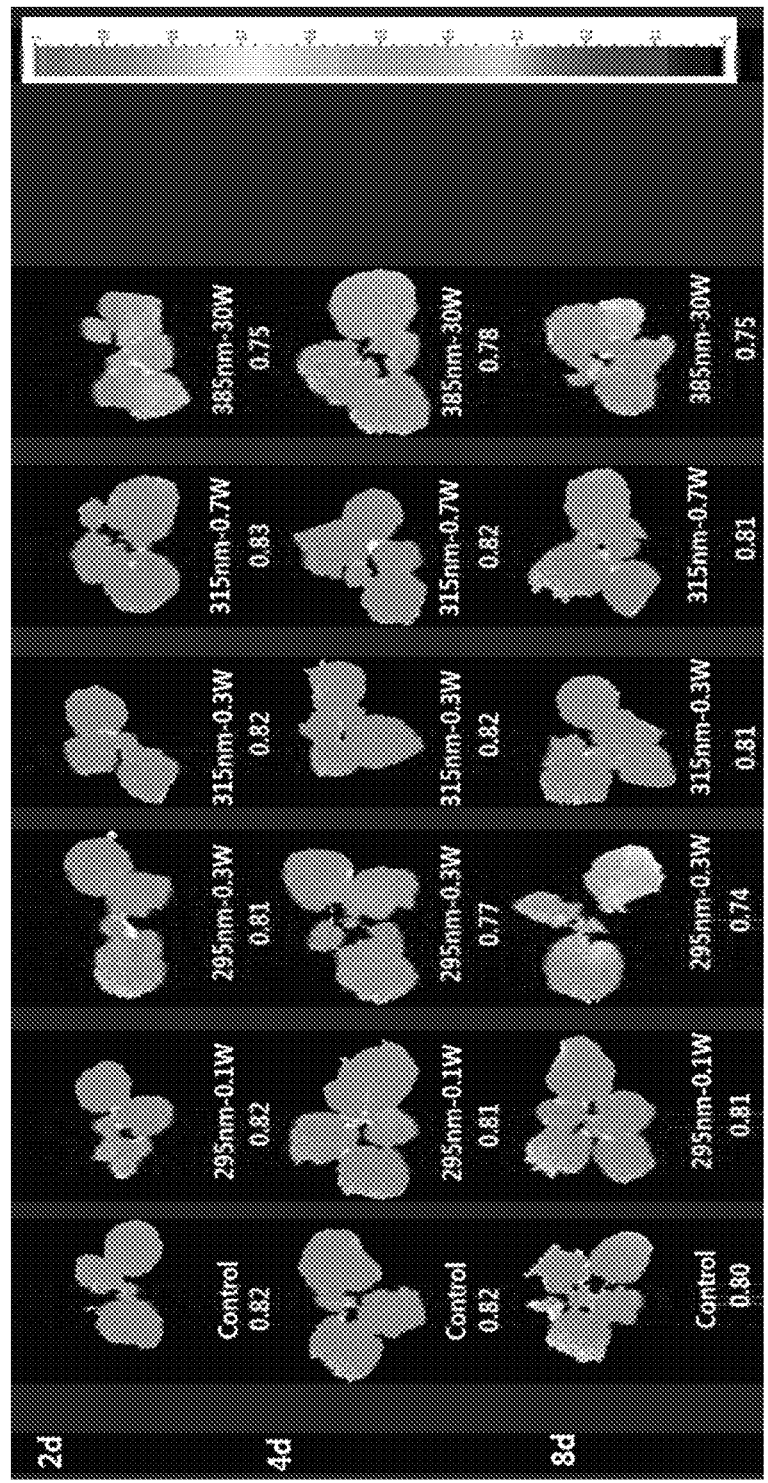
FIG. 12 shows chlorophyll fluorescence images captured on days 2, 4, and 8 of UV treatment.

FIG. 12 shows chlorophyll fluorescence images obtained on days 2, 4, and 8 of UV treatment.

As described above, a chlorophyll fluorescence of 0.8 or more indicates that the plant has not been stressed. Referring to FIG. 12, on day 2, the control group and all treatment groups had a chlorophyll fluorescence of 0.8 or more, which indicates that the corresponding groups had not experienced stress sufficient to cause harm thereto. In contrast, on days 4 and 8, treatment groups 2 and 5 had a chlorophyll fluorescence of less than 0.8, which indicates that the corresponding groups had been treated at an intensity causing harm thereto.

Experimental Example 9: Metabolite Analysis after UV Treatment (on Day 2)

Metabolite analysis was performed to identify specific bioactive substances produced only under the stimulus of UVB upon treatment of kale samples with UVA and UVB.

Treatment conditions of treatment groups and a control group are shown in Table 3, and kale samples used in this experimental example were obtained in the same manner as in the above experimental examples.

TABLE 3

| Treatment conditions | Treatment group 1 | Treatment group 2 | Treatment group 3 | Treatment group 4 | Control group |
|---|---|---|---|---|---|
| Peak wavelength (nm) | 295 | 295 | 315 | 385 | — |
| Intensity of radiation (W/m$^2$) | 0.1 | 0.3 | 0.7 | 30 | — |

As the treatment continued, the kale samples were grouped by treatment condition, which means that different metabolites were biosynthesized in different groups.

Figure 13A:
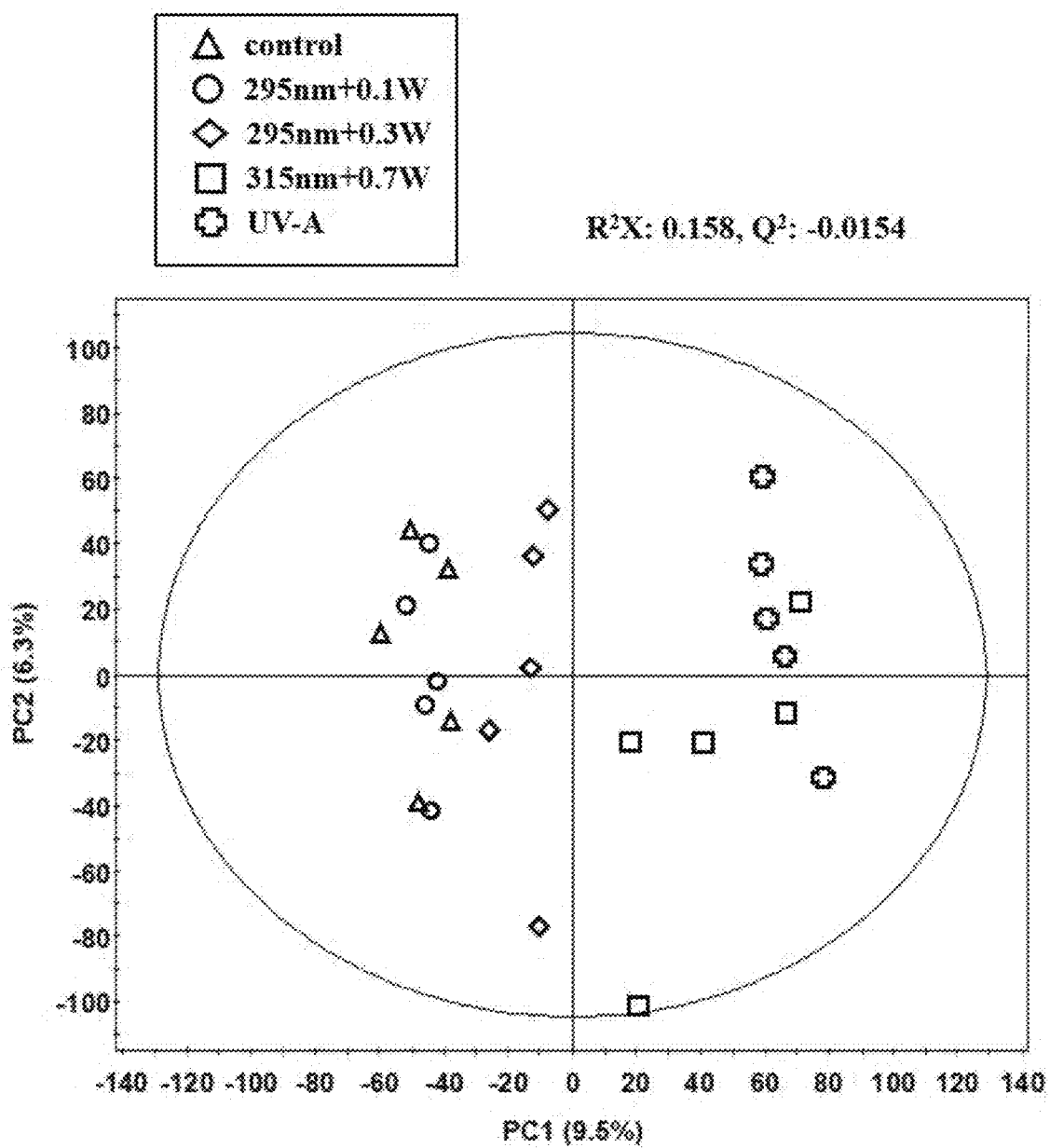
FIG. 13A and FIG. 13B show results of metabolite analysis, where the graph on the FIG. 13A shows results of principal component analysis (PCA) and the graph on the FIG. 13B shows results of partial least squares discriminant analysis (PLS-DA).
Figure 13B:
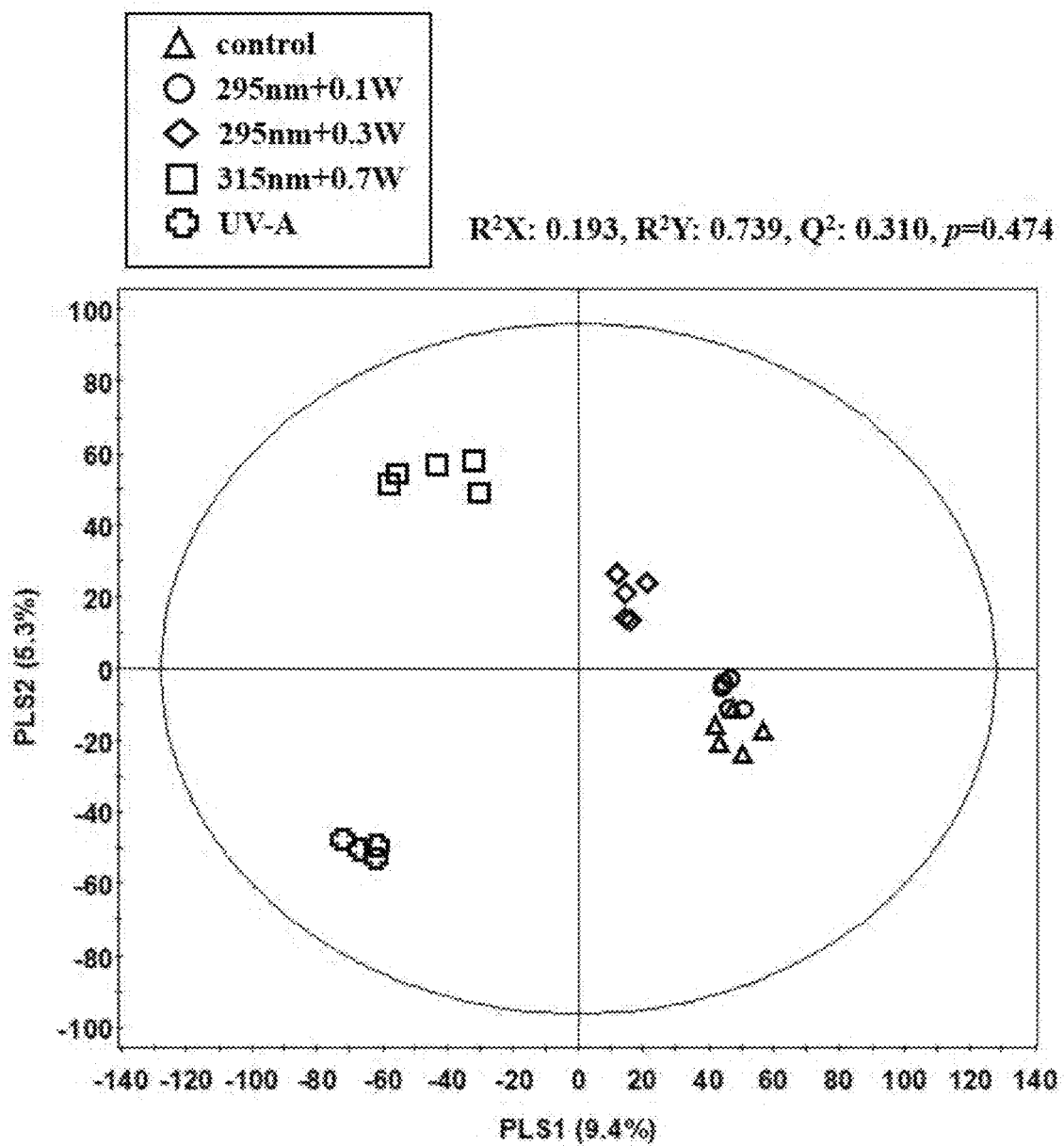
Figure 14A:
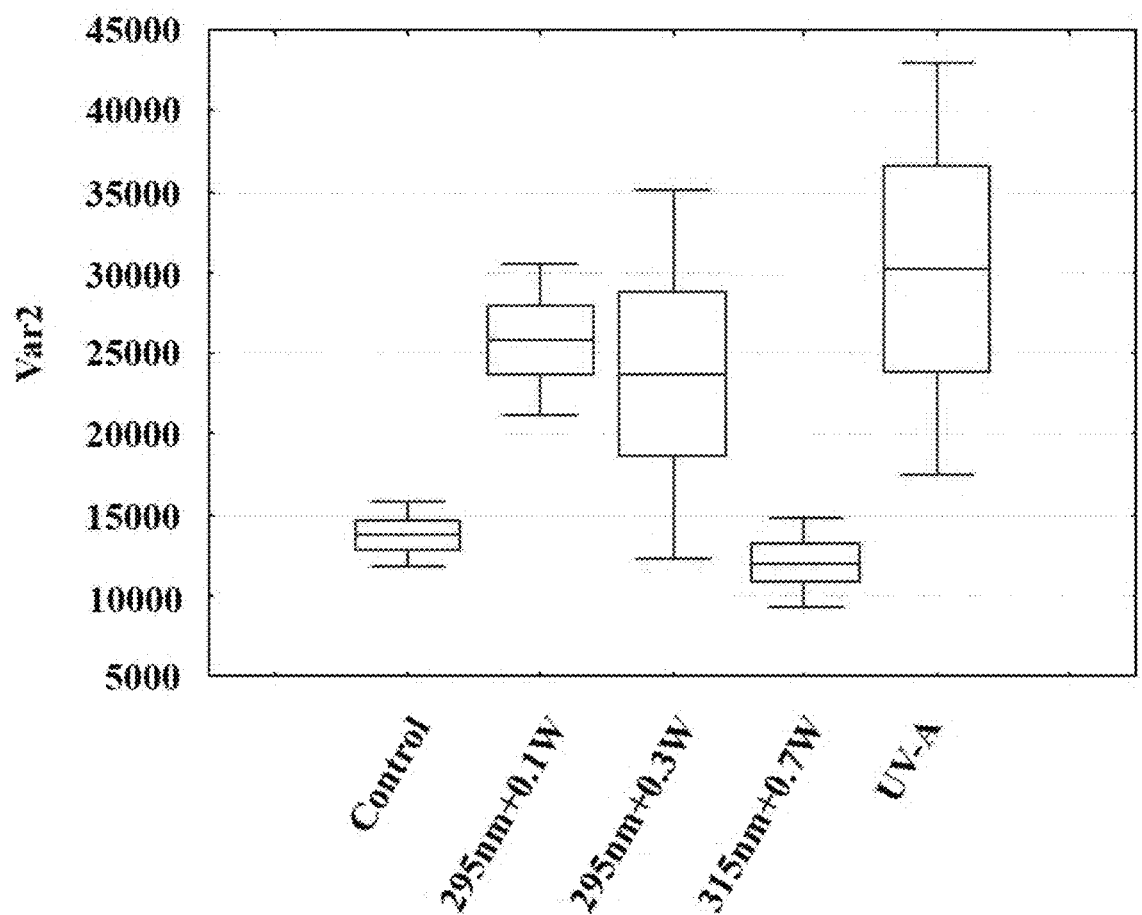
FIG. 14A shows results of metabolite analysis (LTQ-IT-MS) on a kaempferol compound.
Figure 14B:
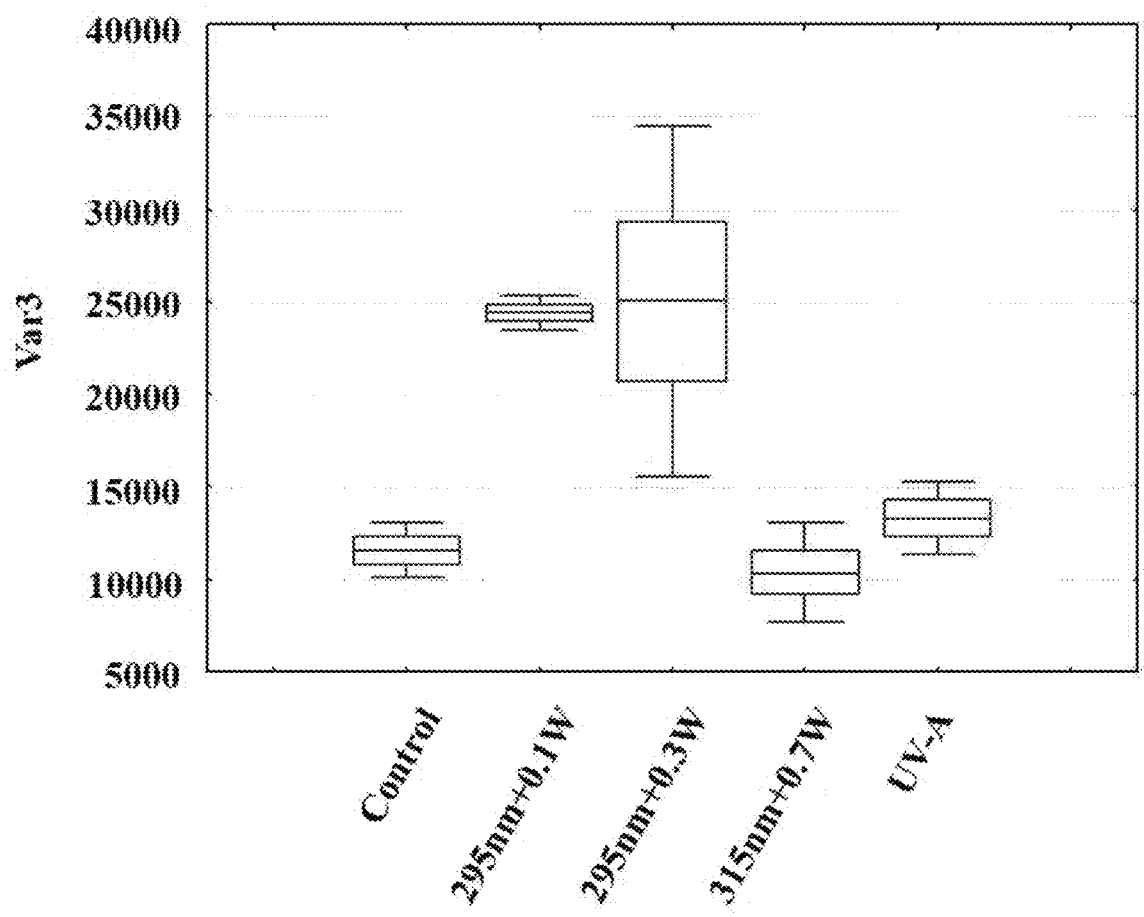
FIG. 14B shows results of metabolite analysis (LTQ-IT-MS) on a different kaempferol compound from FIG. 14A.
Figure 14D:
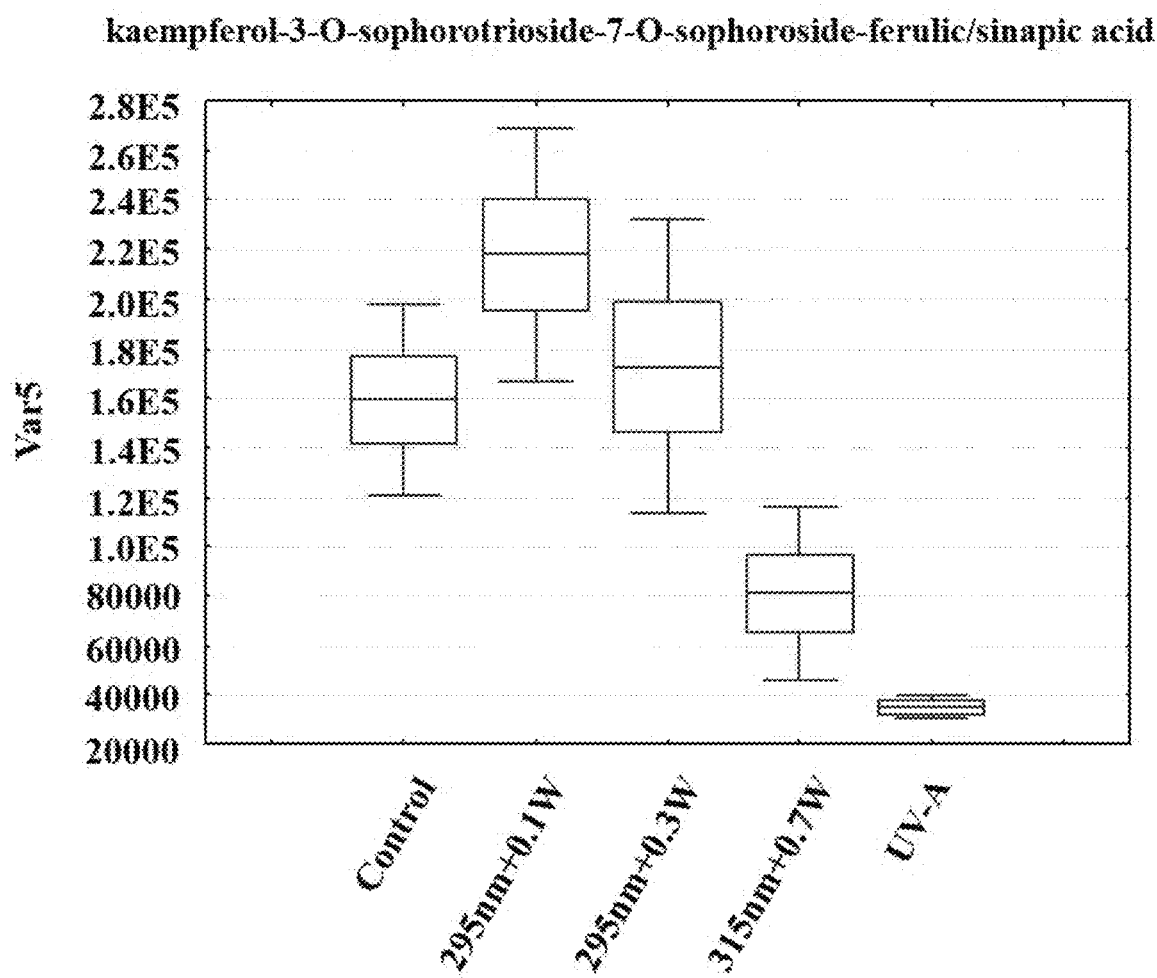
FIG. 14D shows results of metabolite analysis (LTQ-IT-MS) on a different kaempferol compound from FIG. 14C.
Figure 15B:
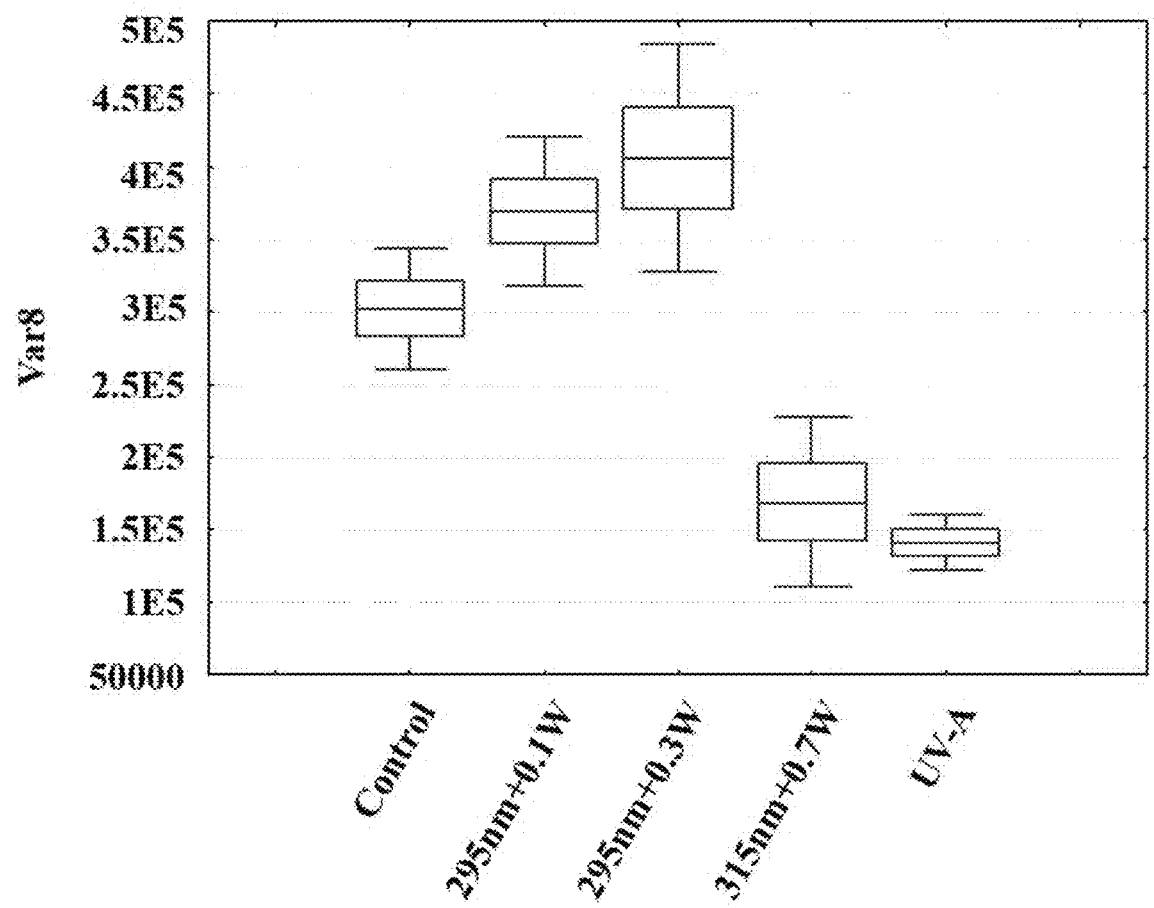
FIG. 15B shows results of metabolite analysis (LTQ-IT-MS) on hydrocinnamic acid compound different from FIG. 15A.
Figure 15C:
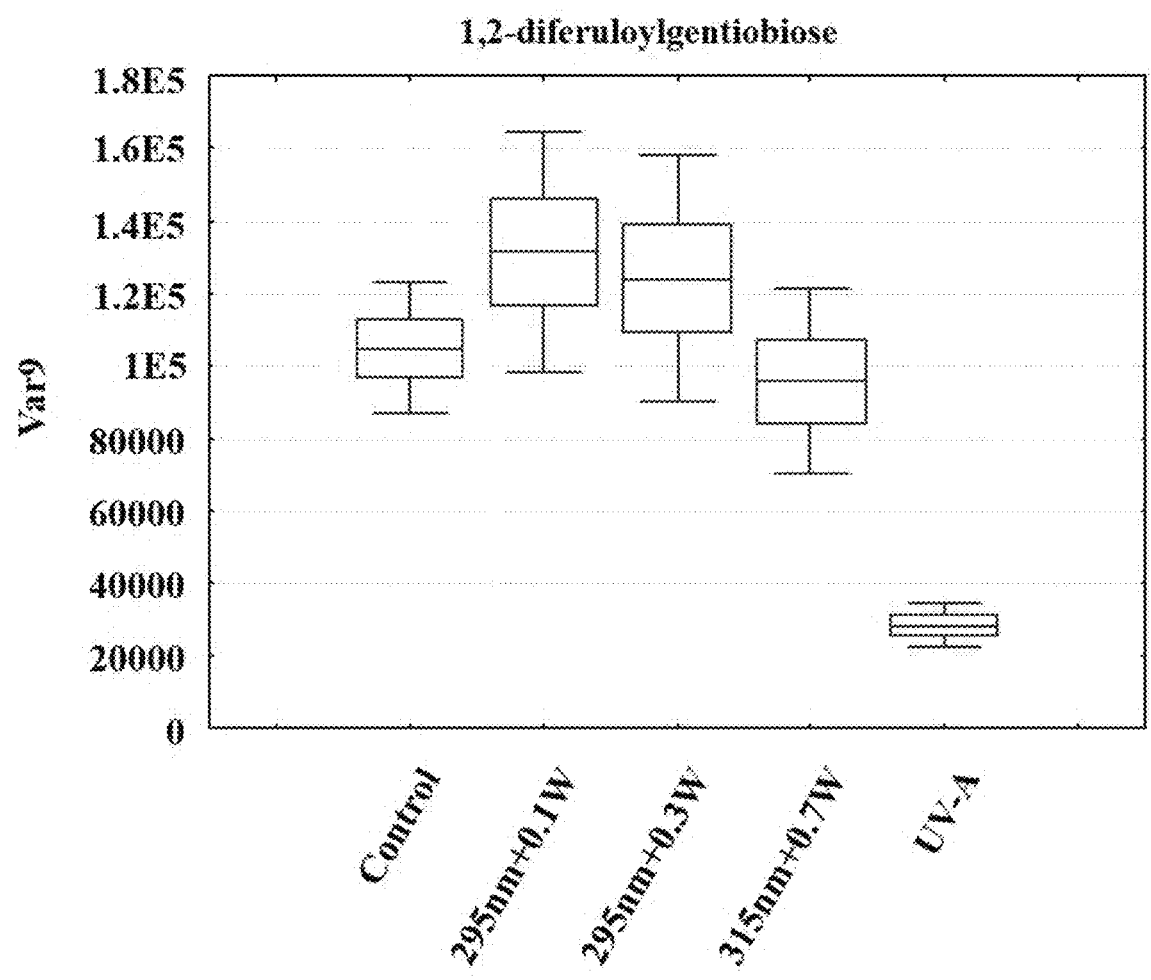
FIG. 15C shows results of metabolite analysis (LTQ-IT-MS) on hydrocinnamic acid compound different from FIG. 15B.
Figure 15E:
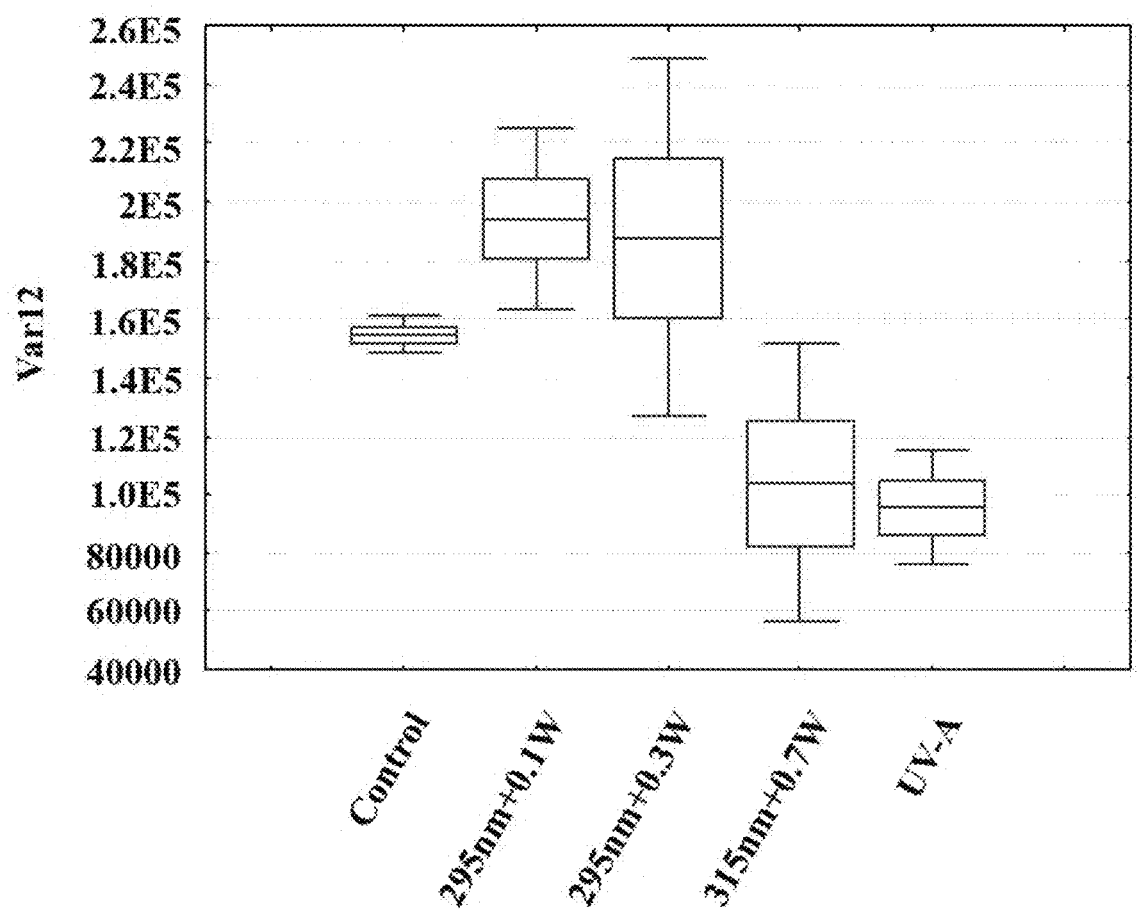
FIG. 15E shows results of metabolite analysis (LTQ-IT-MS) on hydrocinnamic acid compound different from FIG. 15D.
Figure 16A:
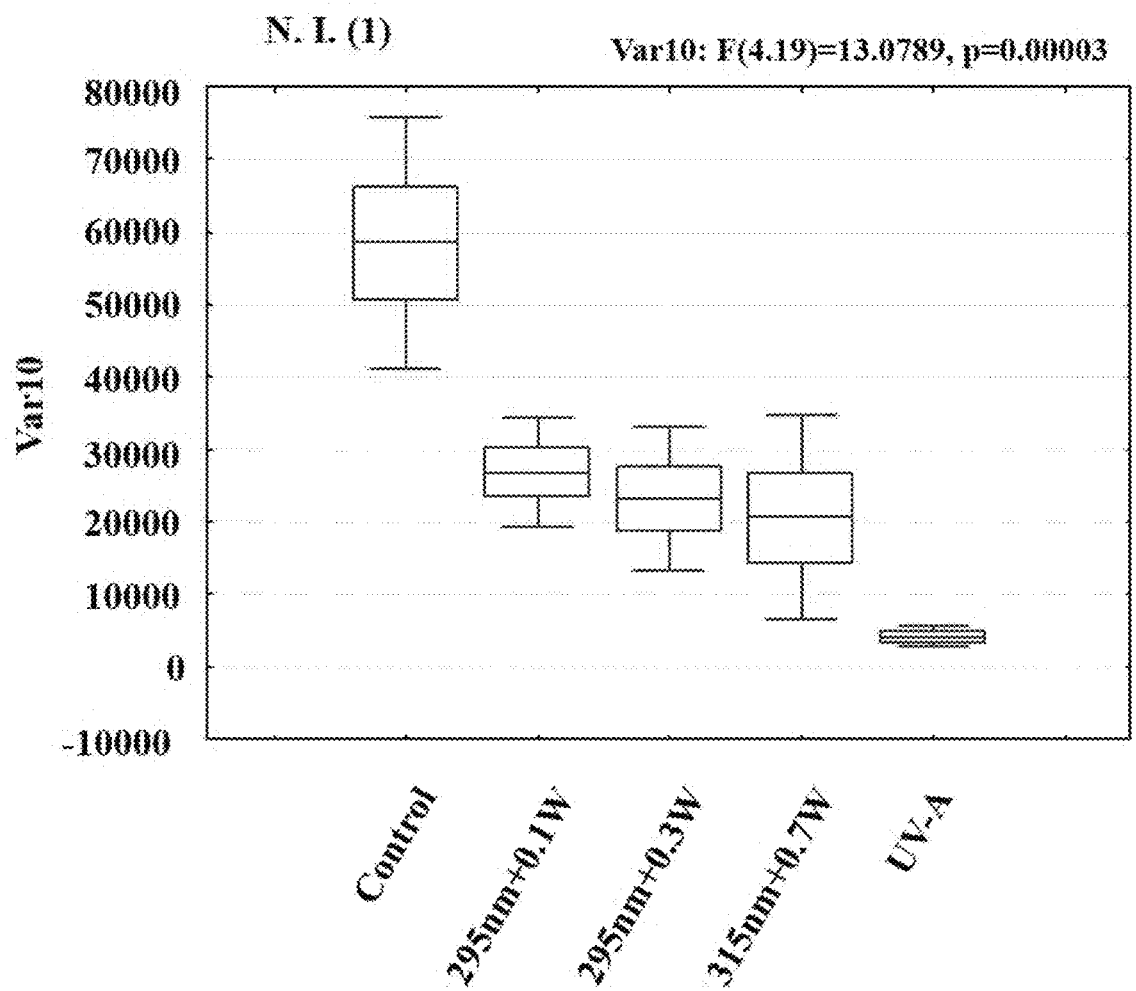
FIG. 16A shows results of metabolite analysis (LTQ-IT-MS) on unidentified compounds. N. I. (1) as described in Table 4.
Figure 16B:
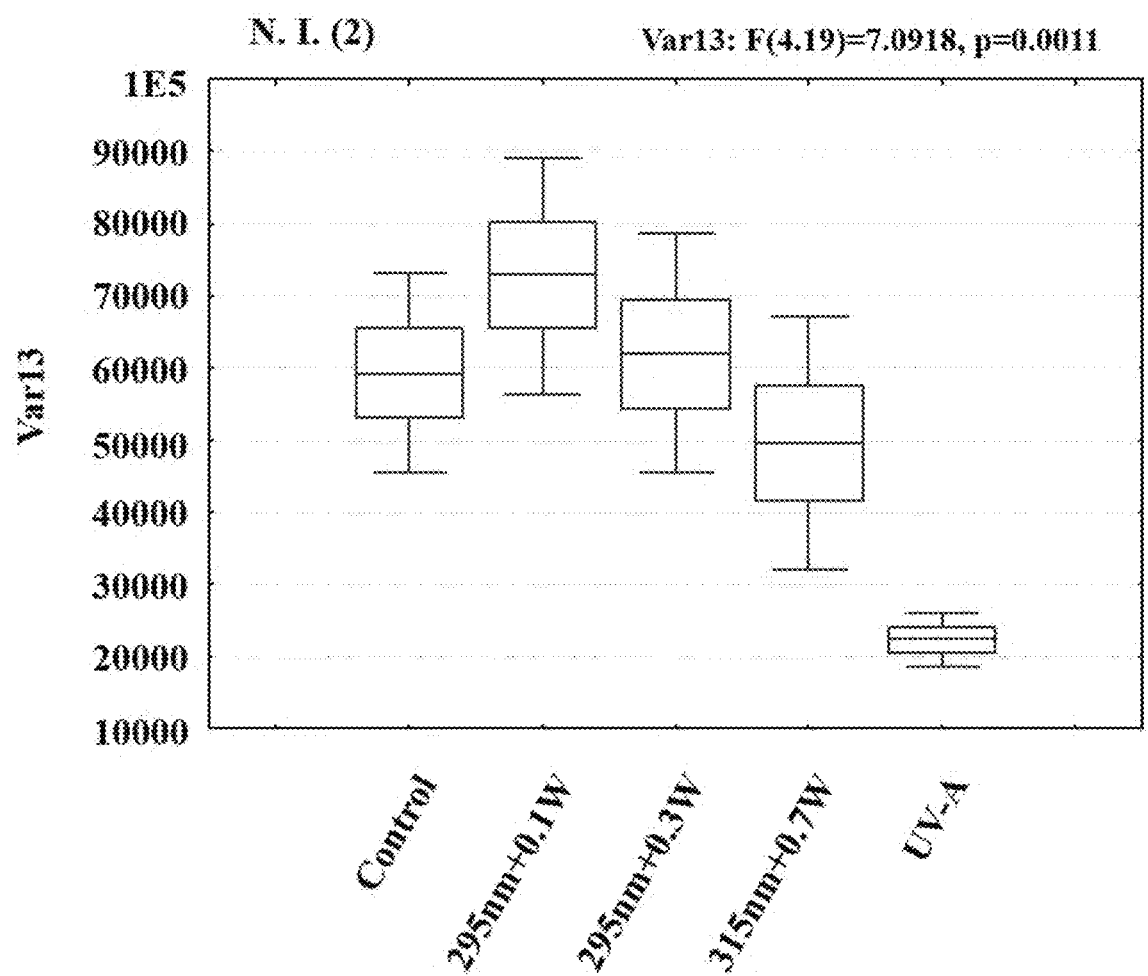
FIG. 16B shows results of metabolite analysis (LTQ-IT-MS) on unidentified compounds. N. I. (2) as described in Table 4.
Figure 16F:
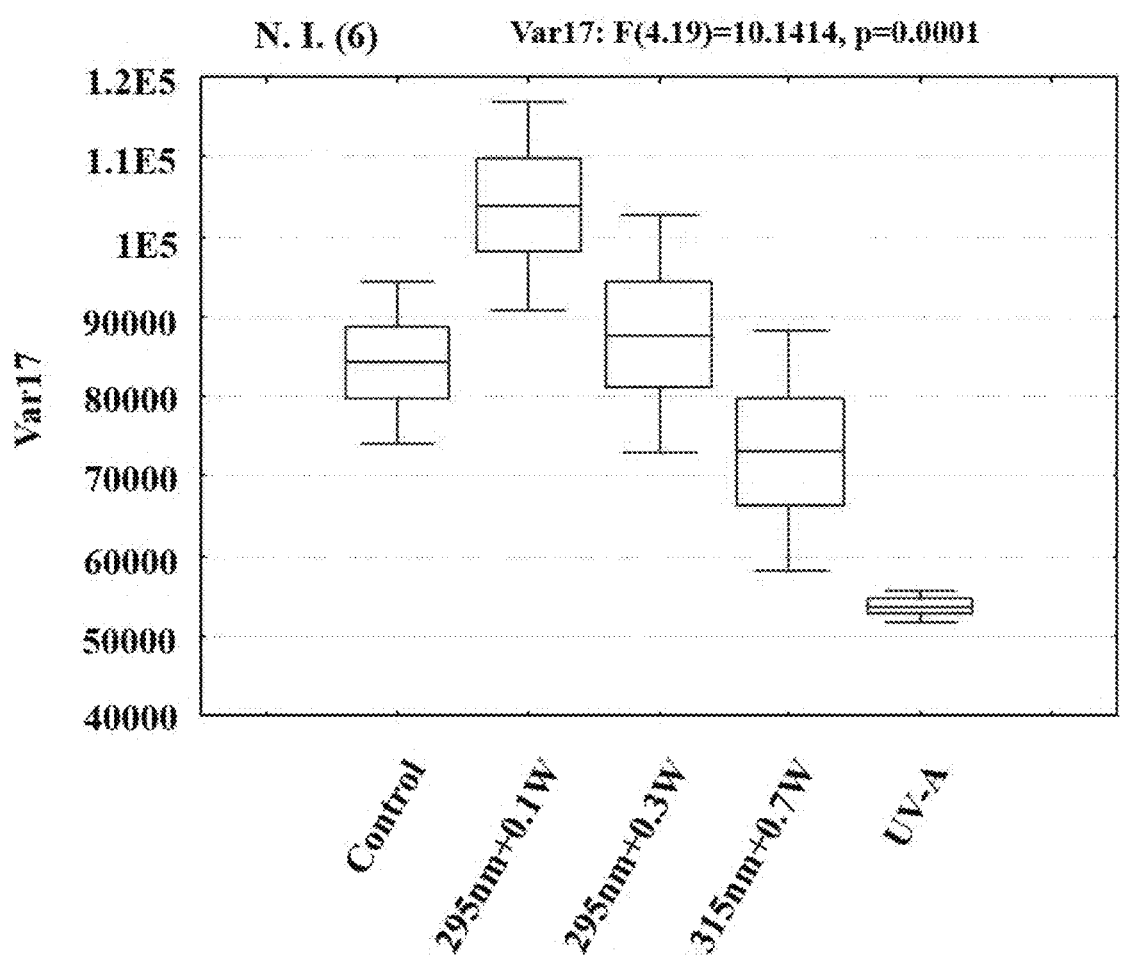
FIG. 16F shows results of metabolite analysis (LTQ-IT-MS) on unidentified compounds. N. I. (6) as described in Table 4.
Figure 16G:
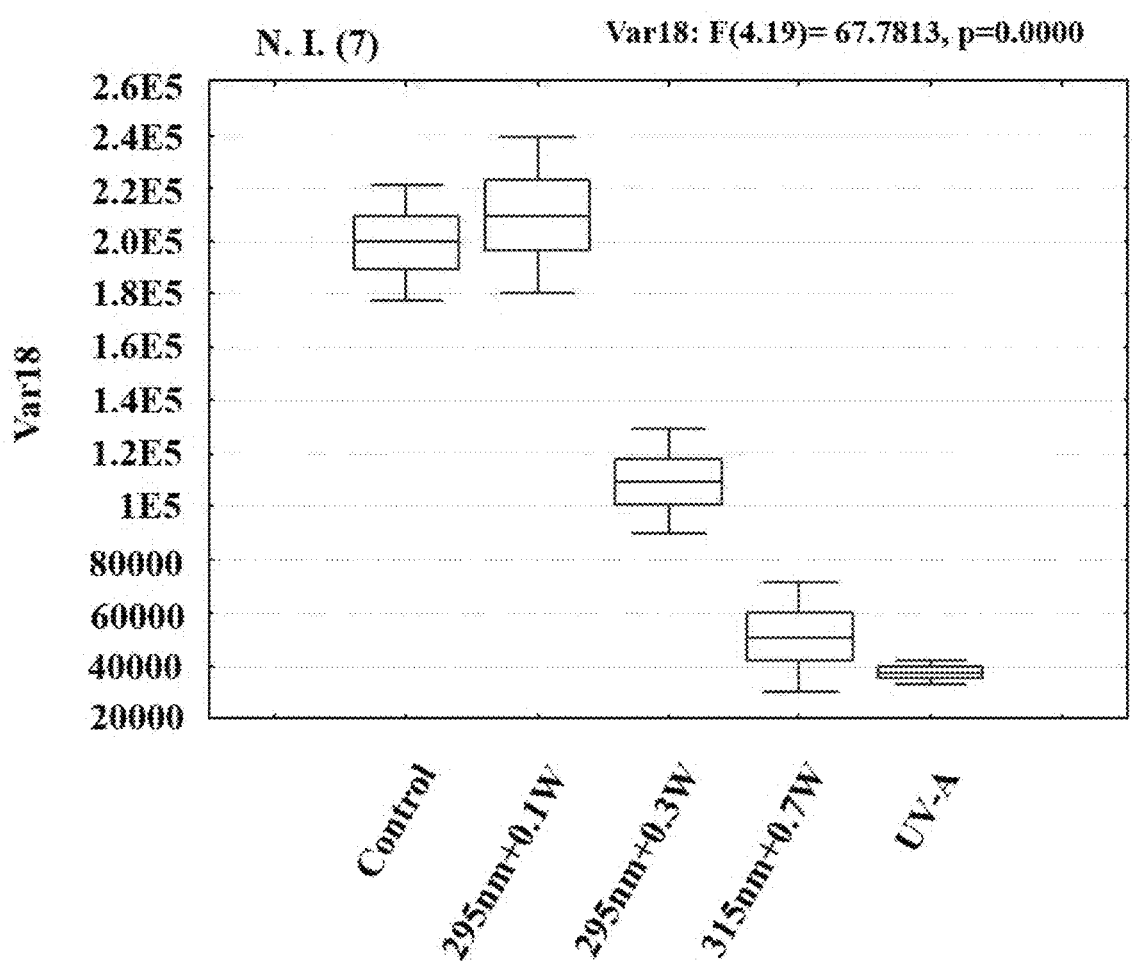
FIG. 16G shows results of metabolite analysis (LTQ-IT-MS) on unidentified compounds. N. I. (7) as described in Table 4.
Figure 16H:
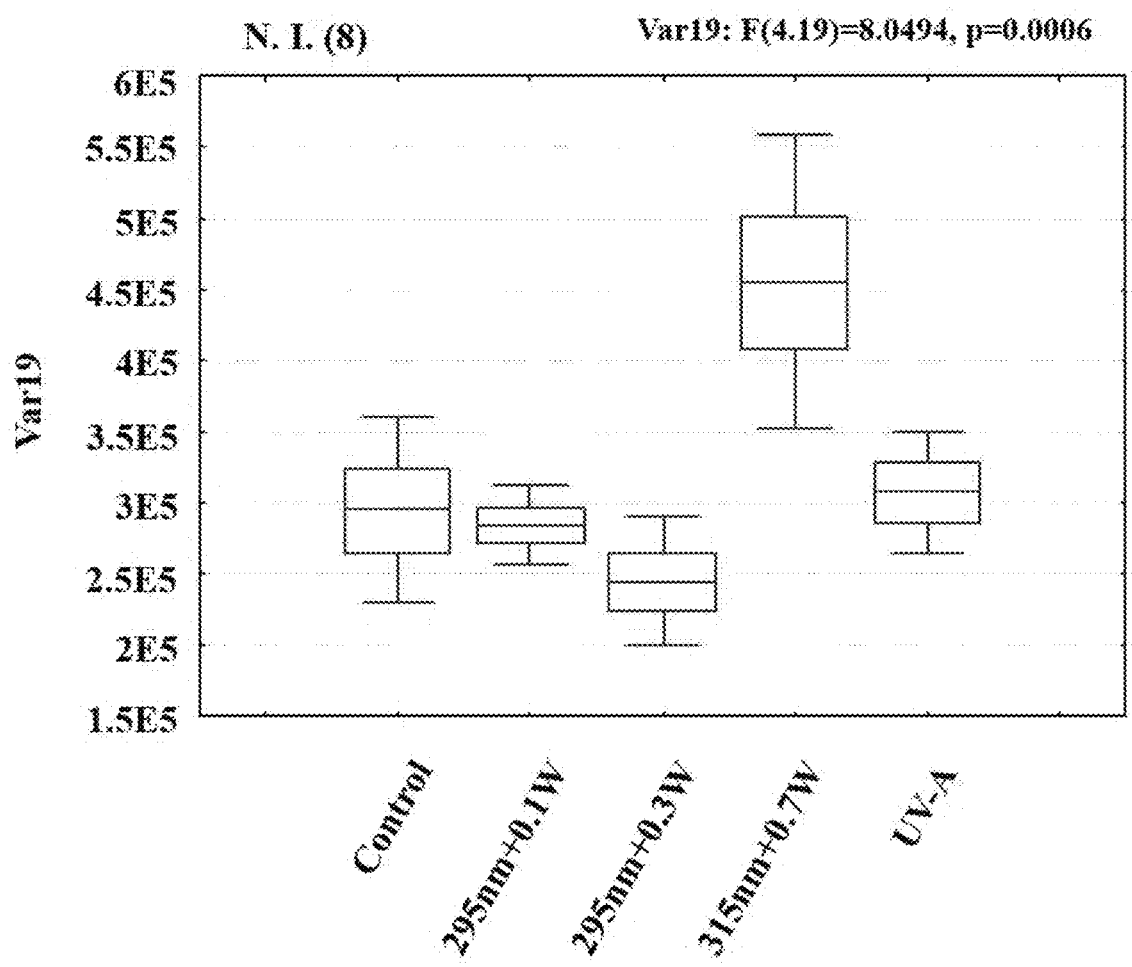
FIG. 16H shows results of metabolite analysis (LTQ-IT-MS) on unidentified compounds. N. I. (8) as described in Table 4.
Figure 16I:
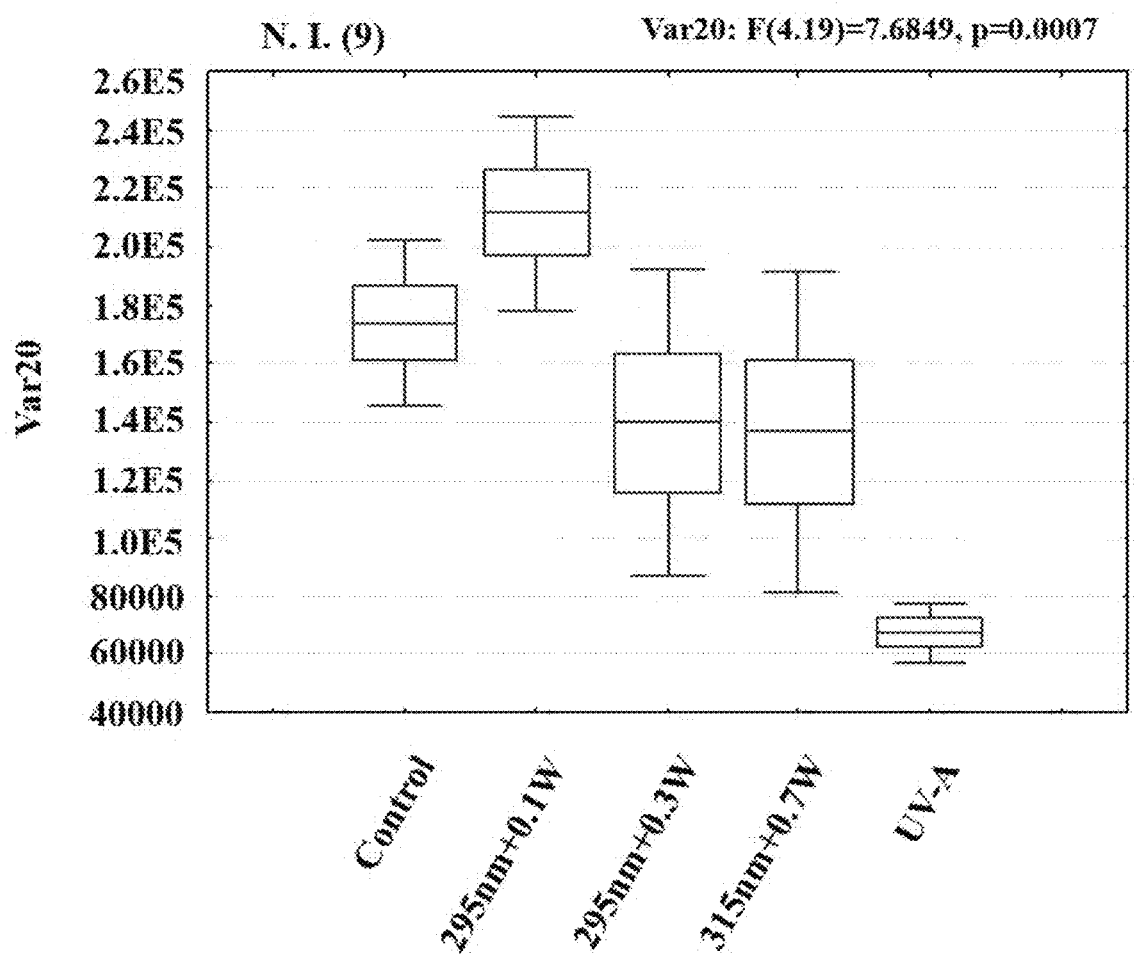
FIG. 16I shows results of metabolite analysis (LTQ-IT-MS) on unidentified compounds. N. I. (9) as described in Table 4.
Figure 16J:
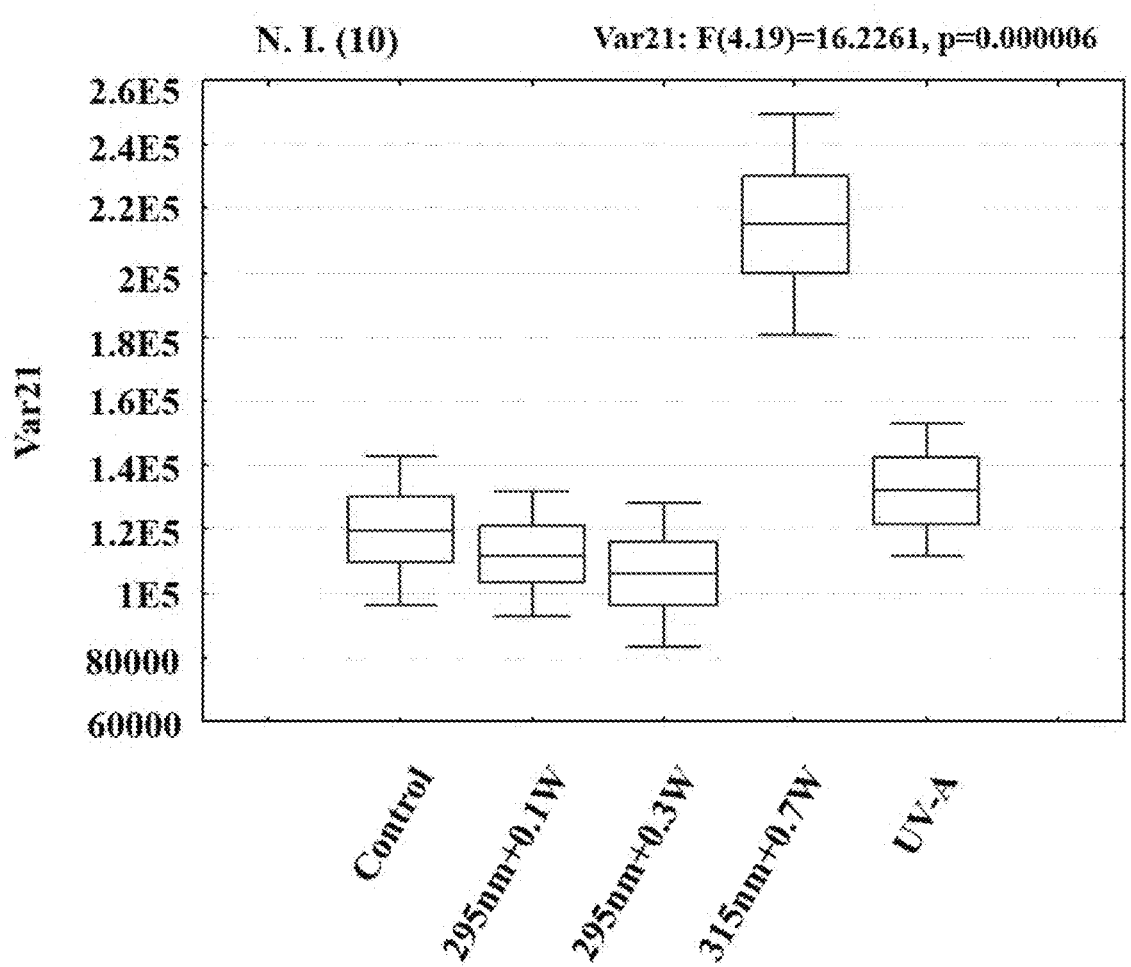
FIG. 16J shows results of metabolite analysis (LTQ-IT-MS) on unidentified compounds. N. I. (10) as described in Table 4.
Figure 16K:
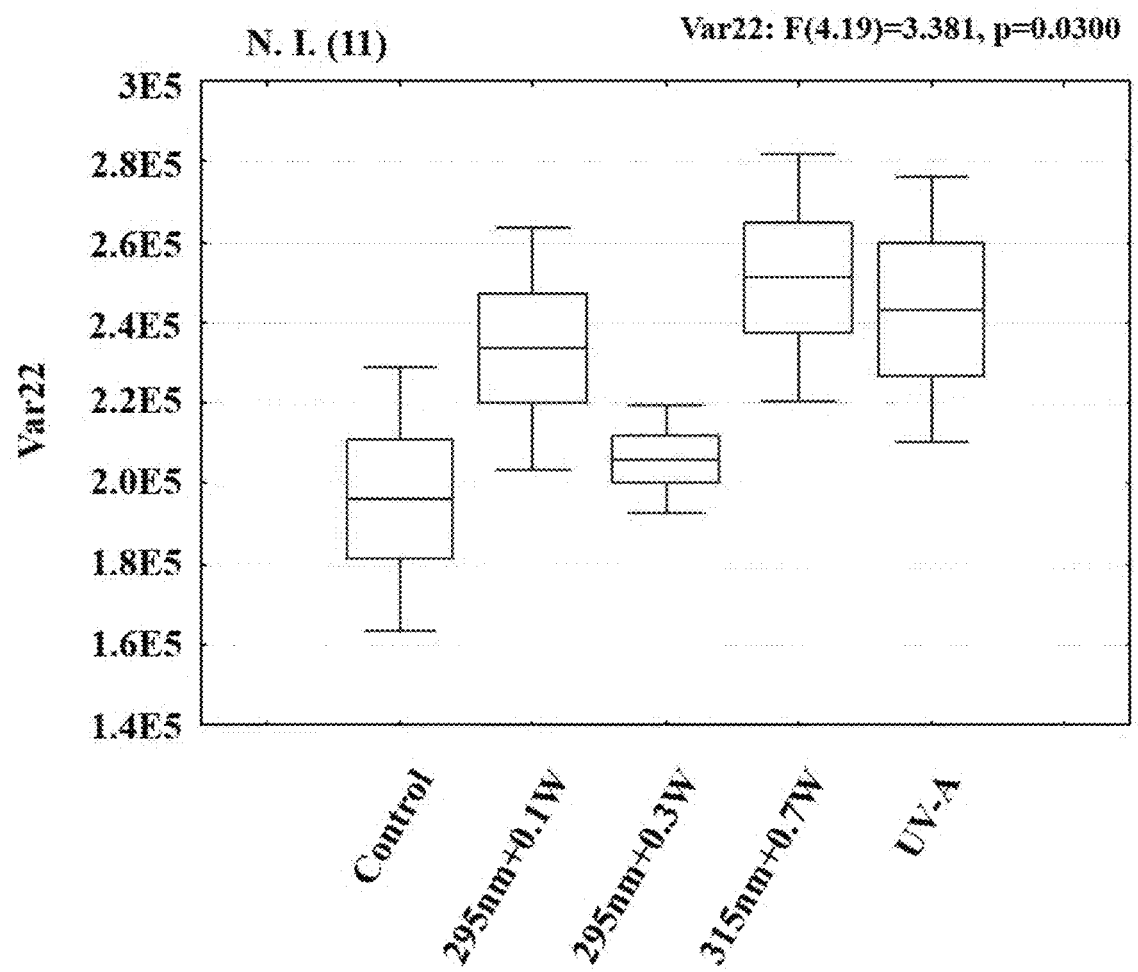
FIG. 16K shows results of metabolite analysis (LTQ-IT-MS) on unidentified compounds. N. I. (11) as described in Table 4.

FIG. 13 shows results of metabolite analysis, wherein the view on the FIG. 13A shows results of principal component analysis (PCA) and the view on the FIG. 13B shows results of partial least squares discriminant analysis (PLS-DA). The results of between-groups PCA on day 2 of UV treatment showed a discrimination between [the control group, treatment group 1 (295 nm 0.1 W/m), treatment group 2 (295 nm 0.3 W/m)] and [treatment group 4 (315 nm-0.7 W/m), treatment group 5 (UVA)] by PC1 (9.5%). In addition, the results of PLS-DA (VIP>1.0) showed the presence of different metabolites in the five groups. In this experimental example, LTQ-IT-MS analysis was conducted and a total of 150 kale samples (about 0.5 g per plant) was used for this analysis.

Experimental Example 10: Results of Identification of Metabolites in Plant after UV Treatment (on Day 2)

As described in Experimental Example 9, the presence of different metabolites in the five treatment groups on day 2 of UV treatment was confirmed by PLS-DA (VIP>1.0, p-value<0.05), followed by identification of a total of 21 metabolites, including kaempferol glycosides and hydrocinnamic acids. Table 4 shows the results of metabolite identification.

TABLE 4

| | | | | | UHPLC-LTQ-Orbitrap-MS/MS | | | | | | |
|---|---|---|---|---|---|---|---|---|---|---|---|
| RT (min) | Tentative metabolites | M.W | UV (λmax) | RT (min) | Nega | Posi | M. F. | Error (ppm) | [M − H]- MS$^n$ fragment ions (m/z) | VIP [1] | VIP [2] |
| 1.07 | Kaempferol-3-O-caffeoyl-sophoroside-7-O-D-glucoside | 935 | 217, 316 | 3.84 | 933.2346 | 935.2469 | C42H46O24 | 0.4 | 933 > 771 > 609 > 429, 285 | 2.84 | 2.00 |
| 1.25 | Kaempferol-3-O-triglucoside-7-O-D-diglucoside | 1096 | 243, 317 | 3.8 | 1095.2837 | 1097.3002 | C48H56O29 | 0.8 | 1095 > 933, 771, 609 > 285 | 1.01 | 0.80 |

TABLE 4-continued

| | | | | | UHPLC-LTQ-Orbitrap-MS/MS | | | | | |
| --- | --- | --- | --- | --- | --- | --- | --- | --- | --- | --- |
| RT (min) | Tentative metabolites | M.W | UV (λmax) | RT (min) | Nega | Posi | M. F. | Error (ppm) | [M − H]- MS$^n$ fragment ions (m/z) | VIP [1] | VIP [2] |
| 5.74 | Kaempferol-3-O-sophorotrioside-7-O-glucoside-di-sinapic acid | 1346 | 268, 329 | 4.77 | 1345.3731 | 1347.3849 | C61H70O34 | 2.2 | 1345 > 1183, 977 > 771 | 1.14 | 1.17 |
| 5.93 | Kaempferol-3-O-sophorotrioside-7-O-sophoroside-ferulic/sinapic acid | 1478 | 269, 329 | 4.83 | 1477.4140 | 1479.4307 | C33H40O18 | 0.5 | 1477 > 1153 > 977, 947 | 1.13 | 1.07 |
| 6.06 | Kaempferol-3-O-sinapoyl-feruloyl triglucoside-7-O-glucoside | 1316 | 268, 327 | 4.89 | 1315.3622 | 1317.3748 | — | — | 1315 > 1153 > 977, 947 | 1.74 | 1.35 |
| 6.65 | 1,2-Disinapoyl-gentiobioside | 754 | 219, 329 | 5.18 | 753.2423 | 777.2220 | C34H42O19 | 0.9 | 753 > 529, 289 > 223, 205 | 1.14 | 0.87 |
| 6.76 | 1-sinapoyl-2-feruloyl gentiobiose | 724 | 217, 329 | 5.25 | 723.2711 | 747.2111 | C33H40O18 | 0.5 | 723 > 529, 499 | 0.49 | 1.15 |
| 6.88 | 1-2-diferuloyl-gentiobiose | 694 | 220, 327 | 5.32 | 693.2576 | 717.2007 | C32H38O17 | 1.3 | 693 > 499, 193 | 0.14 | 2.22 |
| 7.29 | N. I. (1) | 562 | 220, 327 | 5.59 | 561.2041 | 585.1580 | — | — | — | 1.97 | 1.58 |
| 7.30 | 1,2,2'-Trisinapoyl-gentiobioside | 960 | 219, 327 | 5.54 | 959.3047 | 983.2789 | C45H52O23 | 0.4 | — | 0.16 | 2.19 |
| 7.46 | 2-Feruloyl-1,2'-disinapoyl-gentiobiose | 930 | 218, 326 | 5.62 | 929.2925 | 953.2693 | C44H50O22 | 0.7 | 929 > 705, 511 > 499 | 1.10 | 0.83 |
| 7.55 | N. I. (2) | 900 | 219, 324 | 5.69 | 899.2824 | 923.2591 | — | — | 899 > 705, 675 > 499 | 0.29 | 2.13 |
| 7.63 | N. I. (3) | 490 | 219, 291, 325 | 5.72 | 489.2825 | 513.2670 | — | — | 489 > 471, 391, 291 > 499 | 3.13 | 2.22 |
| 8.35 | N. I. (4) | 458 | 221, 291 323 | 6.07 | — | — | — | — | — | 1.11 | 0.92 |
| 8.42 | N. I. (5) | 328 | 221, 320 | 6.25 | 327.2351 | 351.2141 | — | — | — | 3.00 | 2.14 |
| 10.94 | N. I. (6) | 594 | 224 | 7.69 | 593.2836 | 595.2874 | — | — | — | 2.38 | 1.87 |
| 11.38 | N. I. (7) | — | 224, 279 | 7.88 | 721.4094 | — | — | — | — | 3.06 | 2.18 |
| 11.42 | N. I. (8) | 578 | 224, 279 | 8.01 | 577.2788 | 579.2828 | — | — | — | 3.01 | 2.15 |
| 11.80 | N. I. (9) | 506 | 224, 281 | 8.27 | 505.2869 | 537.3031 | — | — | — | 0.47 | 1.68 |
| 12.20 | N. I. (10) | — | 224, 281 | 8.64 | 579.3004 | — | — | — | — | 0.86 | 1.09 |
| 12.50 | N. I. (11) | — | 224 | 8.72 | 555.3921 | — | — | — | — | 2.98 | 2.10 |

Experimental Example 11: Analysis of Metabolites in Plant after UV Treatment (on Day 2)

FIG. 14A to FIG. 14E show results of metabolite analysis (LTQ-IT-MS) on kaempferols, FIG. 15A to FIG. 15E show results of metabolite analysis (LTQ-IT-MS) on hydrocinnamic acids, and FIG. 16A to FIG. 16K show results of metabolite analysis (LTQ-IT-MS) on unidentified compounds.

In each of the graphs of the aforementioned drawings, the x-axis represents a control group, treatment group 1, treatment group 2, treatment group 3, and treatment group 4, which were designated by Control, 295 nm+0.1 W, 295 nm+0.3 W, 315 nm+0.7 W. and UV-A, respectively.

Results of PLS-DA of different metabolites were as follows: Regarding kaempferol compounds, the content of kaempferol-3-O-caffeoyl-sophoroside-7-OK-glucoside increased only in 295 nm-treated groups and UVA-treated group (Refer to FIG. 14A), and the content of kaempferol-3-O-triglucoside-7-OD-diglucoside increased only in 295 nm-treated groups. (Refer to FIG. 14A)

In addition, the content of kaempferol-3-O-sophorotrioside-7-O-sophoroside-di-sinapic acid was higher in a specific treatment group (treatment group 1) than in the control group and was lower or similar in some other treatment group than in the control group.

The content of kaempferol-3-O-sophorotrioside-7-O-glucoside-ferulic/sinapic acid was relatively high in treatment group 1 (295 nm+0.1 W). Further, the content of kaempferol-3-O-sinapoylferuloyltriglucoside-7-O-glucoside was higher in treatment group 1 (295 nm+0.1 W) than in the control group. Regarding hydroxycinnamic acid compounds, the content of 1,2-disinapoylgentiobioside, 1-sinapoyl-2-feruloylgentiobiose, 1,2-diferuloylgentiobiose, 1,2,2'-trisinapoylgentiobioside, and 2-feruloyl-1,2'-disinapoylgentiobiose was higher in 295 nm UVB-treated groups than in the control group and was lower or similar in treatment group 3 (315 nm+0.7 W/m$^2$) and treatment group 4 (UVA) than in the control group.

<Evaluation of Metabolite Analysis Results on Day 2 of UV Treatment>

As described above, the content of the kaempferol compounds was higher in UVB-treated groups (treatment group 1 (295 nm+0.1 W/m$^2$) and treatment group 2 (295 nm+0.3 W/m$^2$)) than in the control group and was lower or similar in the other two treatment groups (treatment group 3 (315 nm+0.7 W/m$^2$) and treatment group 4 (UV-A)) than in the control group.

Similar to the kaempferol compounds, the content of the hydrocinnamic acid compounds was higher in UVB-treatment groups than in the control group and was lower or similar in the other two treatment groups than in the control group.

Experimental Example 12: Metabolite Analysis after UV Treatment (on Day 8)

In order to identify specific bioactive substances produced only under the stimulus of UVB upon treatment of kale samples with UVA and UVB, metabolite analysis was performed on day 8 of UV treatment. Here, treatment groups and a control group were the same as those used in metabolite analysis on day 2 of UV treatment except that they were on day 8 of UV treatment.

Figure 17A:
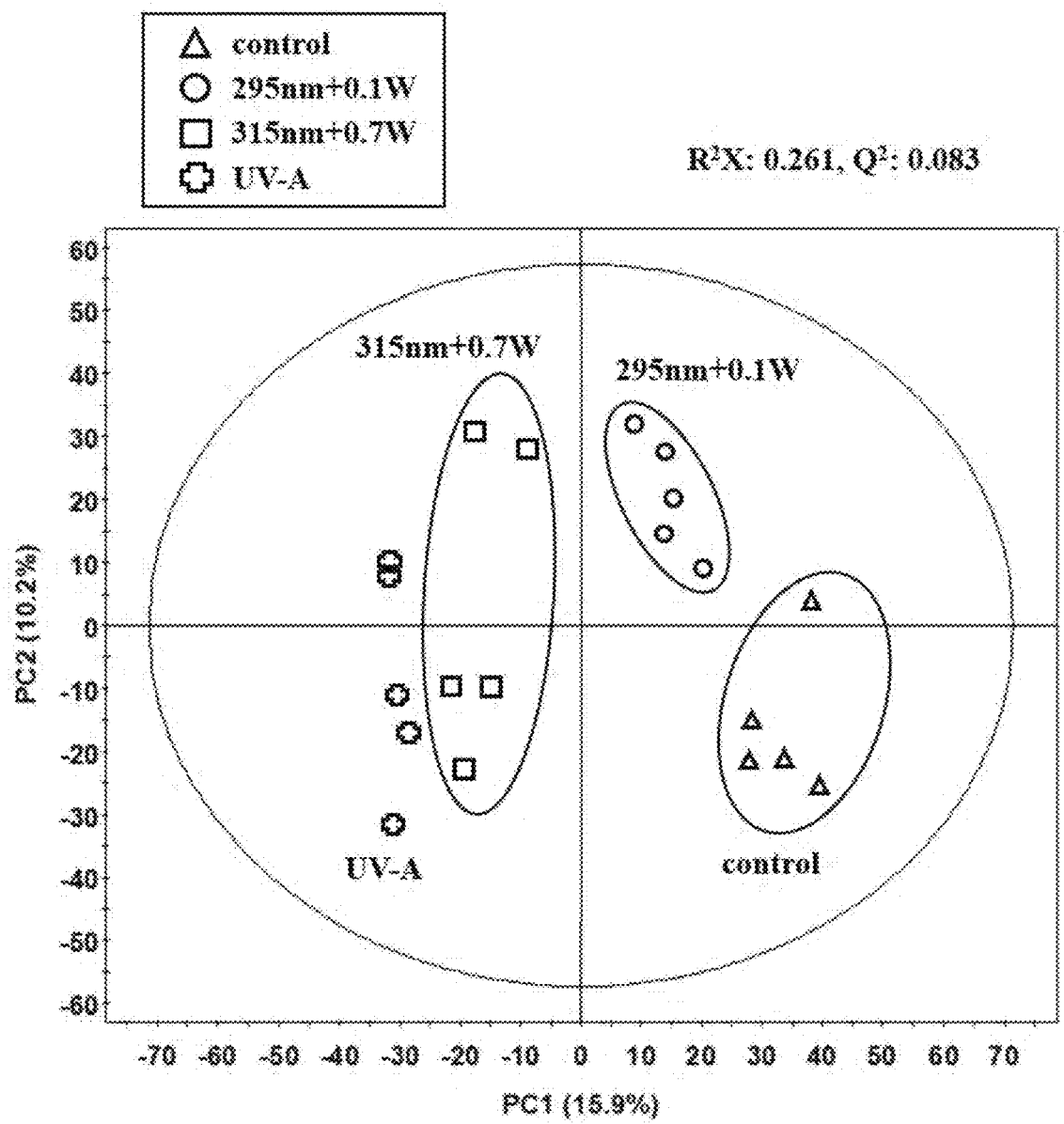
FIG. 17 shows results of metabolite analysis, wherein the graph on FIG. 17A shows results of principal component analysis (PCA) and the graph on FIG. 17B shows results of partial least squares discriminant analysis (PLS-DA).
Figure 17B:
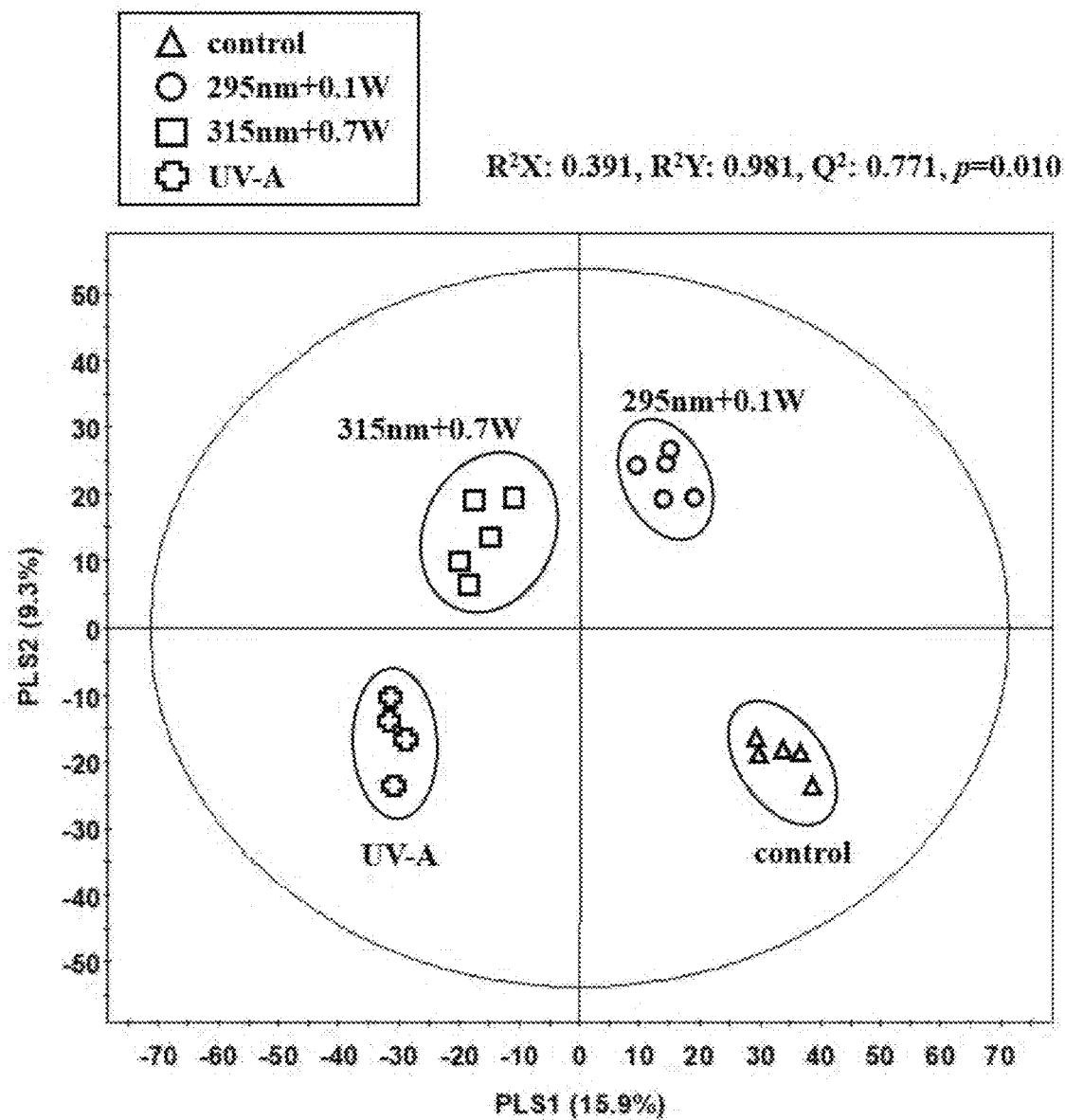
Figure 18A:
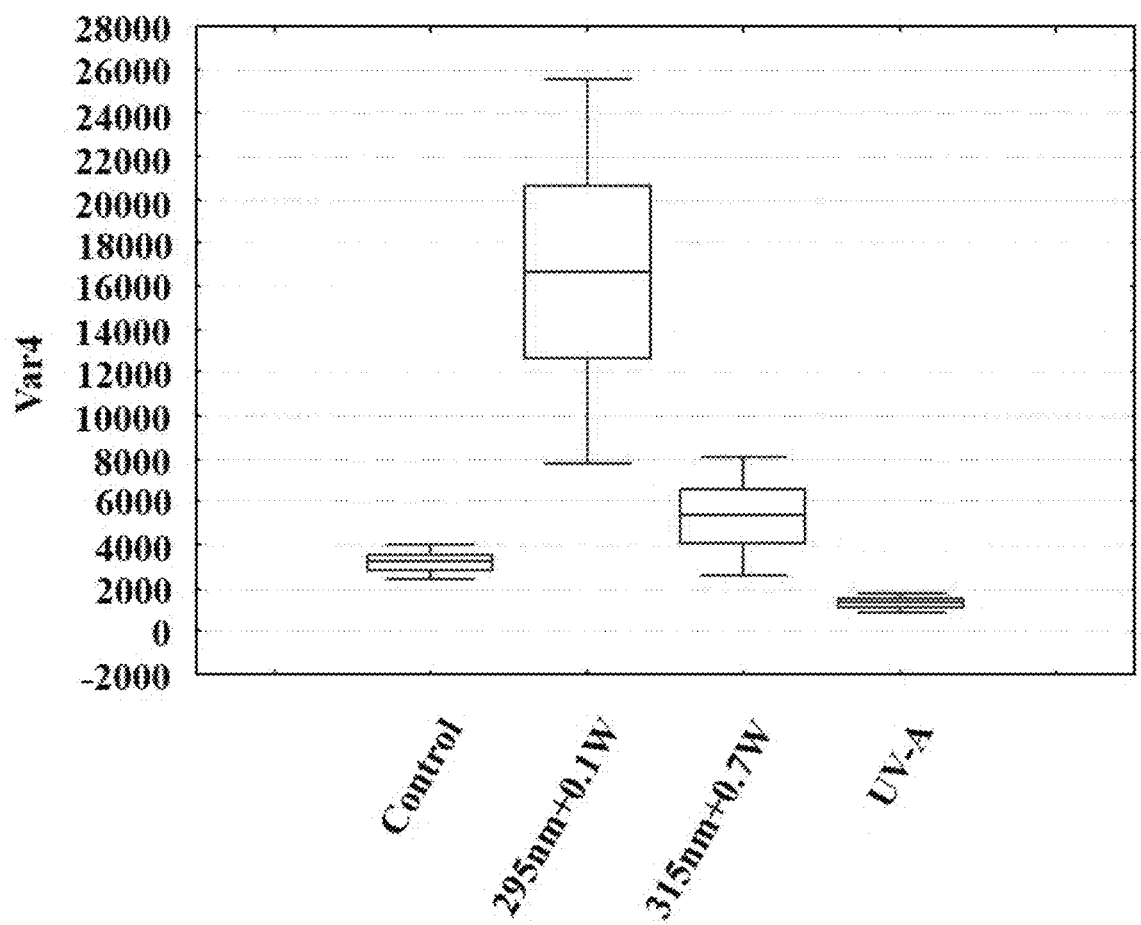
FIG. 18A shows results of metabolite analysis on kaempferol compound.
Figure 18D:
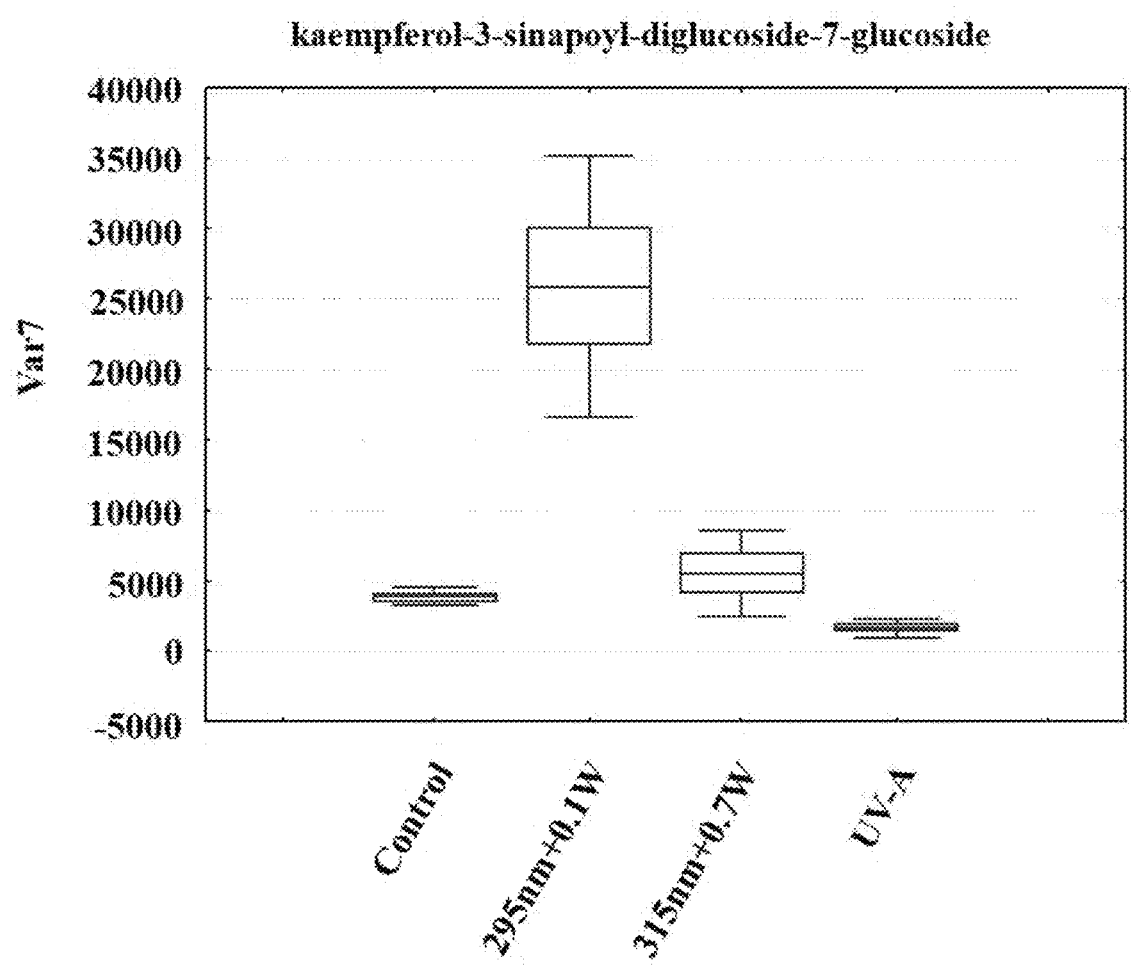
FIG. 18D shows results of metabolite analysis on kaempferol compound different from FIG. 18C.
Figure 18E:
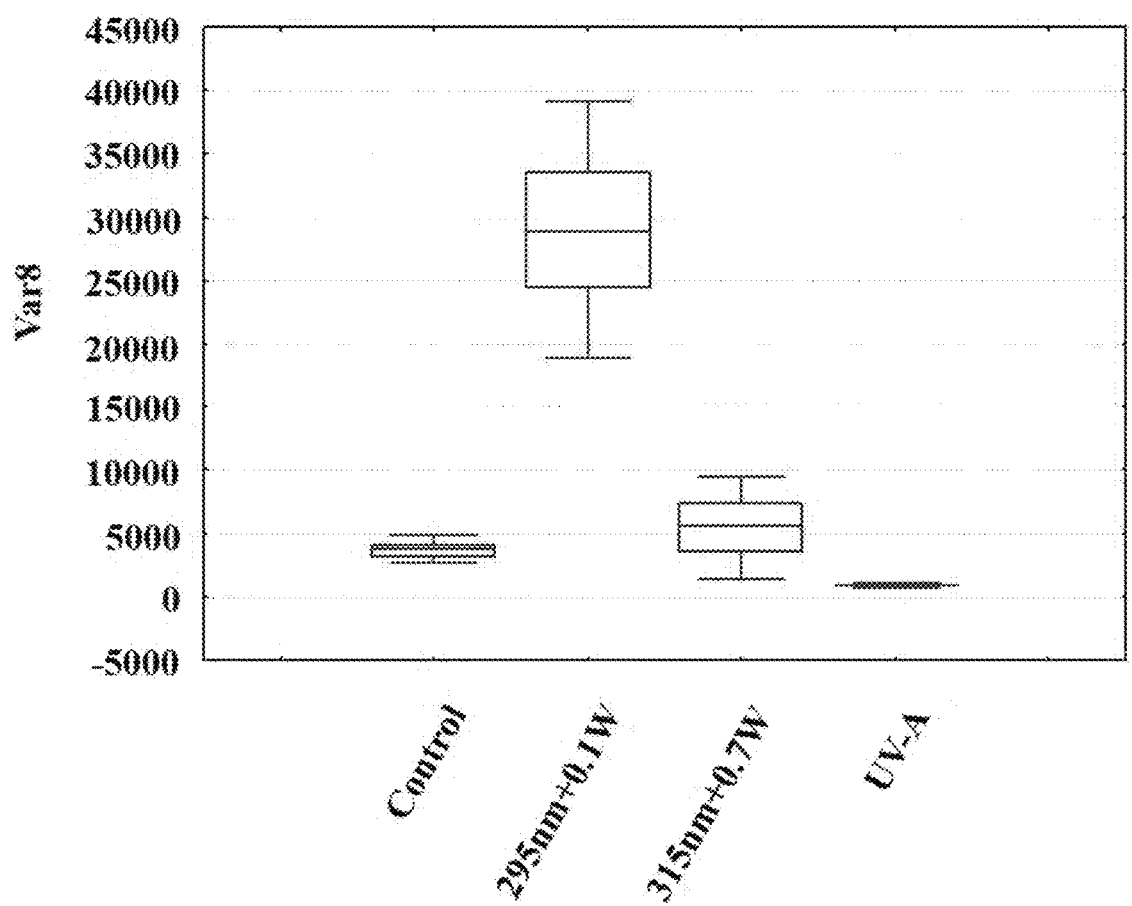
FIG. 18E shows results of metabolite analysis on kaempferol compound different from FIG. 18D.
Figure 18F:
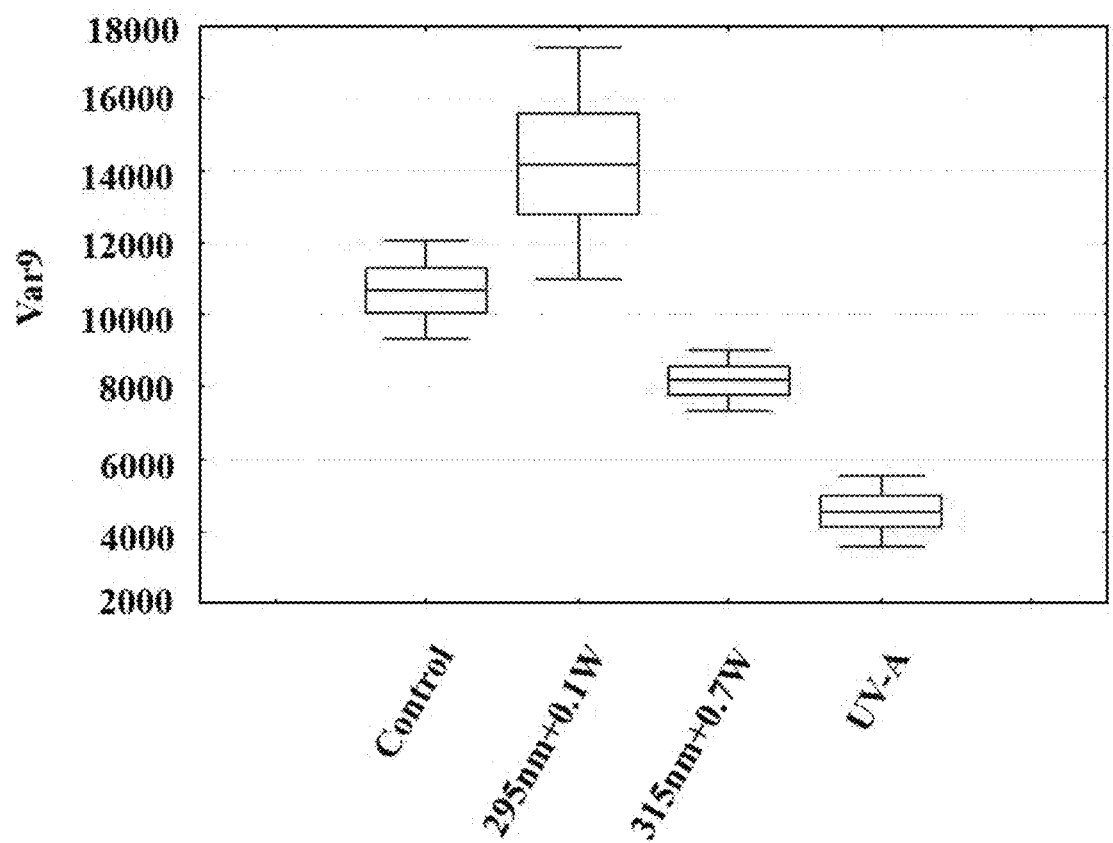
FIG. 18F shows results of metabolite analysis on kaempferol compound different from FIG. 18E.
Figure 18G:
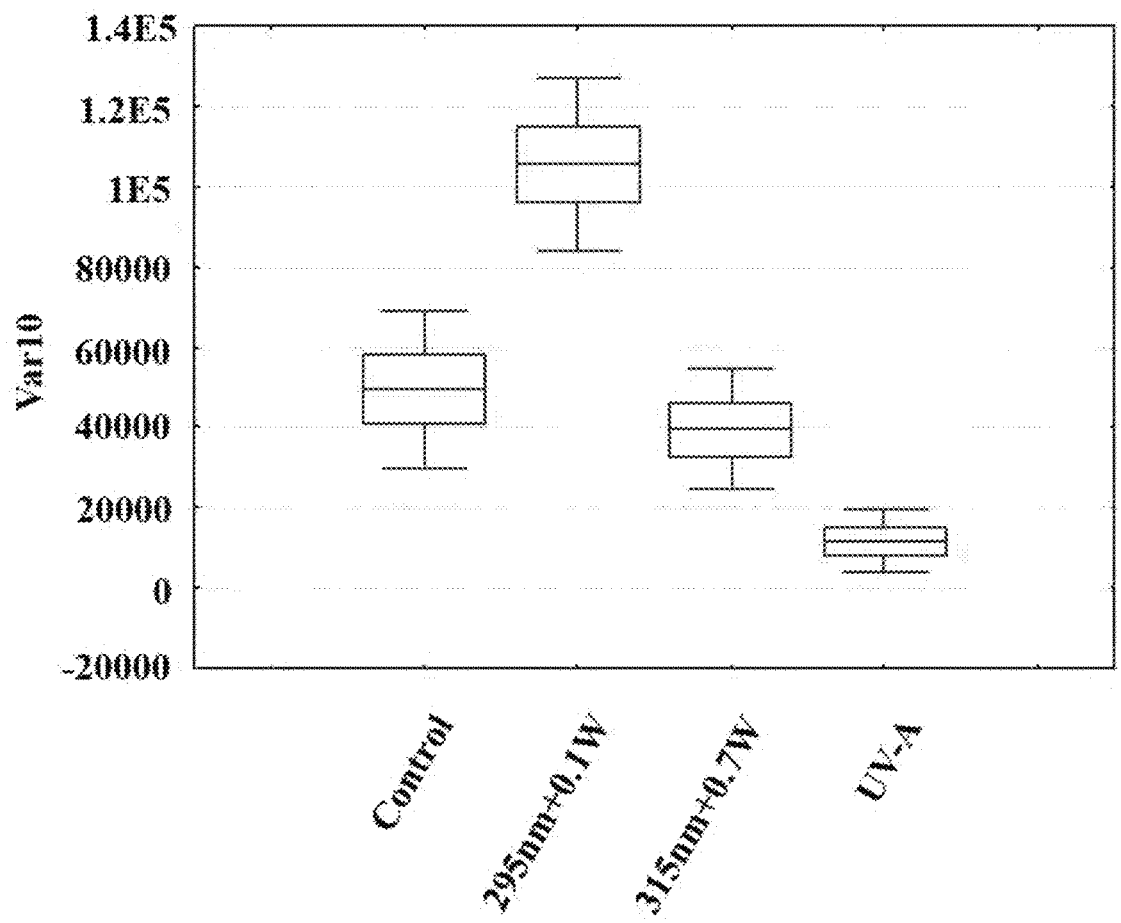
FIG. 18G shows results of metabolite analysis on kaempferol compound different from FIG. 18F.
Figure 20A:
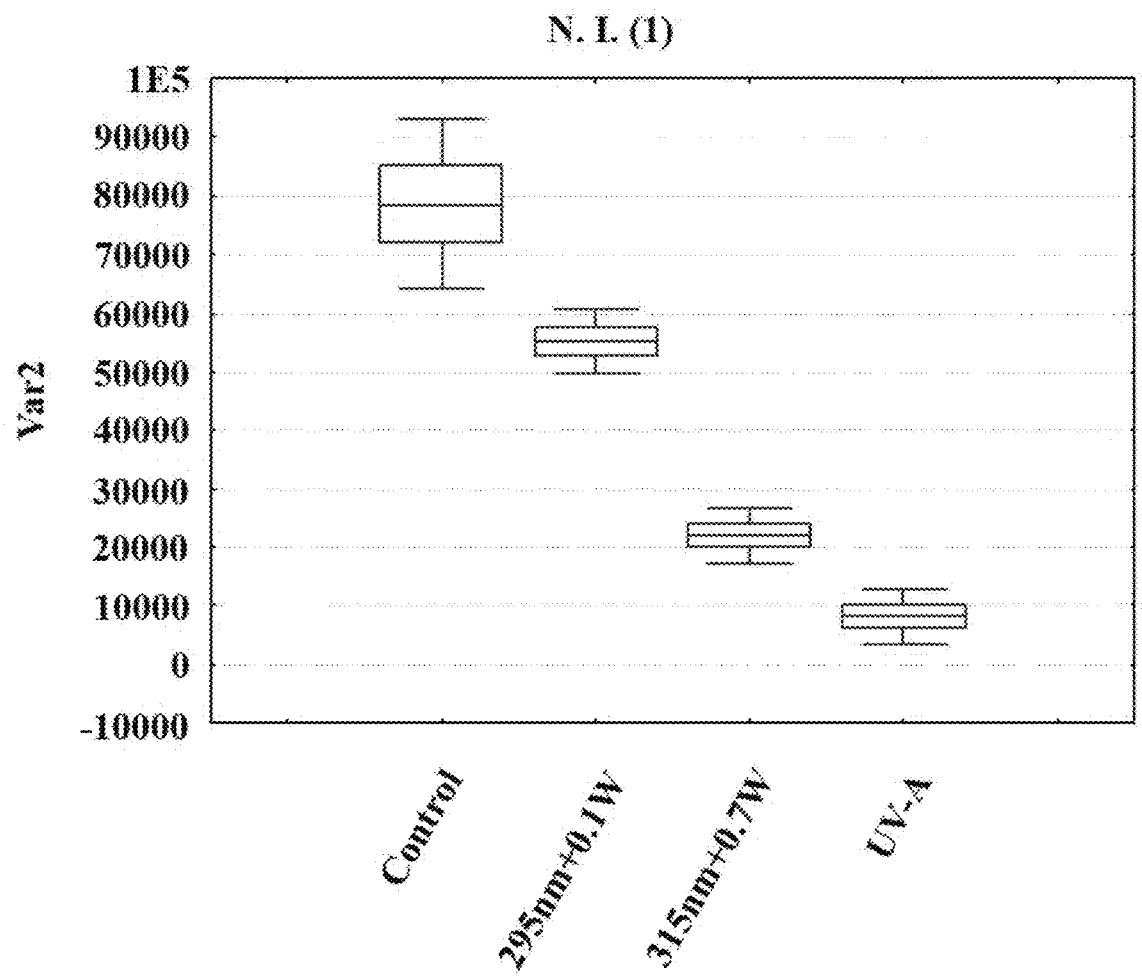
FIG. 20A shows results of metabolite analysis on unidentified compounds, N. I. (1) as described in Table 5.
Figure 20F:
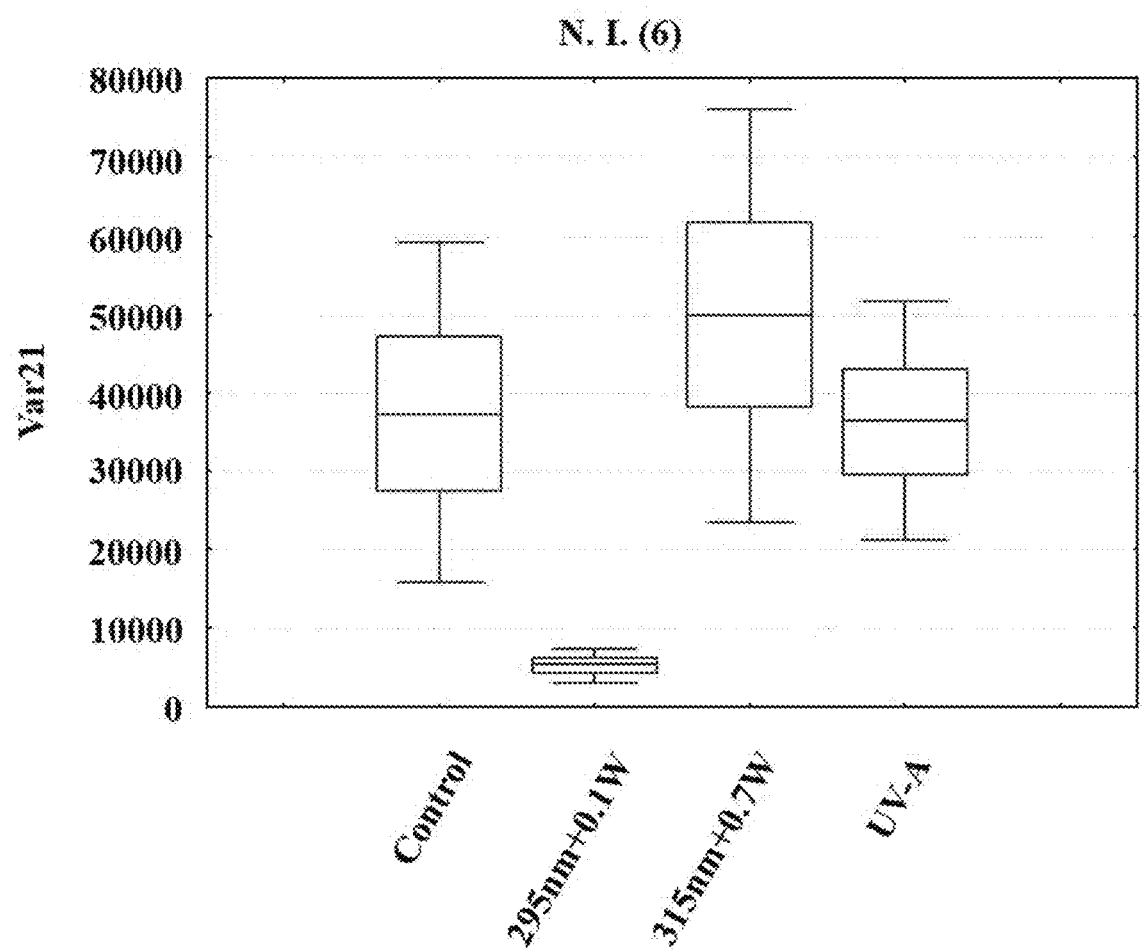
FIG. 20F shows results of metabolite analysis on unidentified compounds, N. I. (6) as described in Table 5.

FIGS. 17A-17B show results of metabolite analysis, where the view on the FIG. 17A shows results of PCA and the view on the FIG. 17B shows results of PLS-DA. The results of between-groups PCA on day 8 of UV treatment showed a discrimination between [the control group, treatment group 1 (295 nm+0.1 W)] and [treatment group 3 (315 nm+0.7 W) and treatment group 4 (UV-A)] by PC1 (9.5%). In addition, the results of PLS-DA (VIP>1.0) showed the presence of different metabolites in the four groups. In this experimental example, LTQ-IT-MS analysis was performed and a total of 150 kale samples (about 0.5 g per plant) was used for this analysis.

Experimental Example 13: Results of Identification of Metabolites in Plant after UV Treatment (on Day 8)

The presence of different metabolites in the four groups (Con/295+0.1 W/315+0.7 W/UV-A) on day 8 of UV treatment was confirmed by PLS-DA (VIP>1.0, p-value<0.05), followed by identification of a total of 18 metabolites, including kaempferol glycosides and hydrocinnamic acids. Table 5 shows the results of metabolite identification.

TABLE 5

| Tentative metabolites | RT (min) | M.W. | UV (λmax) | RT (min) | Nega | Posi | [M − H]− MS$^n$ fragment ions (m/z) | M. F. | Error (ppm) | VIP [1] | VIP [2] |
|---|---|---|---|---|---|---|---|---|---|---|---|
| N. I. (1) | 0.89 | — | 259 | 0.67 | 162.9405 | — | — | — | — | 1.73 | 1.30 |
| N. I. (2) | 1.08 | 192 | 217, 323 | 0.91 | 191.0206 | 215.1389 | 191 > 173, 111 | — | — | 1.61 | 1.50 |
| Kaempferol-3-caffeoyl-diglucoside-7-O-diglucoside | 1.11 | 1096 | 214, 324 | 3.64 | 1095.2837 | 1097.3009 | 1095 > 933, 771 > 609 > 429, 285 | $C_{48}H_{56}O_{29}$ | 0.2 | 0.25 | 1.68 |
| Kaempferol 3-(2-caffeoyl-sophoroside) 7-glucoside | 1.16 | 934 | 271, 325 | 3.77 | 933.2340 | 935.2466 | 933 > 771 > 609 > 429, 285 | $C_{42}H_{46}O_{24}$ | −1.9 | 0.08 | 1.55 |
| Kaempferol-3-sinapoyl-sophoro-trioside-7-glucoside | 1.18 | 1140 | 269, 325 | 3.95 | 1139.3217 | 1141.3252 | 1139 > 977, 815 > 771 | $C_{50}H_{60}O_{30}$ | −2.9 | 0.73 | 1.11 |
| Kaempferol-3-sinapoyl-diglucoside-7-glucoside | 1.19 | 978 | 268, 323 | 3.99 | 977.2589 | 979.2718 | 977 > 815, 771, 609 | $C_{44}H_{50}O_{25}$ | 2.1 | 0.18 | 1.50 |
| Kaempferol 3-(2-feruloyl-sophoroside) 7-glucoside | 1.38 | 948 | 270, 295, 322 | 4.09 | 947.2466 | 949.2627 | 947 > 785 > 609 > 429, 285 | $C_{43}H_{48}O_{24}$ | 0.3 | 0.48 | 1.62 |
| kaempferol-3-O-sophoro-trioside-7-O-sophoroside-ferulic/sinapic acid | 5.73 | 1478 | 269, 330 | 4.75 | 1477.4143 | 1479.4299 | — | $C_{66}H_{78}O_{38}$ | 3.7* | 0.22 | 1.58 |
| kaempferol 3-disinapoyl-triglucoside-7-glucoside | 5.82 | 1346 | 269, 330 | 4.79 | 1345.3719 | 1347.3834 | 1345 > 1183, 977 > 771 | $C_{61}H_{70}O_{34}$ | 3.2 | 0.41 | 1.50 |
| sinapoyl-feruloyl-triglucoside | 6.33 | 886 | 230, 326 | 5.03 | 885.2675 | — | 885 > 723, 499 > 193 | $C_{39}H_{50}O_{23}$ | 0.5 | 1.42 | 1.10 |
| 1,2-Disinapoyl-gentiobiose | 6.69 | 754 | 239, 329 | 5.17 | 753.2272 | 777.2227 | 753 > 529, 289 > 223, 205 | $C_{34}H_{42}O_{19}$ | 3.2 | 1.25 | 1.07 |
| 2-Feruloyl-1-sinapoyl-gentiobiose | 6.94 | 724 | 220, 326 | 5.24 | 723.2153 | 747.2115 | 723 > 529, 499 | $C_{33}H_{40}O_{18}$ | 1.5 | 1.13 | 0.81 |

TABLE 5-continued

| Tentative metabolites | RT (min) | M.W. | UV (λmax) | RT (min) | Nega | Posi | [M − H]- MS" fragment ions (m/z) | M. F. | Error (ppm) | VIP [1] | VIP [2] |
|---|---|---|---|---|---|---|---|---|---|---|---|
| 1,2,2'-Trisinapoyl-gentiobioside | 7.20 | 960 | 220, 327 | 5.84 | 959.2799 | 983.2813 | 959 > 735 > 529 > 427, 265 | $C_{45}H_{52}O_{23}$ | 2.4 | 1.09 | 0.89 |
| 2-Feruloyl-1,2'-disinapoyl-gentiobiose | 7.46 | 930 | 219, 326 | 5.91 | 929.2680 | 953.2700 | 929 > 705, 511 > 499 | $C_{44}H_{50}O_{22}$ | 1.4 | 1.12 | 0.81 |
| N. I. (3) | 8.34 | 372 | 221, 322 | 6.23 | 371.2169 | — | 371 > 241 > 181 | — | — | 1.15 | 0.87 |
| N. I. (4) | 8.42 | 328 | 221, 321 | 6.25 | 327.2183 | 351.2146 | 351 > 309 > 291, 229 > 183 | — | — | 0.53 | 1.91 |
| N. I. (5) | 12.20 | 654 | 225 | 8.52 | 653.3759 | 677.3712 | 653 > 415, 397 | — | — | 1.56 | 1.26 |
| N. I. (6) | 12.70 | 556 | 224 | 8.96 | 555.2867 | 579.2809 | 555 > 494, 299, 225 > 207 | — | — | 1.98 | 1.68 |

Experimental Example 14: Analysis of Metabolites in Plant after UV Treatment (on Day 8)

FIG. 18A to FIG. 18G show results of metabolite analysis on kaempferols, FIG. 19A to FIG. 19E show results of metabolite analysis on hydrocinnamic acids, and FIG. 20A to FIG. 20F show results of metabolite analysis on unidentified compounds.

Referring to FIG. 18A to FIG. 18G, the content of kaempferol compounds was higher in treatment group 2 (295 nm+0.1 W), lower or similar in treatment group 2 (315 nm+0.7 WV), and lower in treatment group 3 (UV-A) than in the control group.

Referring to FIG. 19A to FIG. 19E, the content of hydrocinnamic acid compounds was lower in all UVB-treated groups and UVA-treated groups than in the control group, although there was a difference depending on the treatment intensity.

More specifically, a discrimination between [the control group, 295 nm+0.1 W)] and [315 nm+0.7 W. UV-A] was observed on day 8 of UV treatment. The results of metabolite analysis were as follows: Regarding the kampferol compounds, the content of seven substances including kaempferol-3-caffeovldiglucoside-7-O-diglucoside (FIG. 18A), kaempferol-3-(2-caffeoylsophoroside) 7-glucoside (FIG. 18B), kaempferol-3-sinapoyl-diglucoside-7-diglucoside (FIG. 18C), kaempferol-3-sinapoyl-diglucoside-7-glucoside (FIG. 18D), kaempferol-3-(2-feruloylsophoroside) 7-glucoside (FIG. 18E), kaempfrol-3-O-sophorotrioside-7-O-sophoroside-ferulic/sinapic acid (FIG. 18F), and kaempferol-3-disinapoyltriglucoside-7-glucoside (FIG. 18G) was higher in 295 nm+0.1 W than in the control group. Regarding the hydroxycinnamic acid compounds, the content of sinapoyl-feruloyl-triglucoside, 1,2-disinapoylgentiobiose, 2-feruloyl-1-sinapoylgentiobiose, 1,2,2'-trisinapoylgentiobioside, and 2-feruloyl-1,2'-disinapoylgentiobiose decreased with increasing UV wavelength.

<Evaluation of Metabolite Analysis Results on Day 8 of UV Treatment>

As described above, the overall results of PCA of kale showed that a difference in metabolite production between treatment groups was observed over time and was more evident on day 8 of UV treatment than on the other days of UV treatment. The results of PCA between the four groups on day 8 of UV treatment showed a discrimination between [control, 295 nm+0.1 WI and 1315 nm+0.7 W, UV-AJ by PC1 (15.9%).

PLS-DA was performed to identify different metabolites in treatment groups, and, as a result thereof, a total of 18 metabolites was identified. The content of kaempferol compounds was higher in UVB-treated group (295 nm+0.1 W) than in the control group and was lower or similar in the other two treatment groups (315 nm+0.7 W. UV-A) than in the control group. The content of hydrocinnamic acid compounds was generally lower in all treatment groups than in the control group, although there was a difference depending on the intensity of treatment with UV-LEDs.

Results of the experimental examples described above showed that treatment of kale with UVB during cultivation can promote production of phytochemicals (total phenolic content and antioxidant capacity) without affecting growth of the kale in some treatment groups (295 nm+0.1 W, 315 nm+0.3 W, 315 nm+0.7 W) and, particularly, treatment with 299 nm UVB can allow production of different bioactive substances than treatment with UVA. Therefore, it was confirmed that only treatment with UVB can promote production of phytochemicals in kale.

In addition, it was confirmed that, upon treatment with a 295 nm UVB-LED, an intensity of 0.3 W causes harmful stress to the plant, whereas an intensity of 0.1 W is a condition that can promote biosynthesis of bioactive substances in the plant.

<Utilization of Light Source According to One or More Embodiments of the Present Disclosure>

The light source for plant cultivation according to the embodiment of the present disclosure may be used in a plant factory, a plant cultivation apparatus, a greenhouse, and the like.

Figure 21:
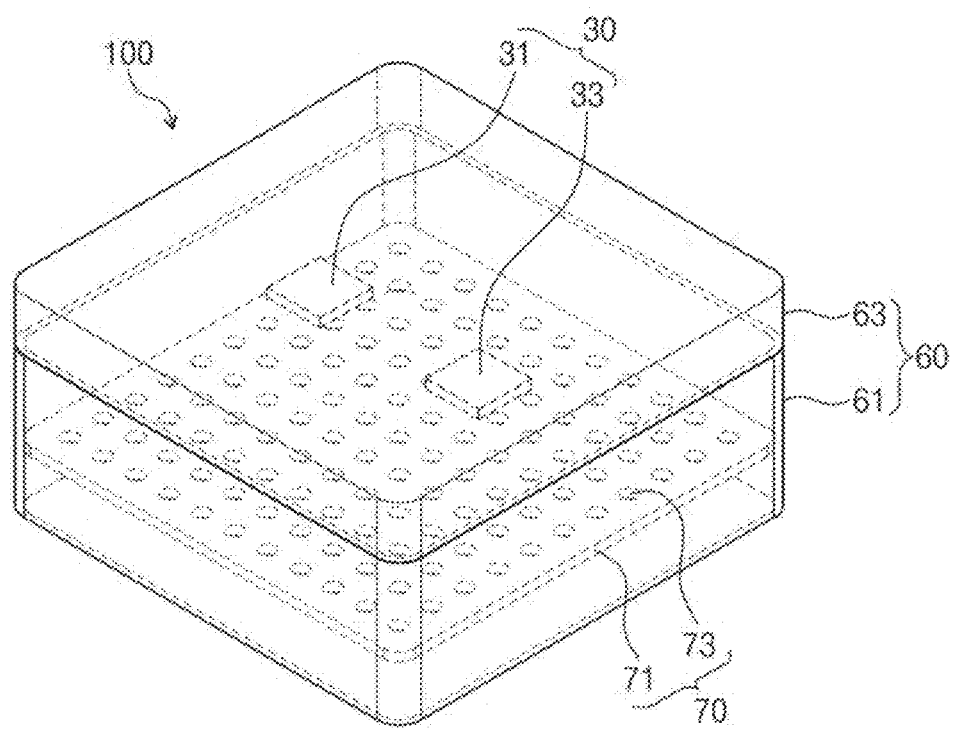
FIG. 21 is a schematic view of a cultivation apparatus according to one or more embodiments of the present disclosure.

FIG. 21 is a schematic view of a plant cultivation apparatus according to one or more embodiments of the present disclosure. The plant cultivation apparatus of FIG. 21 may be implemented as a small-scale cultivation apparatus, without being limited thereto. Although the plant cultivation apparatus according to this embodiment may be implemented as a large-scale cultivation apparatus used in a plant factory, the present disclosure will be described by way of an example in which the plant cultivation apparatus is implemented as a small-scale cultivation apparatus.

Referring to FIG. 21, the plant cultivation apparatus 100 according to this embodiment includes a housing 60 having an inner space for growing a plant and a light source 30 disposed in the housing 60.

The housing 60 provides an empty space in which the plant is placed and grown. The housing 60 is provided in the form of a box that can block out external light. In one or more embodiments, the housing 60 may include a lower case 61 open upwards and an upper case 63 open downwards.

The lower case 61 and the upper case 63 may be fastened to each other to form a box that blocks out external light.

The lower case 61 includes a bottom and a sidewall extending upwards from the bottom. The upper case 63 includes a cover and a sidewall extending downwards from the cover. The sidewalls of the lower case 61 and the upper case 63 may be engaged with each other. The lower case 61 and the upper case 63 may be fastened to or separated from each other, as desired by a user. Accordingly, the user can open or close the housing 60, as needed.

The housing 60 may have various shapes. For example, the housing 60 may have a generally cuboidal shape or a cylindrical shape. However, it will be understood that the present disclosure is not limited thereto and the housing 60 may have various other shapes.

The housing 60 provides an environment for growth of the plant placed therein. The housing 60 may be sized to allow multiple plants to be placed and grown therein. The size of the housing 60 may vary depending on applications of the plant cultivation apparatus 100. For example, when the plant cultivation apparatus 100 is used for small-scale home cultivation, the housing 60 may have a relatively small size. When the plant cultivation apparatus 100 is used for large-scale commercial cultivation, the housing 60 may have a relatively large size.

In one or more embodiments, the housing 60 may block external light from entering the housing 60. Thus, the housing 60 may provide a dark environment isolated from the outside world. In this way, it is possible to prevent external light from unnecessarily striking the plant placed inside the housing 60. In particular, the main body 100 can prevent external visible light from striking the plant. However, in some embodiments, the housing 60 may be partially open to receive external light.

In this embodiment, the inner space of the housing 60 may be an undivided space. However, this is merely for convenience of description and the housing 60 may be divided into multiple compartments. That is, the housing 60 may be provided therein with multiple partitions dividing the inner space of the housing 60 into multiple compartments.

The light source supplies light to the plant inside the housing 60. The light source may be disposed on an inner surface of the upper case 63 or the lower case 61. In one or more embodiments, the light source may be disposed on the cover of the upper case 63. Although the light source is shown as disposed on an inner surface of the cover of the upper case 63, it will be understood that the present disclosure is not limited thereto. In another embodiment, the light source may be disposed on the sidewall of the upper case 63. In a further embodiment, the light source may be disposed on the sidewall of the lower case 61, for example, at an upper end of the sidewall of the lower case 61. In yet another embodiment, the light source may be disposed on at least one selected from among the cover of the upper case 63, the side wall of the upper case 63, and the side wall of the lower case 61.

The housing 60 may be provided in the inner space thereof with a cultivation table 70 to facilitate plant cultivation, for example, hydroponics. The cultivation table 70 may include a plate 71 disposed at a distance above the bottom of the housing 60. Through-holes 73 of a predetermined size may be formed in the plate 71. The plate 71 of the cultivation table 70 is adapted to place the plant on an upper surface thereof and may have multiple through-holes 73 through which a remaining portion of supplied water (not absorbed by the plant) is discharged from the cultivation table. Each of the through-holes 73 may be sized to prevent the plant from being washed away therethrough. For example, each of the through-holes 73 may have a diameter smaller than the size of the plant. A space between the cultivation table 70 and the bottom of the lower case 61 may serve as a water tank. Accordingly, the water discharged downwards through the through-holes 73 of the cultivation table 70 may be stored in the space between the bottom of the lower case 61 and the cultivation table 70.

According to one or more embodiments, gramineous plants may be cultivated by methods other than hydroponics. In this embodiment, the housing 60 may be provided in the inner space thereof with water, a culture medium, soil, and the like to supply moisture and/or nutrients necessary for gramineous plants. Here, the housing 60 serves as a container. The culture medium or soil may contain nutrients necessary for growth of the plant, for example, potassium (K), calcium (Ca), magnesium (Mg), sodium (Na), and iron (Fe). Depending on the type of plant cultivated, the plant may be buried in the culture medium or may be placed on a surface of the culture medium.

The size and shape of the cultivation table 70 may be varied depending on the shape of the housing 60 and the types of first and second light sources. The cultivation table 70 may be sized and shaped to be located within the illumination range of the first light source and the second light source.

The housing 60 may be provided therein with a water supply device supplying water to the plant. The water supply device may be disposed at an upper end of the housing 60, for example, on the inner surface of the cover of the upper case 63 and may be provided in a form suitable for spraying water onto the cultivation table 70 in the housing 60. However, it will be understood that the present disclosure is not limited thereto and the water supply device may be provided in various other forms depending on the shape of the housing 60 and the arrangement of the cultivation table 70. Alternatively, a user may directly supply water into the housing 60 without any separate water supply device.

There may be provided one or multiple water supply devices 110. The number of water supply devices may be varied depending on the size of the housing. For a relatively small household plant cultivation apparatus, one water supply unit may be provided since the housing is relatively small. On the contrary, for a relatively large commercial plant cultivation apparatus, several water supply devices may be provided since the housing is relatively large. However, it will be understood that the present disclosure is not limited thereto and any suitable number of water supply devices may be disposed at any suitable positions.

The water supply device may be connected to a water tank inside the housing 60 or a water supply outside the housing 60. In addition, the water supply device may further include a filter filtering out pollutants from water to be supplied to the plant. The filter may include, for example, an activated carbon filter and a non-woven fabric filter. Thus, water having passed through the filter can be free from impurities. The filter may further include a lamp-type filter, as needed. The lamp-type filter irradiates water with UV light or the like to remove germs, bacteria, mold spores, and the like from the water. With these filters of the water supply device, the plant cultivation apparatus according to the present disclosure can prevent contamination of the interior of the housing 60 and the plant inside the housing 60 even when water discharged from the cultivation table is recycled or when rainwater is directly used for cultivation.

Although water supplied from the water supply device may be water free from additional nutrients (for example, purified water), it will be understood that the present disclosure is not limited thereto and the water may contain nutrients necessary for growth of the plant. For example, the water may contain metals, such as potassium (K), calcium (Ca), magnesium (Mg), sodium (Na), and iron (Fe), nitrates, phosphates, sulfates, and chlorides. For example, Sachs's solution, Knop's solution, Hoagland's solution, Hewitt's solution, and the like may be supplied from the water supply device.

According to one or more embodiments, a plant may be grown using the light source set force above.

A plant cultivation method according to one or more embodiments may include germinating seeds of a plant and supplying light in the visible spectrum to the germinated seeds. Light to be provided to the plant is emitted from the light sources according to the embodiments, and the light in the visible spectrum may include at least two or three selected from among first to fourth types of light in different wavelength ranges of the visible spectrum.

Although some embodiments have been described herein, it should be understood by those skilled in the art that these embodiments are given by way of illustration only and the present disclosure is not limited thereto. In addition, it should be understood that various modifications, variations, and alterations can be made by those skilled in the art without departing from the spirit and scope of the present disclosure.

Therefore, the scope of the disclosure should be limited only by the accompanying claims and equivalents thereto.

What is claimed is:

1. A light device, comprising:
   a light source;
   a controller connected to the light source through a wire;
   a fluid regulator connected to the controller; and
   a power supplier configured to supply electric power to the light source,
   wherein the light source includes a first light emitter and a second light emitter, each of the first light emitter and the second light emitter including:
      a first semiconductor layer doped with a first conductivity type dopant;
      a second semiconductor layer disposed on the first semiconductor layer and doped with a second conductivity type dopant that is different from the first conductivity type dopant; and
      an active layer interposed between the first semiconductor layer and the second semiconductor layer,
   wherein the first light emitter is configured to emit a first light having a first light spectrum, and the second light emitter is configured to emit a second light having a second light spectrum,
   wherein the first light spectrum includes at least one peak wavelength that is different from a peak wavelength of the second light spectrum,
   wherein the controller is configured to operate the first and second light emitters to emit light under one of different conditions, each of the different conditions including at least one of a different light spectrum, a different radiation intensity, or a different emission timing,
   wherein the controller is configured to select one of the different conditions for operation of the first and second light emitters based on a user input,
   wherein the operation is varied such that the first light emitter emits the first light in a first condition, and the second light emitter emits the second light in a second condition, and
   wherein the first condition uses a first radiation intensity that is less than a second radiation intensity used in the second condition.

2. The light device according to claim 1, wherein each of the first light emitter and the second light emitter is operated independently.

3. The light device according to claim 1,
   wherein the controller is configured to adjust the different conditions of each of the first light emitter and the second light emitter to produce light in a predetermined spectrum.

4. The light device according to claim 3, wherein the controller is configured to operate the first and second light emitters such that the first light is emitted for a first period of time and the second light is emitted for a second period of time, wherein the second period of time precedes the first period of time.

5. The light device according to claim 3, wherein the controller is configured to operate the first and second light emitters such that the first light is emitted for a first period of time and the second light is emitted for a second period of time, wherein the first period of time precedes the second period of time.

6. The light device according to claim 1, wherein the controller is configured to operate the first and second light emitters according to a preset process corresponding to a type of phytochemical, and wherein the type of phytochemical comprises at least one of kaempferols, hydrocinnamic acids, flavonols, or anthocyanins.

7. The light device according to claim 1, wherein the controller is configured to operate the first and second light emitters according to a preset process corresponding to a type of phytochemical, and wherein the phytochemical comprises kaempferols or hydrocinnamic acids.

8. A light device, comprising:
   a light source;
   a controller connected to the light source through a wire;
   a regulator connected to the controller and configured to control a fluid flow; and
   a power supplier configured to supply electric power to the light source,
   wherein the light source includes a first light emitter and a second light emitter,
   wherein the first light emitter is configured to emit a first light having a first peak wavelength, and the second light emitter is configured to emit a second light having a second peak wavelength,
   wherein the first peak wavelength and the second peak wavelength are in different color ranges,
   wherein the controller is configured to operate the first and second light emitters to emit light under one of different conditions, each of the different conditions including at least one of a different light spectrum, a different radiation intensity, or a different emission timing,
   wherein the controller is configured to select one of the different conditions for operation of the first and second light emitters,
   wherein the operation is varied such that the first light emitter emits the first light and the second light emitter emits the second light, and
   wherein a first radiation intensity of the first light is lower than a second radiation intensity of the second light.

9. The light device according to claim 8, wherein each of the first light emitter and the second light emitter is operated independently.

10. The light device according to claim 8, wherein the controller is configured to adjust the different conditions of each of the first light emitter and the second light emitter to produce light in a predetermined spectrum.

11. The light device according to claim 10, wherein the controller is configured to operate the first and second light emitters such that the first light is emitted for a first period of time and the second light is emitted for a second period of time, wherein the second period of time precedes the first period of time.

12. The light device according to claim 10, wherein the controller is configured to operate the first and second light emitters such that the first light is emitted for a first period of time and the second light is emitted for a second period of time, wherein the first period of time precedes the second period of time.

13. The light device according to claim 8, wherein the controller is configured to operate the first and second light emitters according to a preset process corresponding to a type of phytochemical, and wherein the type of phytochemical comprises at least one of kaempferols, hydrocinnamic acids, flavonols, or anthocyanins.

14. The light device according to claim 8, wherein the controller is configured to operate the first and second light emitters according to a preset process corresponding to a type of phytochemical, and wherein the phytochemical comprises kaempferols or hydrocinnamic acids.

15. A light device, comprising:
a light source;
a controller connected to the light source through a wire; and
a fluid regulator connected to the controller,
wherein the light source includes:
    a first semiconductor layer doped with a first conductivity type dopant;
    a second semiconductor layer disposed on the first semiconductor layer and doped with a second conductivity type dopant that is different from the first conductivity type dopant; and
    an active layer interposed between the first semiconductor layer and the second semiconductor layer,
wherein the controller is configured to operate the light source to adjust at least one of a wavelength, a radiation intensity, or an emission timing,
wherein the controller is configured to vary operation of the light source based on a user input,
wherein the operation is varied such that the light source emits a first light in a first condition and the light source emits a second light in a second condition, and
wherein a first radiation intensity of the first light is lower than a second radiation intensity of the second light.

16. The light device according to claim 15, wherein the controller is configured to adjust the first and second conditions of the light source to produce light in a predetermined spectrum.

17. The light device according to claim 16, wherein the controller is configured to operate the light source such that the first light is emitted for a first period of time and the second light is emitted for a second period of time, wherein the second period of time precedes the first period of time.

18. The light source according to claim 16, wherein the controller is configured to operate the light source such that the first light is emitted for a first period of time and the second light is emitted for a second period of time, wherein the first period of time precedes the second period of time.

19. The light device according to claim 15, wherein the controller is configured to operate the light source according to a preset process corresponding to a type of phytochemical, and wherein the type of phytochemical comprises at least one of kaempferols, hydrocinnamic acids, flavonols, or anthocyanins.

20. The light device according to claim 15, wherein the controller is configured to operate the light source according to a preset process corresponding to a type of phytochemical, and wherein the phytochemical comprises kaempferols or hydrocinnamic acids.

* * * * *